US012266703B2

(12) United States Patent
Lin et al.

(10) Patent No.: US 12,266,703 B2
(45) Date of Patent: Apr. 1, 2025

(54) DIELECTRIC STRUCTURES FOR SEMICONDUCTOR DEVICE STRUCTURES

(71) Applicant: Taiwan Semiconductor Manufacturing Company, Ltd., Hsin-Chu (TW)

(72) Inventors: Shih-Che Lin, Hsinchu (TW); Po-Yu Huang, Hsinchu (TW); I-Wen Wu, Hsinchu (TW); Chen-Ming Lee, Taoyuan County (TW); Chia-Hsien Yao, Hsinchu (TW); Chao-Hsun Wang, Taoyuan County (TW); Fu-Kai Yang, Hsinchu (TW); Mei-Yun Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 552 days.

(21) Appl. No.: 17/546,598

(22) Filed: Dec. 9, 2021

(65) Prior Publication Data

US 2022/0352328 A1    Nov. 3, 2022

Related U.S. Application Data

(60) Provisional application No. 63/180,903, filed on Apr. 28, 2021.

(51) Int. Cl.
*H01L 29/417* (2006.01)
*H01L 21/8234* (2006.01)
(Continued)

(52) U.S. Cl.
CPC .............. *H01L 29/41791* (2013.01); *H01L 21/823431* (2013.01); *H01L 29/4232* (2013.01); *H01L 29/66795* (2013.01); *H01L 29/785* (2013.01)

(58) Field of Classification Search
None
See application file for complete search history.

(56) References Cited

U.S. PATENT DOCUMENTS 9,985,023 B1 * 5/2018 Liu .................. H01L 21/76897
2015/0091099 A1 * 4/2015 Ching ................ H01L 27/0886
438/283

(Continued)

FOREIGN PATENT DOCUMENTS

| TW | 201911391 A | 3/2019 |
| TW | 202113974 A | 4/2021 |
| TW | 202114058 A | 4/2021 |

*Primary Examiner* — Scott B Geyer
(74) *Attorney, Agent, or Firm* — HAYNES AND BOONE, LLP

(57) ABSTRACT

An interconnect fabrication method is disclosed herein that utilizes a disposable etch stop hard mask over a gate structure during source/drain contact formation and replaces the disposable etch stop hard mask with a dielectric feature (in some embodiments, dielectric layers having a lower dielectric constant than a dielectric constant of dielectric layers of the disposable etch stop hard mask) before gate contact formation. An exemplary device includes a contact etch stop layer (CESL) having a first sidewall CESL portion and a second sidewall CESL portion separated by a spacing and a dielectric feature disposed over a gate structure, where the dielectric feature and the gate structure fill the spacing between the first sidewall CESL portion and the second sidewall CESL portion. The dielectric feature includes a bulk dielectric over a dielectric liner. The dielectric liner separates the bulk dielectric from the gate structure and the CESL.

20 Claims, 49 Drawing Sheets

(51) Int. Cl.
    *H01L 29/423*   (2006.01)
    *H01L 29/66*    (2006.01)
    *H01L 29/78*    (2006.01)

(56) References Cited

U.S. PATENT DOCUMENTS

| | | | |
|---|---|---|---|
| 2016/0056232 A1* | 2/2016 | Kuo | H01L 29/66545 |
| | | | 438/283 |
| 2016/0336426 A1* | 11/2016 | Chang | H01L 29/66795 |
| 2017/0040179 A1* | 2/2017 | Liao | H01L 21/30625 |
| 2017/0133274 A1* | 5/2017 | Lu | H01L 21/02167 |
| 2017/0317076 A1* | 11/2017 | Shen | H01L 27/0886 |
| 2018/0175201 A1* | 6/2018 | Wang | H01L 29/7851 |
| 2018/0315652 A1* | 11/2018 | Tsai | H01L 29/4966 |
| 2019/0164762 A1* | 5/2019 | Su | H01L 21/76897 |
| 2019/0172752 A1* | 6/2019 | Hsu | H01L 21/31144 |
| 2019/0295889 A1* | 9/2019 | Bai | H01L 21/76834 |
| 2019/0326416 A1* | 10/2019 | Huang | H01L 29/66734 |
| 2019/0334035 A1* | 10/2019 | Chang | H01L 21/823437 |
| 2020/0044086 A1 | 2/2020 | Hsu et al. | |
| 2020/0098622 A1* | 3/2020 | Su | H01L 21/823468 |
| 2020/0098922 A1* | 3/2020 | You | H01L 29/6681 |
| 2020/0105577 A1* | 4/2020 | Liang | H01L 21/76843 |
| 2020/0105931 A1 | 4/2020 | Wu et al. | |
| 2020/0294805 A1* | 9/2020 | Wu | H01L 21/823857 |
| 2020/0365698 A1* | 11/2020 | Tsai | H01L 29/41791 |
| 2021/0082706 A1* | 3/2021 | Yu | H01L 21/823807 |
| 2021/0090948 A1* | 3/2021 | Chen | H01L 29/41791 |
| 2021/0226030 A1* | 7/2021 | Min | H01L 29/66545 |
| 2021/0371702 A1* | 12/2021 | Cui | H01L 21/3212 |
| 2021/0375629 A1* | 12/2021 | Lai | H01L 21/823462 |

* cited by examiner

DIELECTRIC STRUCTURES FOR SEMICONDUCTOR DEVICE STRUCTURES

This application is a non-provisional application of and claims the benefit of U.S. Provisional Patent Application Ser. No. 63/180,903, filed on Apr. 28, 2021, the entire disclosure of which is incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as fin field effect transistors (FinFETs). FinFETs are fabricated with a thin vertical "fin" (or fin structure) extending from a substrate. The channel of the FinFET is formed in the vertical fin. A gate is provided over the fin. The advantages of a FinFET may include reducing short channel effects and providing higher current flow.

Although existing FinFET devices and methods of fabricating FinFET devices have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
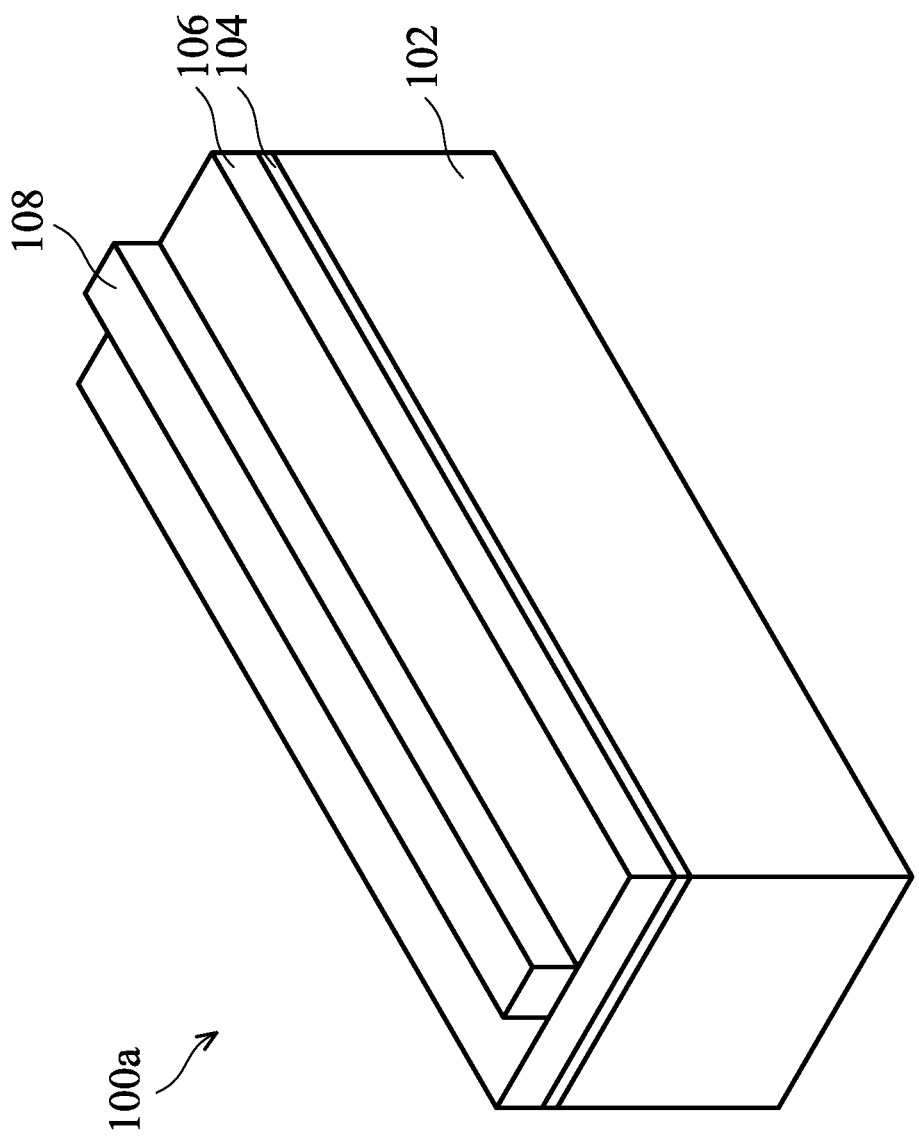
FIGS. 1A-1I show perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments for forming a fin field effect transistor (FinFET) device structure are provided. FIGS. 1A-1I show perspective representations of various stages of forming a FinFET device structure 100a in accordance with some embodiments of the disclosure.

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

The dielectric layer 104 is a buffer layer between the substrate 102 and the mask layer 106. In addition, the dielectric layer 104 may be used as a stop layer when the mask layer 106 is removed. The dielectric layer 104 may be made of silicon oxide. The mask layer 106 may be made of silicon oxide, silicon nitride, silicon oxynitride, or another applicable material. In some embodiments, more than one mask layer 106 is formed over the dielectric layer 104.

The dielectric layer 104 and the mask layer 106 are formed by deposition processes, such as a chemical vapor deposition (CVD) process, a high-density plasma chemical vapor deposition (HDPCVD) process, a spin-on process, a sputtering process, or another applicable process.

Figure 1B:
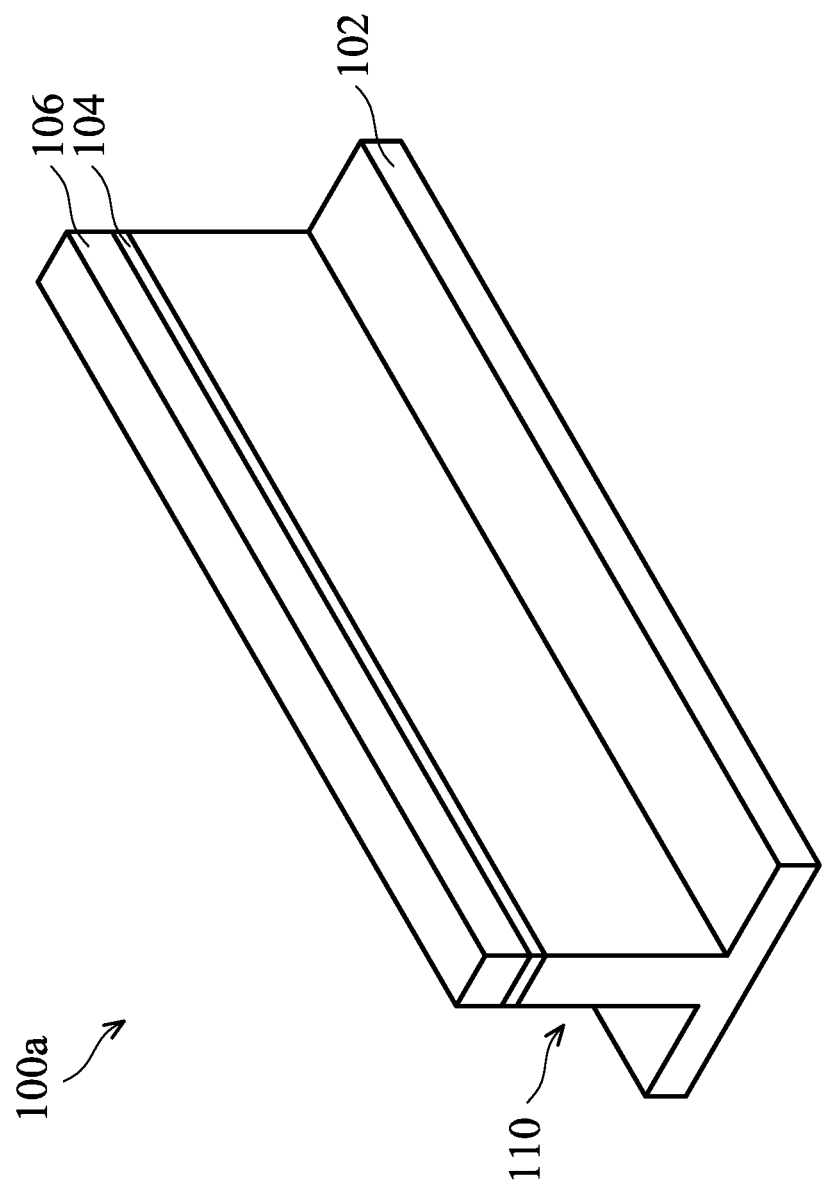

As shown in FIG. 1B, the dielectric layer 104 and the mask layer 106 are patterned by using the patterned photoresist layer 108 as a mask, in accordance with some embodiments. As a result, a patterned pad layer 104 and a patterned mask layer 106 are obtained. Afterwards, the patterned photoresist layer 108 is removed.

Next, an etching process is performed on the substrate 102 to form a fin structure 110 by using the patterned dielectric layer 104 and the patterned mask layer 106 as a mask. The etching process may be a dry etching process or a wet etching process.

In some embodiments, the substrate 102 is etched using a dry etching process. The dry etching process includes using a fluorine-based etchant gas, such as $SF_6$, $C_xF_y$, $NF_3$, or a combination thereof. The etching process may be a time-controlled process and continue until the fin structure 110 reaches a predetermined height. In some other embodiments, the fin structure 110 has a width that gradually increases from an upper portion to a lower portion.

Figure 1C:
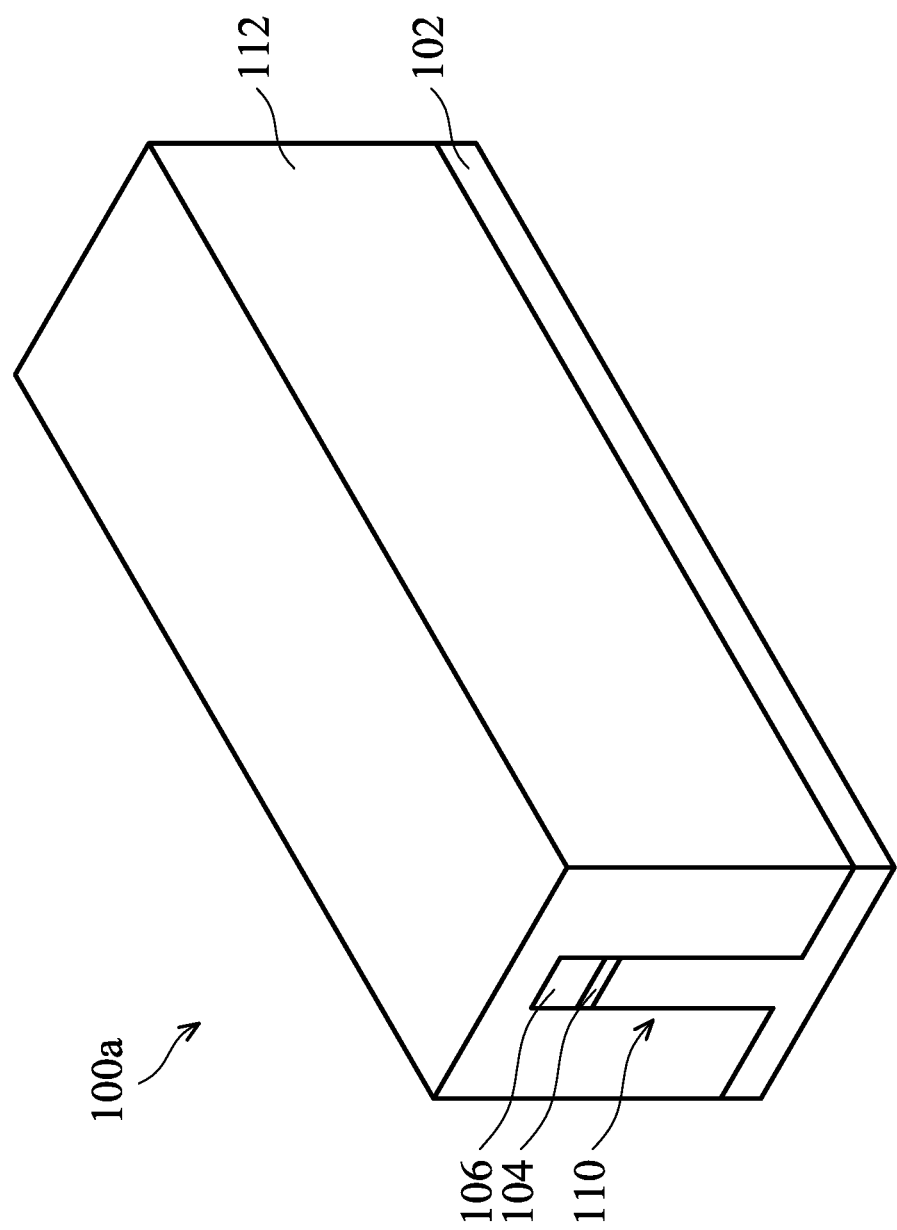

As shown in FIG. 1C, an insulating layer 112 is formed to cover the fin structure 110 over the substrate 102, in accordance with some embodiments. In some embodiments, the insulating layer 112 is made of silicon oxide, silicon nitride, silicon oxynitride, fluoride-doped silicate glass (FSG), low-k dielectric material, or another applicable material. The insulating layer 112 may be deposited by a chemical vapor deposition (CVD) process, a spin-on-glass process, or another applicable process. Afterwards, the insulating layer 112 is thinned or planarized to expose the top surface of the patterned mask layer 106. In some embodiments, the insulating layer 112 is thinned by a chemical mechanical polishing (CMP) process.

Figure 1D:
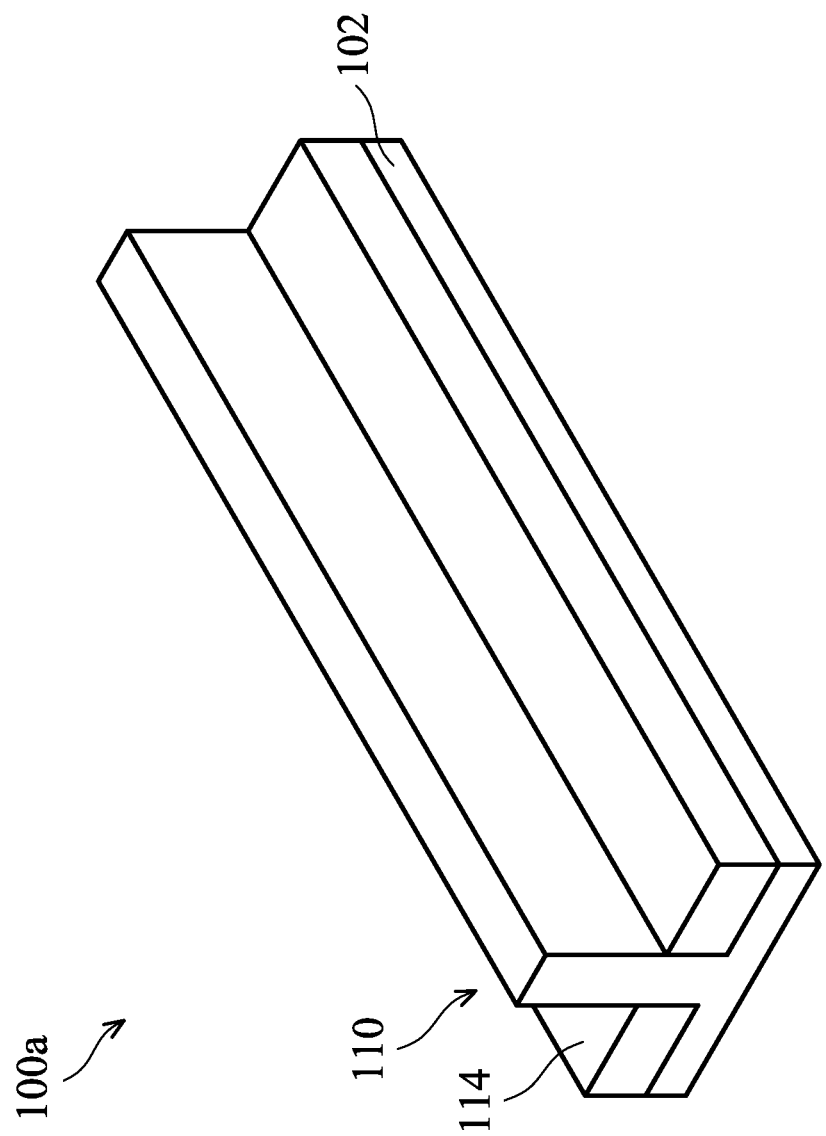

As shown in FIG. 1D, the patterned dielectric layer 104 and the patterned mask layer 106, and a portion of the insulating layer 112 is removed by an etching process, in accordance with some embodiments. As a result, an isolation structure 114 is obtained. The isolation structure 114 may be a shallow trench isolation (STI) structure surrounding the fin structure 110. A lower portion of the fin structure 110 is surrounded by the isolation structure 114, and an upper portion of the fin structure 110 protrudes from the isolation structure 114. In other words, a portion of the fin structure 110 is embedded in the isolation structure 114. The isolation structure 114 prevents electrical interference and crosstalk.

Figure 1E:
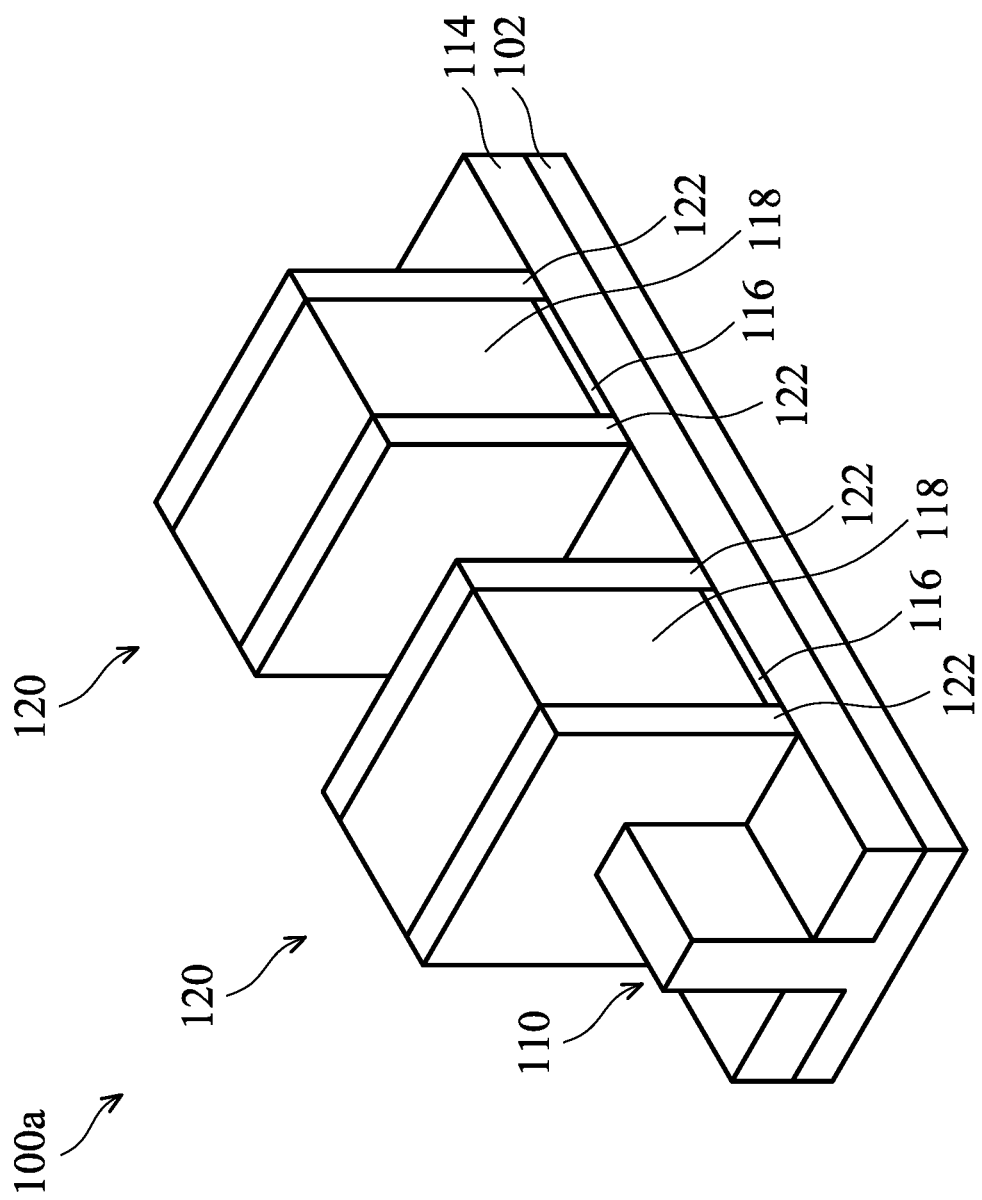

As shown in FIG. 1E, a dummy gate structure 120 is formed across the fin structure 110 and extends over the isolation structure 114, in accordance with some embodiments. In some embodiments, the dummy gate structure 120 includes a dummy gate dielectric layer 116 and a dummy gate electrode layer 118 formed over the dummy gate dielectric layer 116. In some embodiments, the dummy gate dielectric layer 116 includes silicon oxide, and the dummy gate electrode layer 118 includes polysilicon. After the dummy gate structure 120 is formed, gate spacer layers 122 are formed on opposite sidewall surfaces of the dummy gate structure 120. The gate spacer layers 122 may be a single layer or multiple layers.

In order to improve the speed of the FinFET device structure 100a, the gate spacer layers 122 are made of low-k dielectric materials. In some embodiments, the low-k dielectric materials has a dielectric constant (k value) that is less than 4. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

In some other embodiments, the gate spacer layers 122 are made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), or porous silicon oxide (SiO$_2$).

Figure 1F:
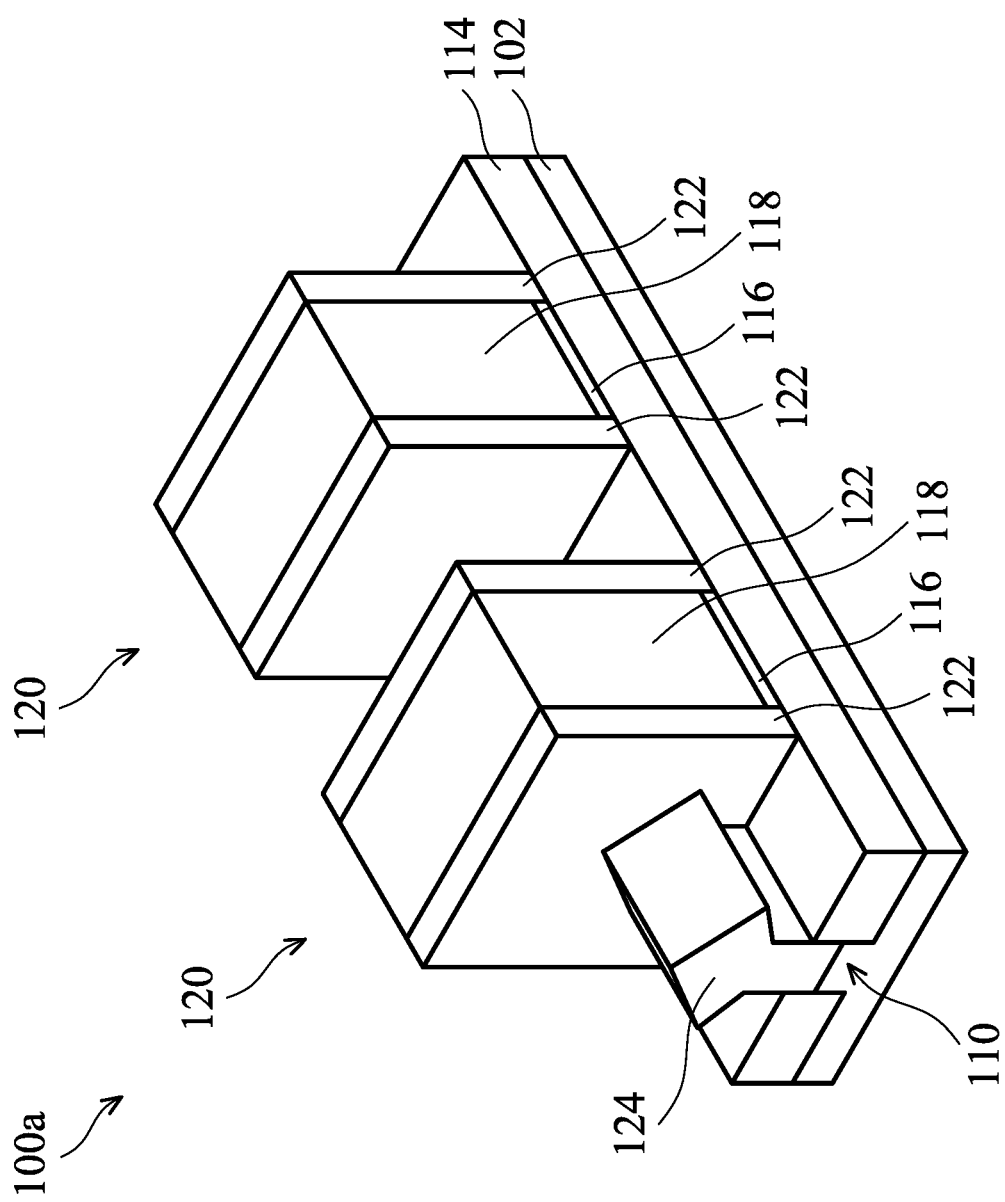

As shown in FIG. 1F, source/drain (S/D) structures 124 are formed over the fin structure 110, in accordance with some embodiments. In some embodiments, portions of the fin structure 110 adjacent to the dummy gate structure 120 are recessed, thereby forming recesses having bottoms formed by the fin structure 110 and sidewalls formed by isolation structure 114, and a strained material is grown in the recesses by an epitaxial (epi) process to form the S/D structures 124. In addition, the lattice constant of the strained material may be different from the lattice constant of the substrate 102. In some embodiments, the S/D structures 124 include Ge, SiGe, InAs, InGaAs, InSb, GaAs, GaSb, InAlP, InP, or the like.

Figure 1G:
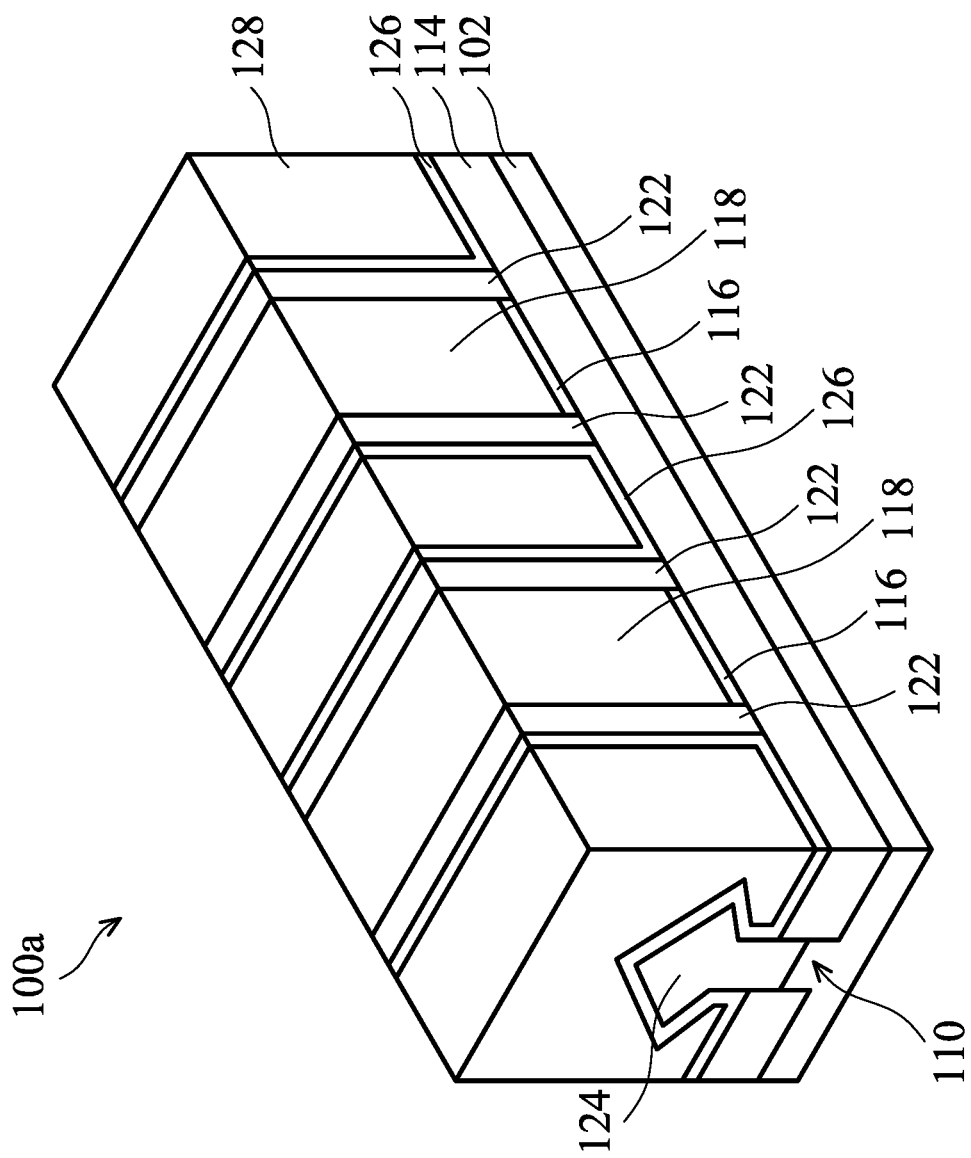

As shown in FIG. 1G, a contact etch stop layer (CESL) 126 is formed over the substrate 102, and a first inter-layer dielectric (ILD) layer 128 is formed over the CESL 126, in accordance with some embodiments. In some other embodiments, the CESL 126 is made of silicon nitride, silicon oxynitride, and/or other applicable materials. The CESL 126 may be formed by plasma enhanced CVD, low-pressure CVD, ALD, or other applicable processes.

The first ILD layer 128 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bisbenzocyclobutenes (BCB), or polyimide. The first ILD layer 128 may be formed by chemical vapor deposition (CVD), physical vapor deposition, (PVD), atomic layer deposition (ALD), spin-on coating, or another applicable process.

A polishing process may be performed on the first ILD layer 128 until the top surfaces of the dummy gate structures 120 are exposed. In some embodiments, the first ILD layer 128 is planarized by a chemical mechanical polishing (CMP) process.

Figure 1H:
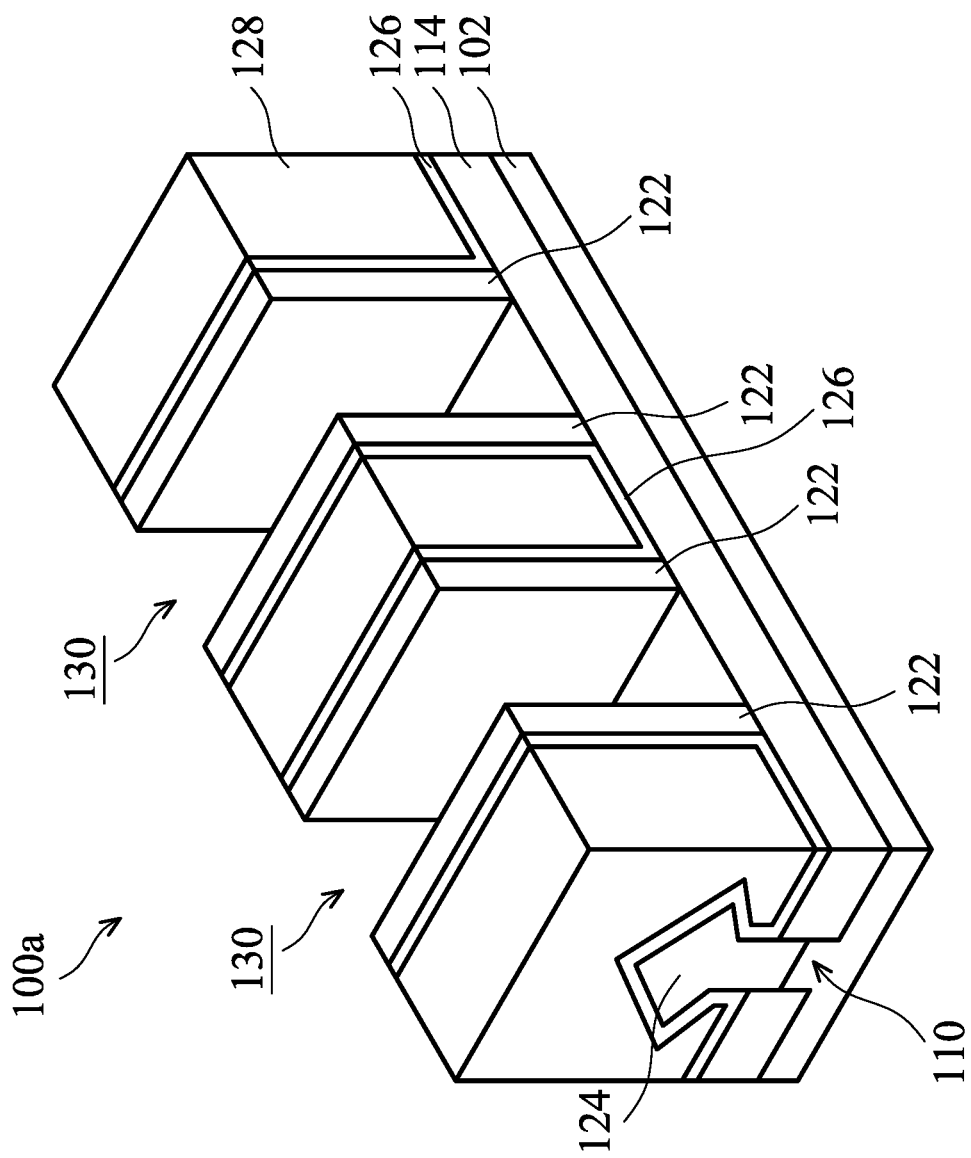

As shown in FIG. 1H, the dummy gate structures 120 are removed to form trenches 130 in the first ILD layer 128, in accordance with some embodiments. The dummy gate dielectric layer 116 and the dummy gate electrode layer 118 are removed by an etching process, such as a dry etching process or a wet etching process.

Figure 1I:
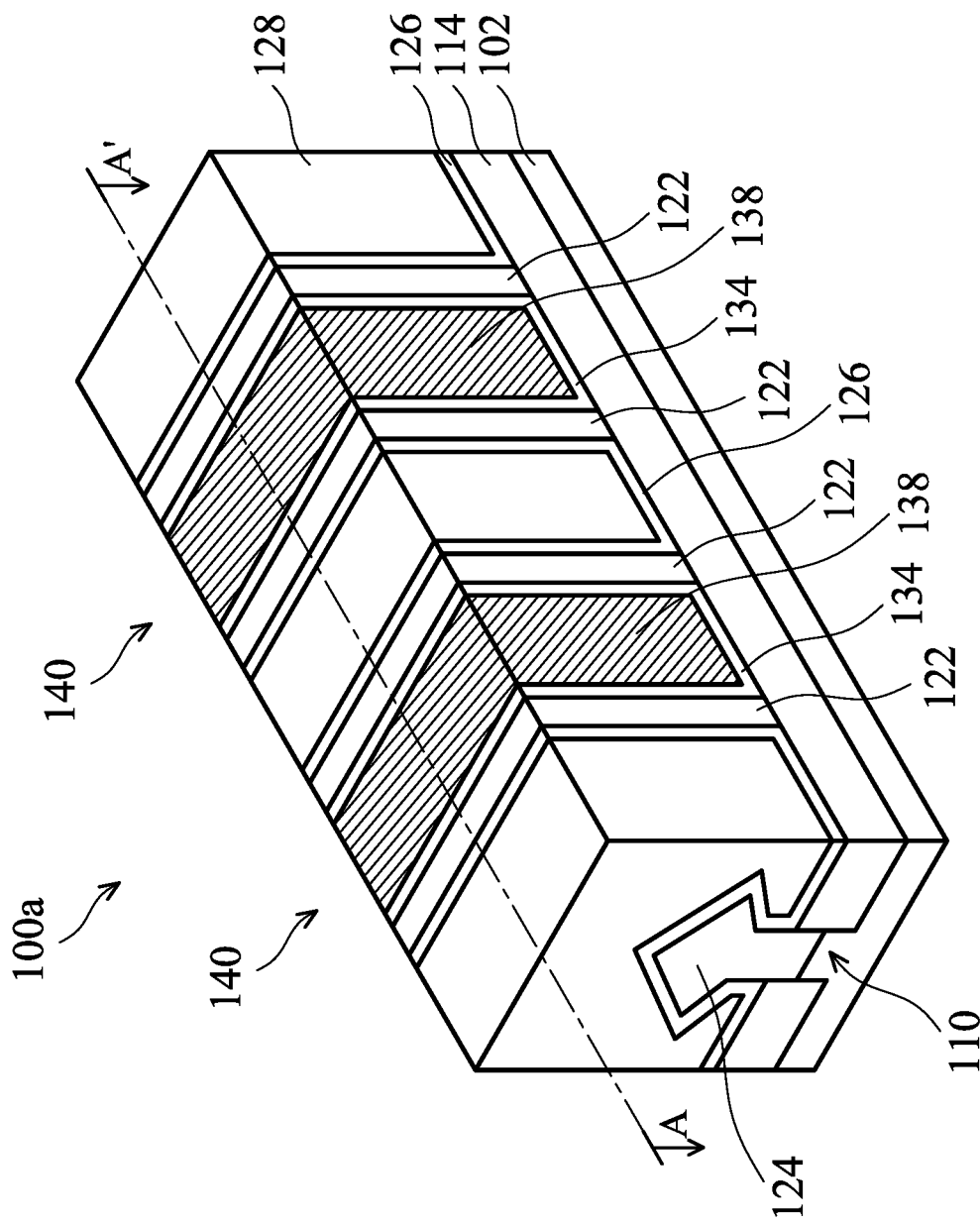

As shown in FIG. 1I, gate structures 140 are formed in the trenches 130, in accordance with some embodiments. The gate structures 140 each include a gate dielectric layer 134 and a gate electrode layer 138.

The gate dielectric layer 134 may be a single layer or multiple layers. The gate dielectric layer 134 is made of silicon oxide (SiOx), silicon nitride (SixNy), silicon oxynitride (SiON), dielectric material(s) with high dielectric constant (high-k), or a combination thereof. The high dielectric constant (high-k) material may be hafnium oxide (HfO$_2$), zirconium oxide (ZrO$_2$), lanthanum oxide (La$_2$O$_3$), yttrium oxide (Y$_2$O$_3$), aluminum oxide (Al$_2$O$_3$), titanium oxide (TiO$_2$), or another applicable material. In some embodiments, the gate dielectric layer 134 is deposited by a plasma enhanced chemical vapor deposition (PECVD) process or by a spin coating process.

The gate electrode layer 138 is made of conductive material, such as aluminum (Al), copper (Cu), tungsten (W), titanium (Ti), tantalum (Ta), or other applicable materials. In some embodiments, the gate structure 140 further includes a work function layer. The work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

The gate electrode layer 138 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 2A:
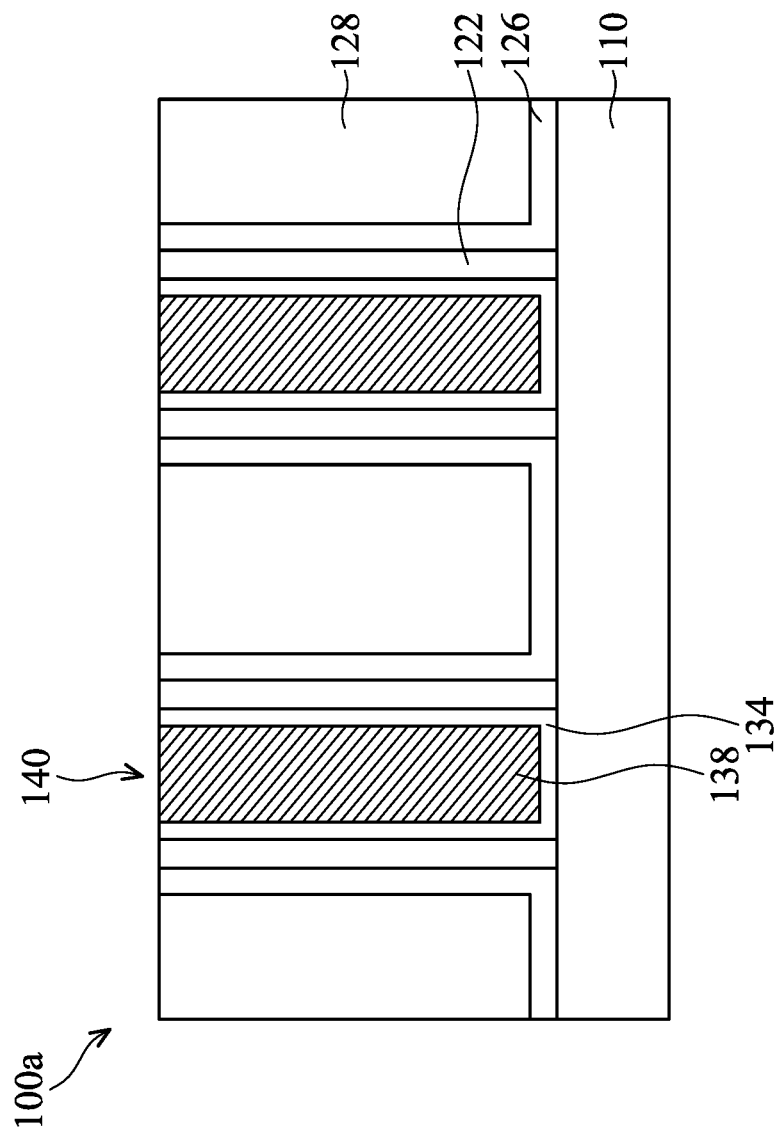
FIGS. 2A-2S show cross-sectional representations of various stages of forming the FinFET device structure after the stages associated with FIGS. 1A-1I in accordance with some embodiments of the disclosure.
Figure 2B:
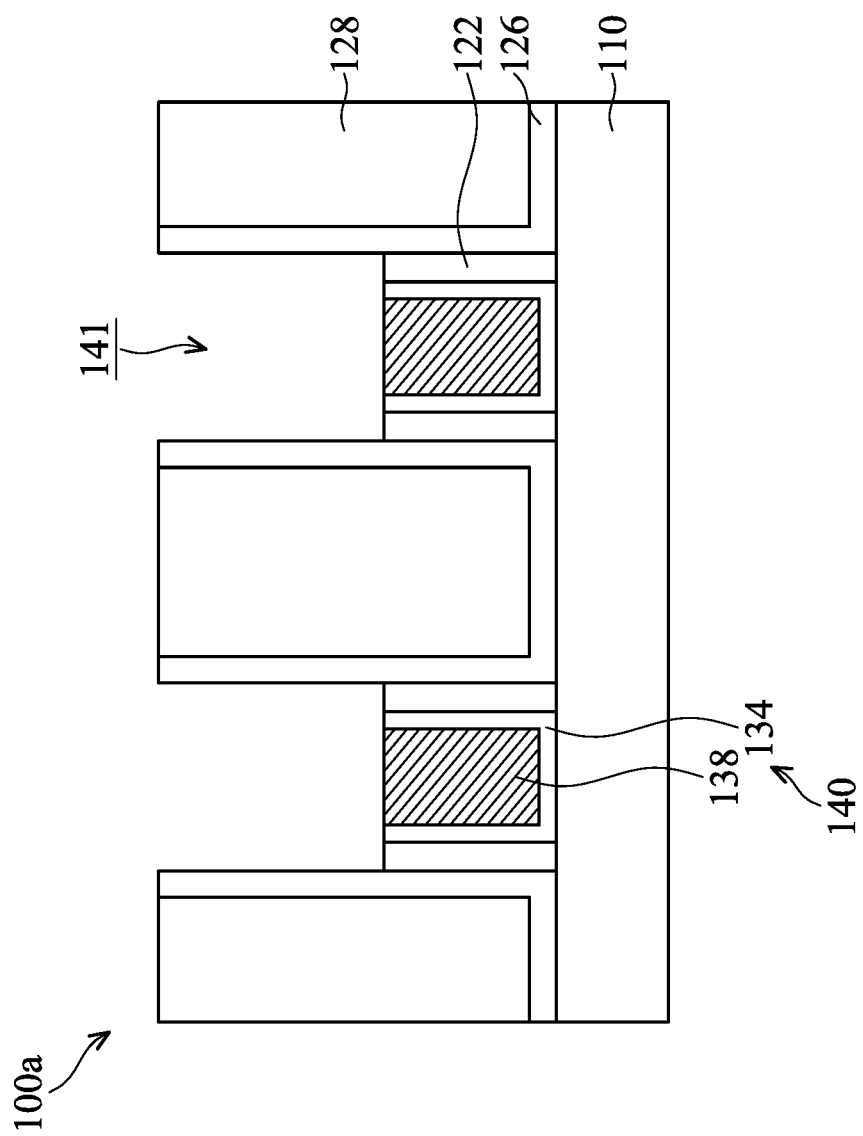
Figure 2C:
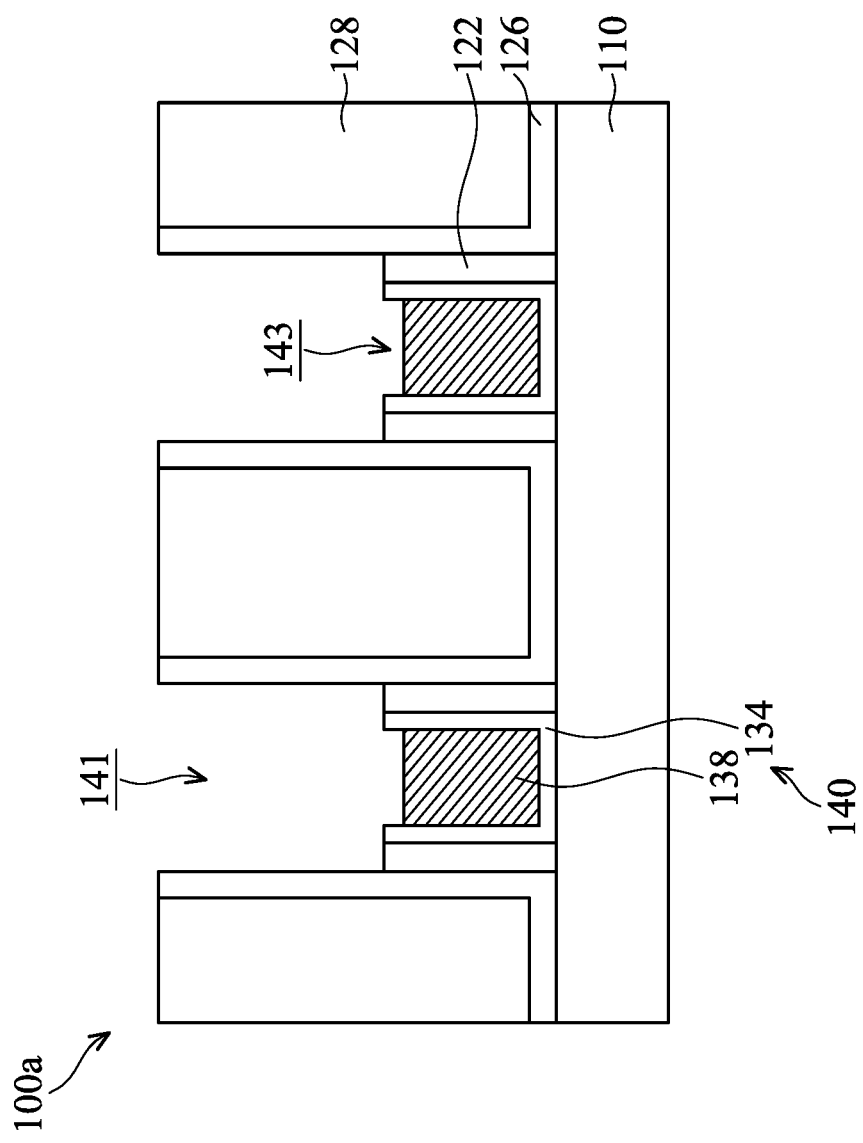
Figure 2D:
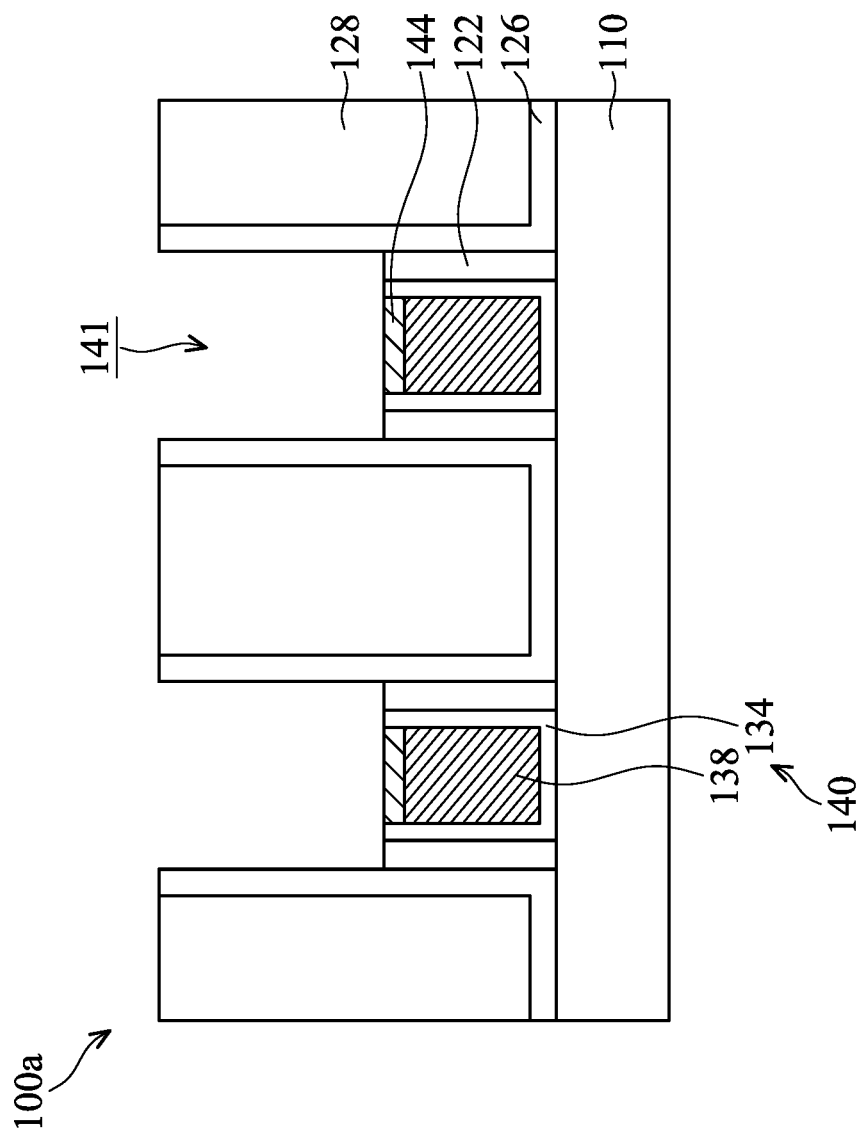
Figure 2E:
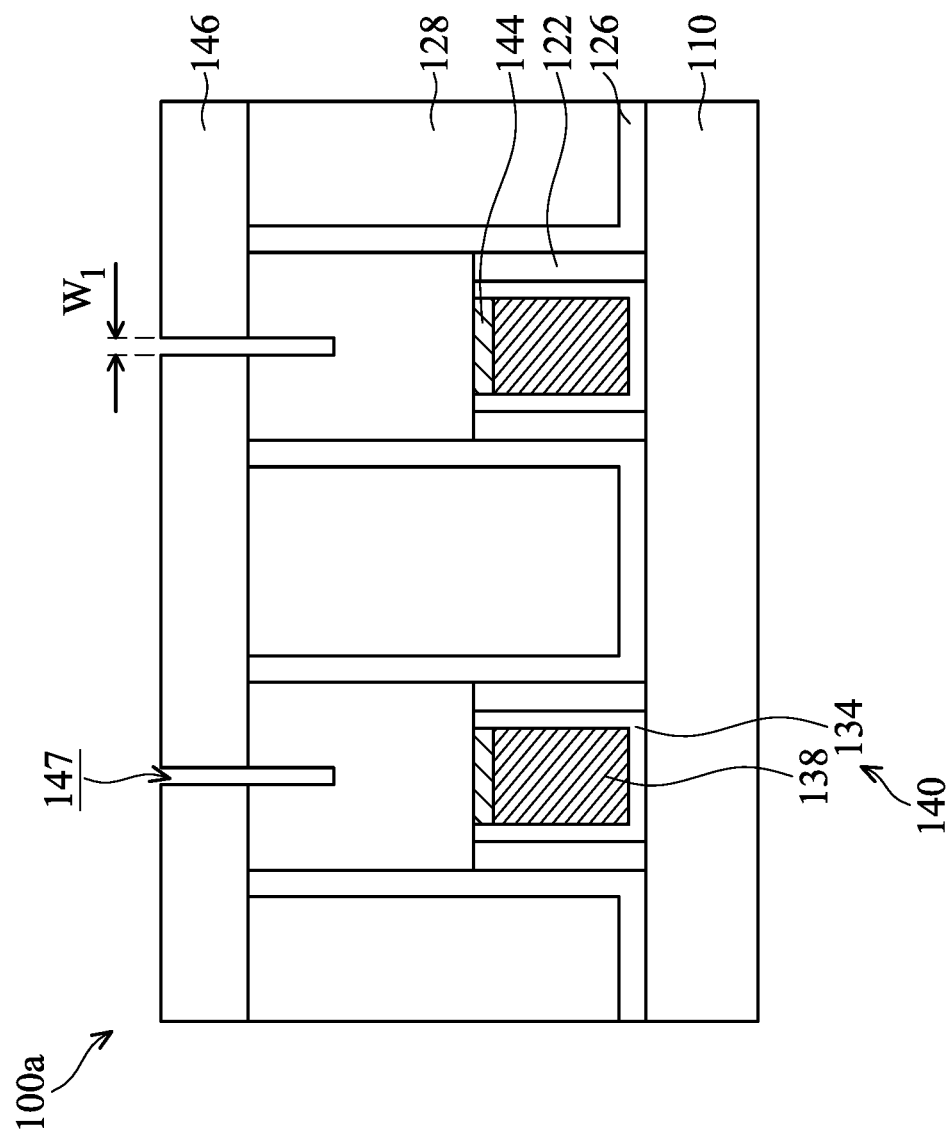
Figure 2F:
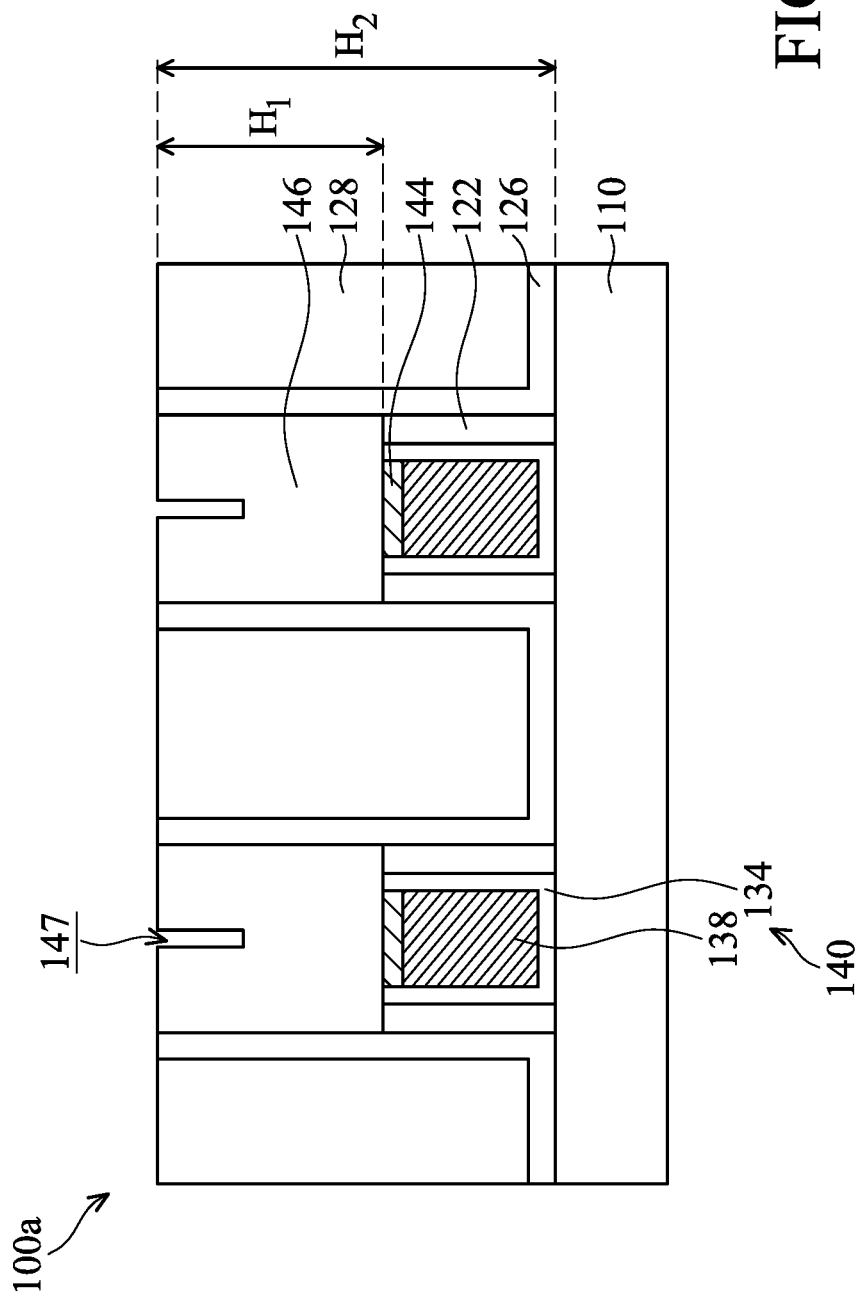
Figure 2G:
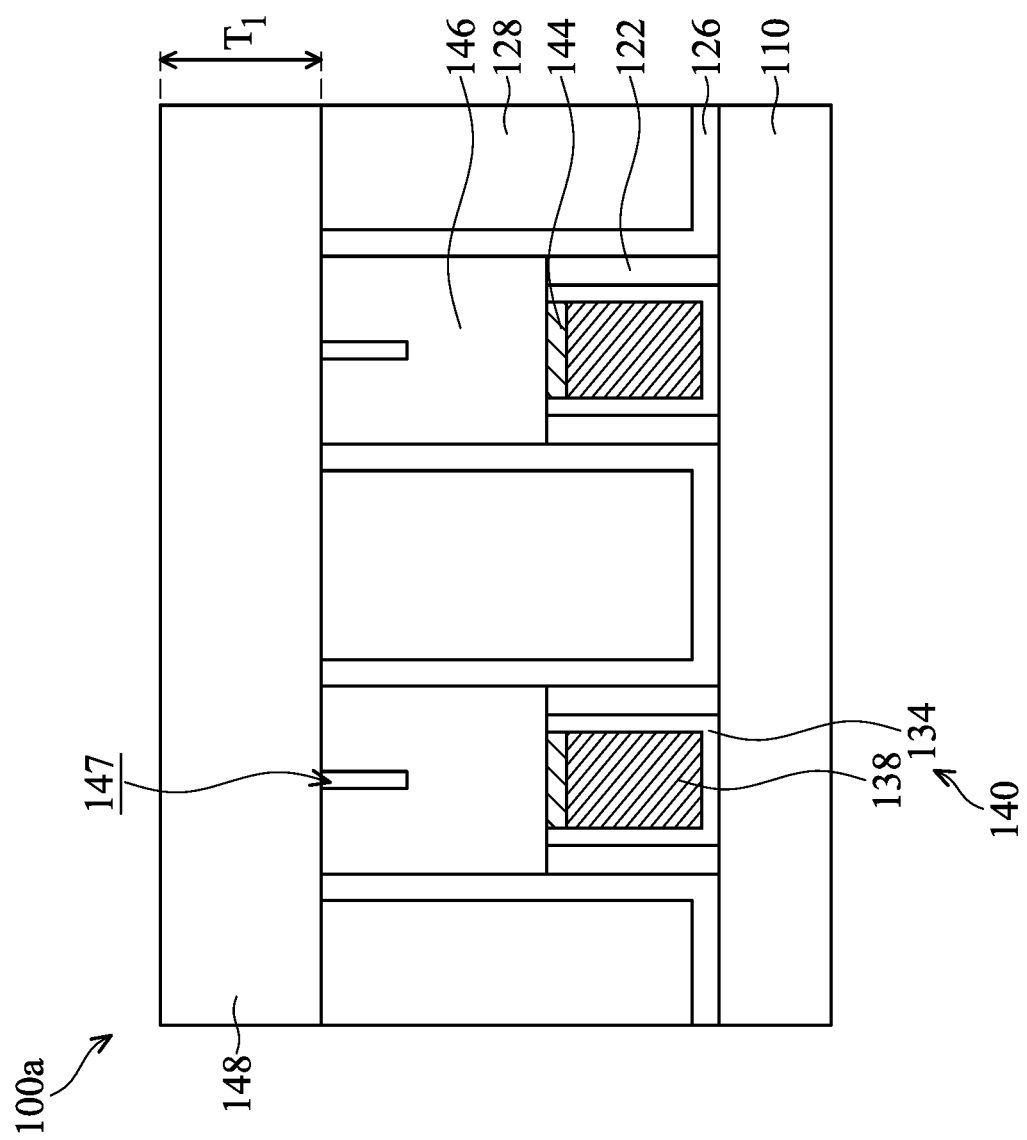
Figure 2H:
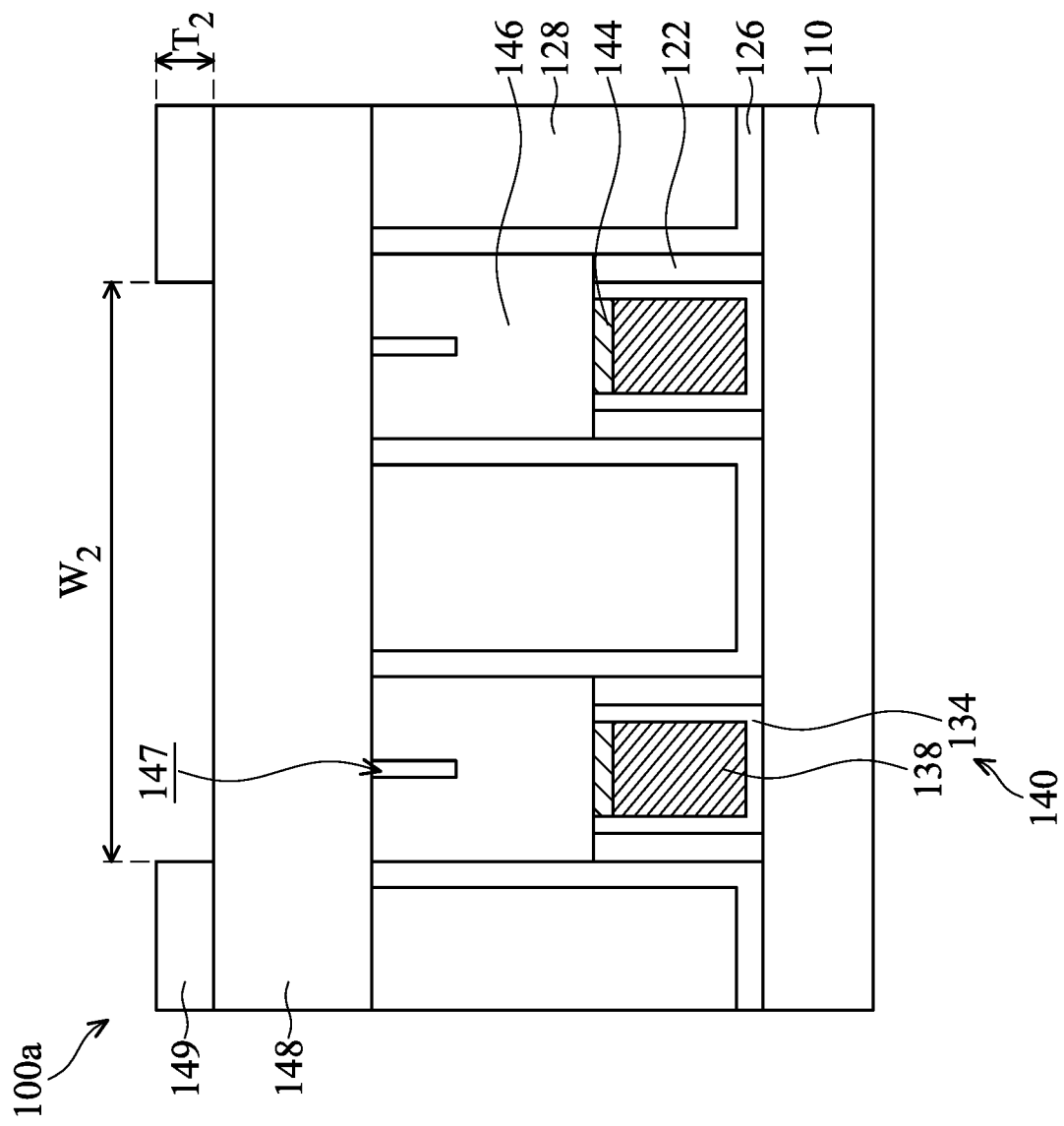
Figure 2I:
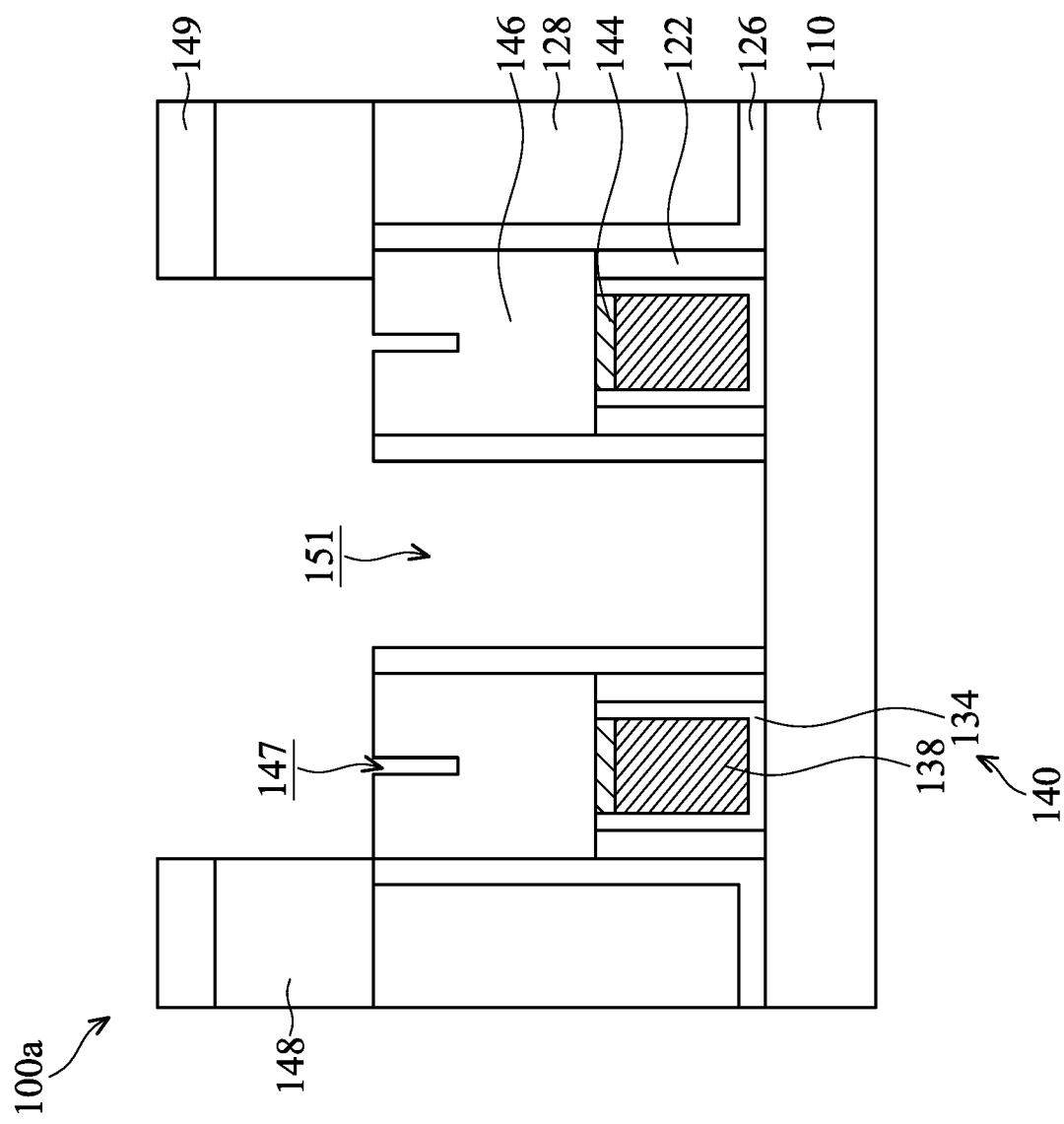
Figure 2J:
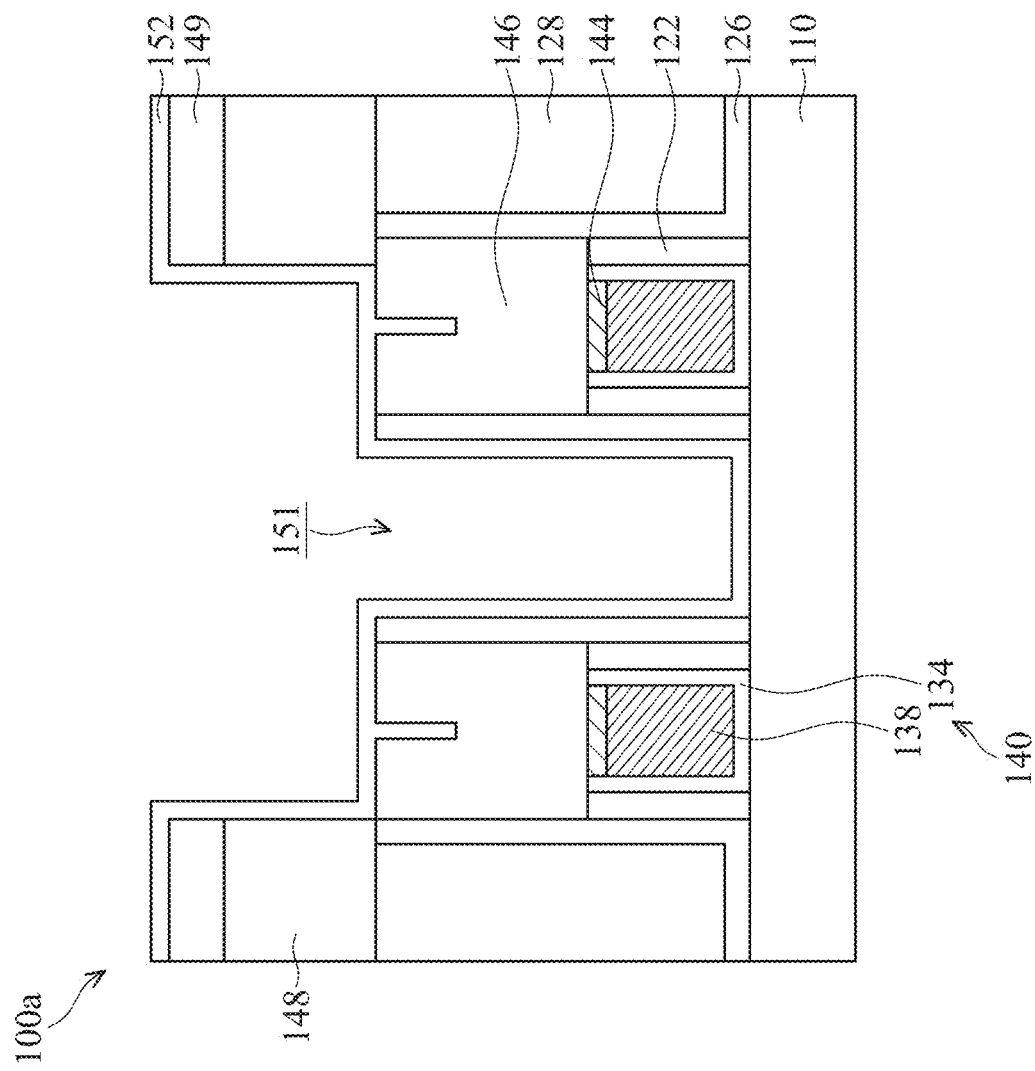
Figure 2K:
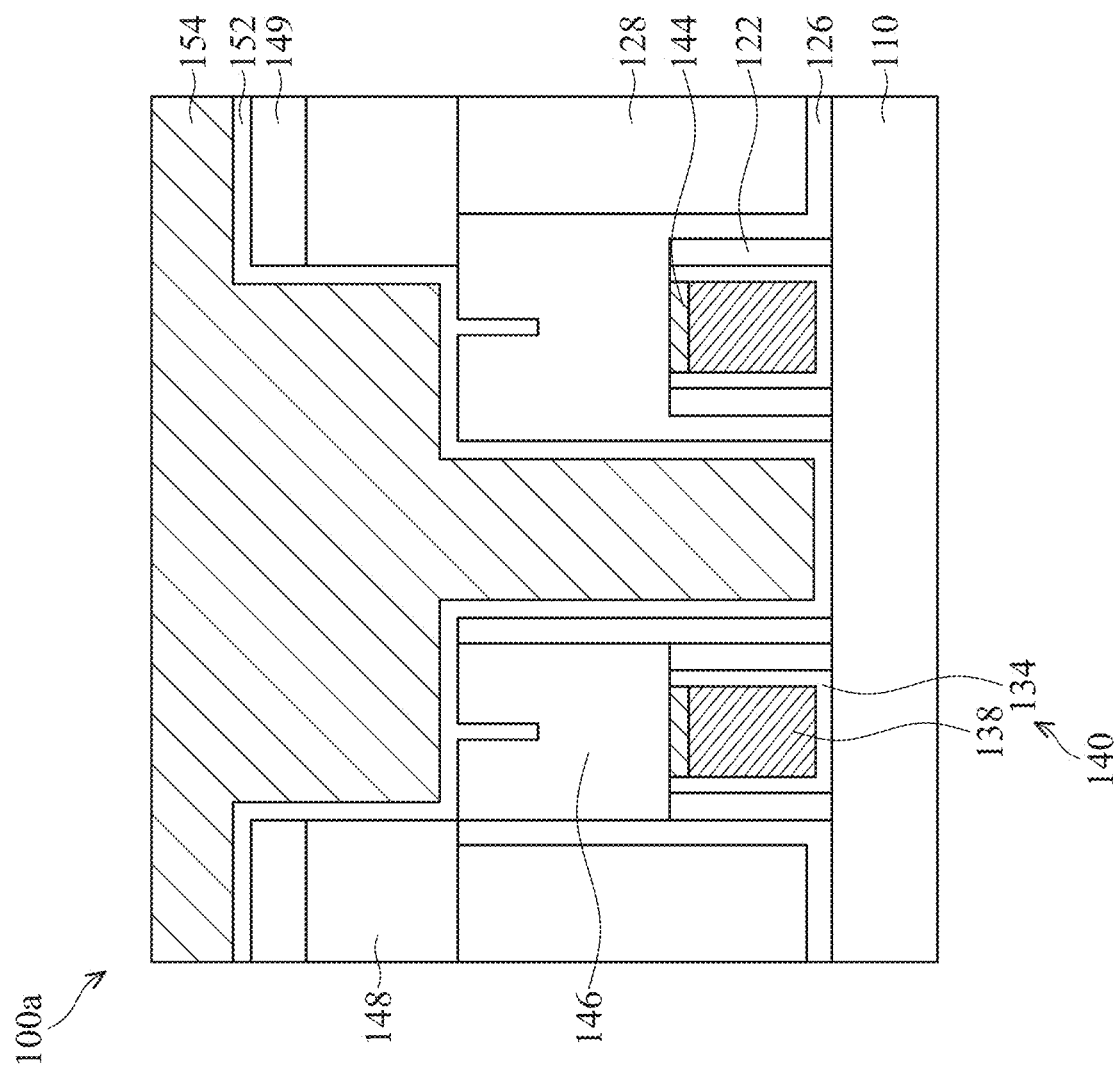
Figure 2L:
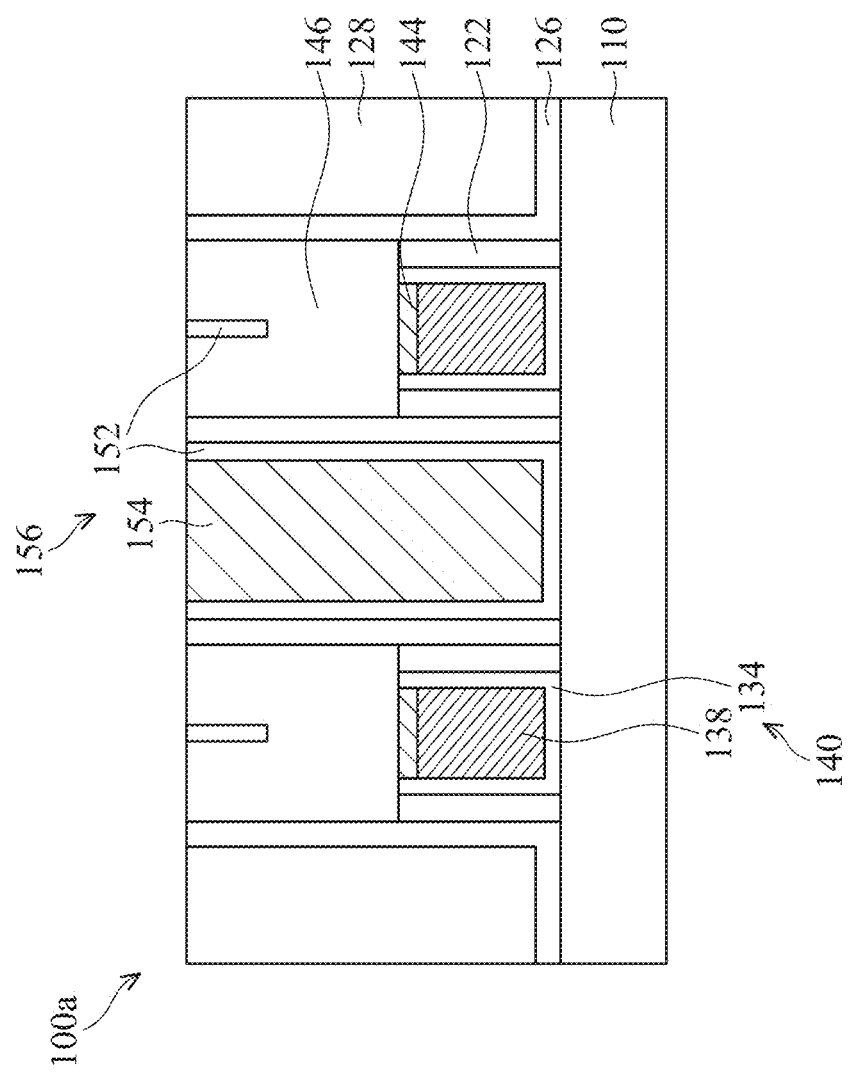
Figure 2M:
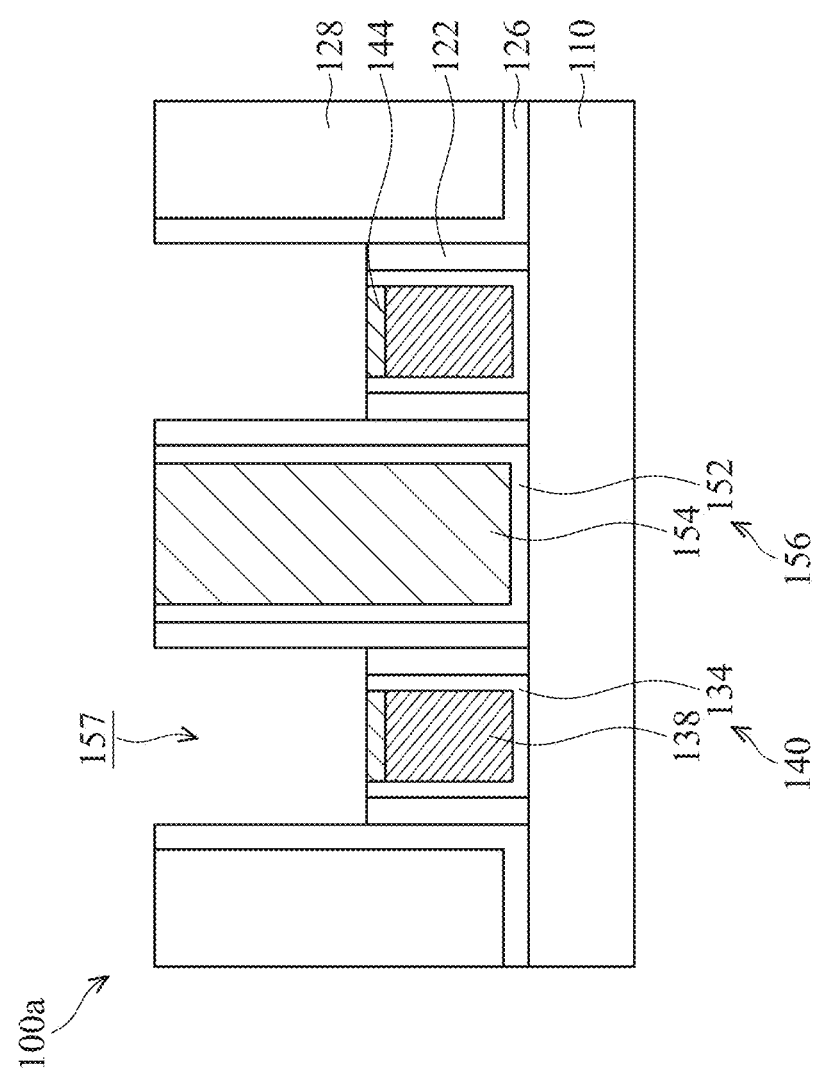
Figure 2N:
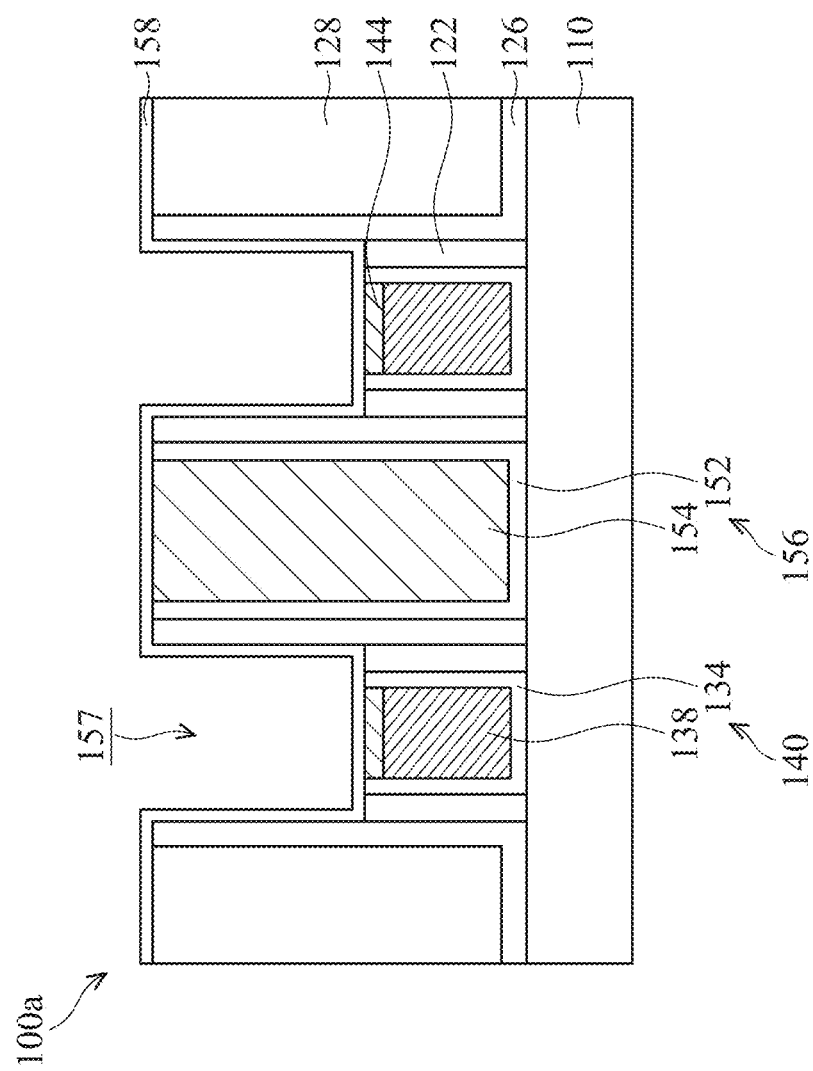
Figure 20:
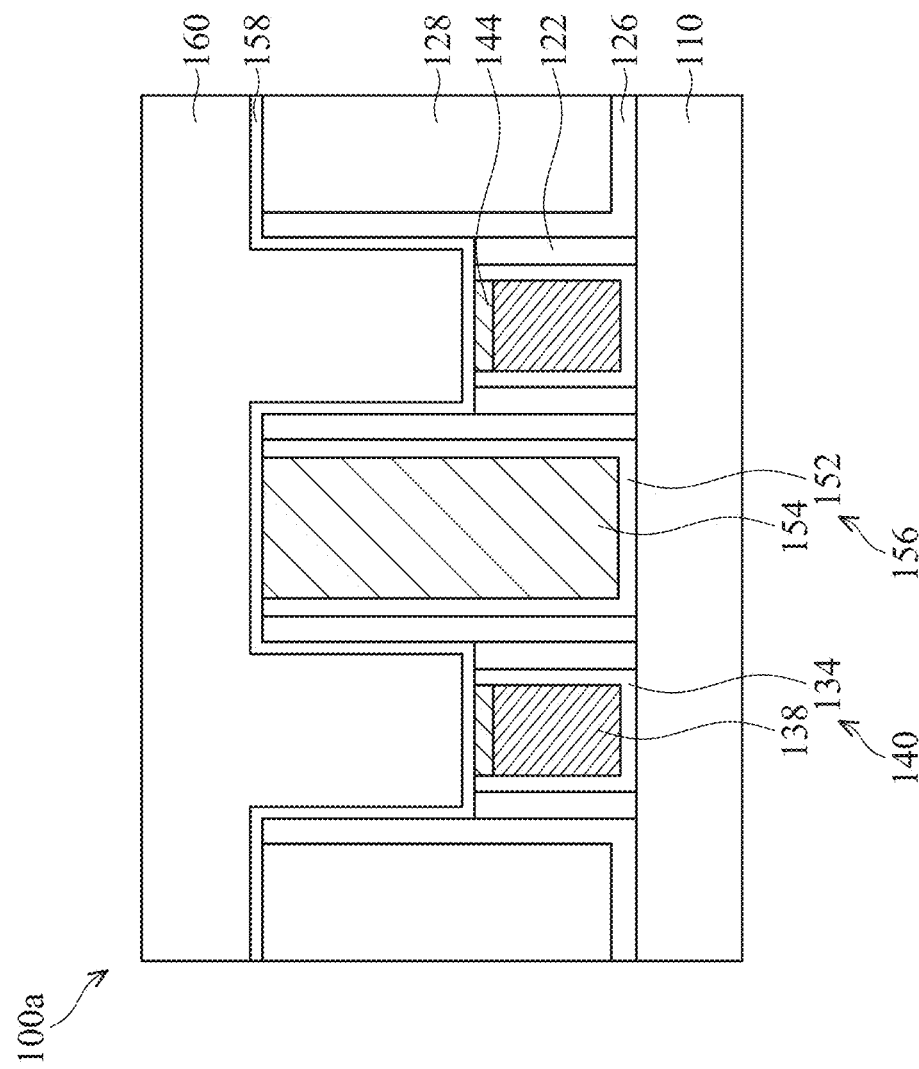
Figure 2P:
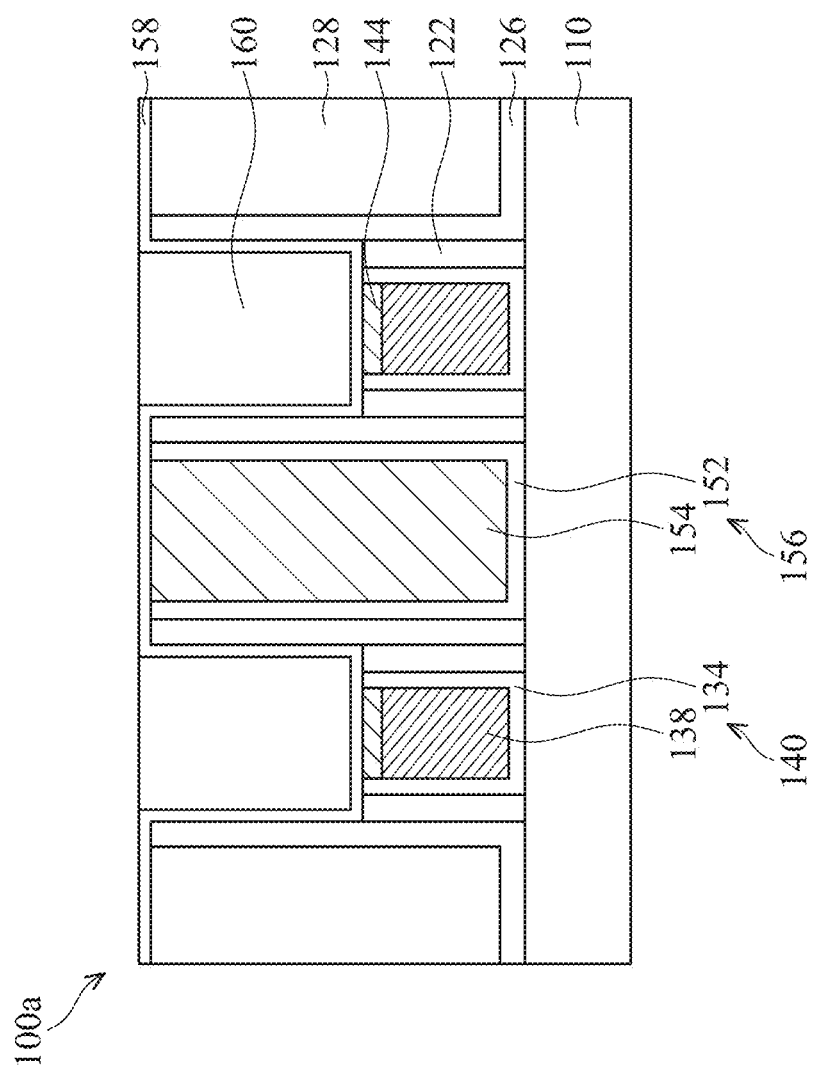
Figure 2Q:
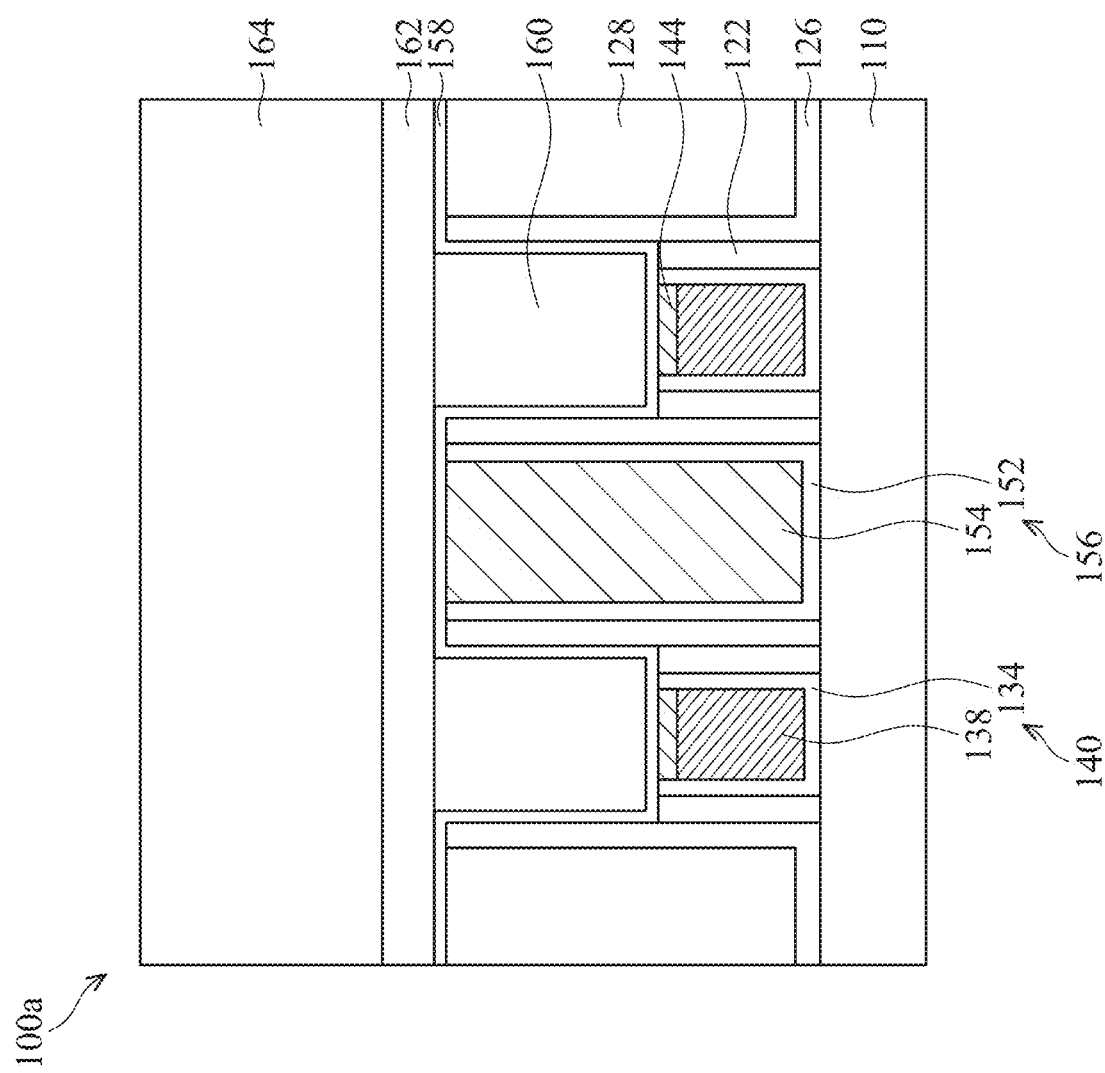
Figure 2R:
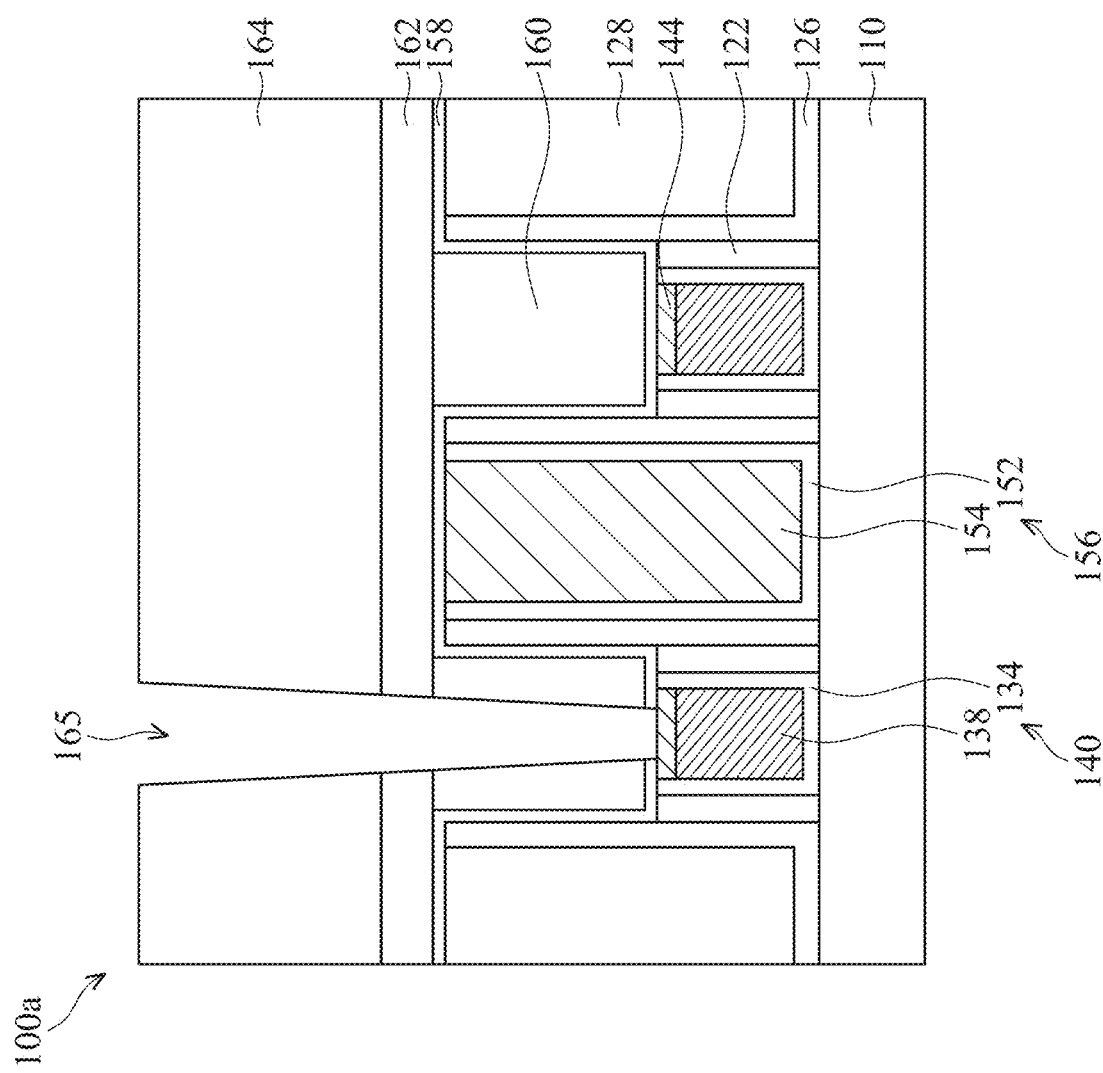
Figure 2S:
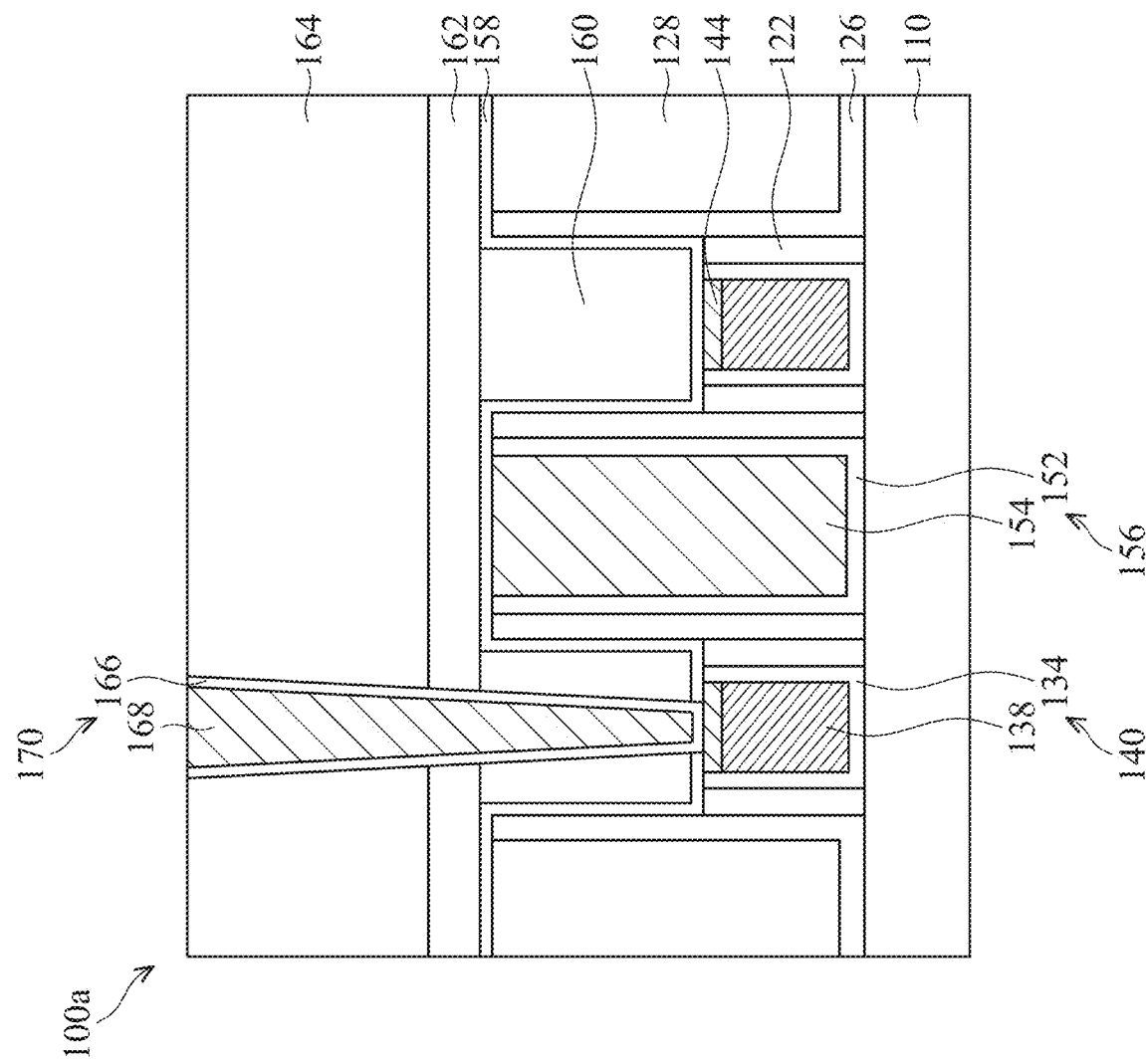

FIGS. 2A-2S show cross-sectional representations of various stages of forming the FinFET device structure 100*a* after the stages of FIGS. 1A-1I, in accordance with some embodiments of the disclosure. FIG. 2A is a cross-sectional representation taken along line A-A' of FIG. 1I.

As shown in FIG. 2A, the gate structures 140 including the gate dielectric layers 134 and the gate electrode layers 138 are formed over the fin 110. The gate spacer layers 122 are formed on opposite sidewalls of the gate structures 140. The CESL 126 is formed adjacent to the gate spacer layers 122.

As shown in FIG. 2B, a portion of the gate structures 140 and a portion of the gate spacer layers 122 are removed, in accordance with some embodiments. As a result, trenches 141 are formed over the gate structures 140 and the gate spacer layers 122. The sidewalls of the CESL 126, the top surfaces of the gate structures 140, and the top surfaces of the gate spacer layers 122 are exposed by the trenches 141.

As shown in FIG. 2C, a portion of the gate electrode layers 138 of the gate structures 140 re-removed, in accordance with some embodiments. As a result, recesses 143 are formed over the gate electrode layers 138. The top surfaces of the gate electrode layers 138 are lower than the top surfaces of the gate spacer layers 122 and the top surfaces of the gate dielectric layers 134.

As shown in FIG. 2D, protection layers 144 are formed on the top surfaces of the gate structures 140 and in the recesses 143, in accordance with some embodiments. The protection layers 144 are used to protect the underlying layers from being polluted or damaged. In some embodiments, the protection layers 144 are selectively formed on the top surfaces of the gate electrode layers 138, not on the gate dielectric layers 134. The top surfaces of the protection layers 144 are substantially coplanar with the top surfaces of the gate dielectric layers 134 and the top surfaces of the gate spacer layers 122. In some other embodiments, the protection layers 144 extend from the top surfaces of the gate electrode layers 138 to the top surfaces of the gate dielectric layers 134.

In some embodiments, the protection layer 144 is formed by a deposition process, and the deposition process includes supplying a precursor on the top surface of the gate electrode layers 138. Before the deposition process, a surface treatment process is used to activate the top surfaces of the gate electrode layers 138. In some embodiments, the surface treatment process includes using hydrogen (H$_2$) gas. When hydrogen (H$_2$) gas is used, hydrogen radicals are formed on the top surfaces of the gate electrode layers 138. The hydrogen radicals are selectively formed on the top surfaces of the gate electrode layers 138 to facilitate the formation of the protection layers 144.

The precursor used in the deposition process may include tungsten (W)-containing material, such as tungsten hexafluoride ($WF_6$) or tungsten hexachloride ($WCl_6$). The precursor reacts with the hydrogen radicals to form the protection layers 144 on the gate electrode layers 138.

In some embodiments, the protection layers 144 are made of a conductive material, such as tungsten (W). The protection layers 144 are electrically connected to the gate electrode layers 138 of the gate structures 140.

It should be noted that, because the protection layers 144 are selectively formed on the gate structures 140 and no additional mask layer is used to define the location of the protection layers 144, alignment of the protection layers 144 is easier. The protection layers 144 are not formed by a photolithography process. Therefore, the fabrication time and cost are reduced.

As shown in FIG. 2E, a hard mask layer 146 is formed on the protection layer 144, the CESL 126, and the first ILD layer 128, in accordance with some embodiments. The hard mask layer 146 and the first ILD layer 128 are made of different materials. In some embodiments, the hard mask layer 146 has a higher etching selectivity with respect to the first ILD layer 128.

In some embodiments, the hard mask layer 146 has a dielectric constant that is greater than the dielectric constant of the first ILD layer 128. Since the dielectric constant (k value) of the hard mask layer 146 is greater than that of the first ILD layer 128, the capacitance between the gate structure 140 and the S/D contact structure (156 in FIG. 2L, formed later) is increased. Therefore, the performance of the FinFET device structure is improved. In order to decrease the capacitance between the gate structure 140 and the S/D contact structure 156 (in FIG. 2L), the hard mask layer 146 is replaced by other materials having a lower dielectric constant, as described herein.

In some embodiments, the hard mask layer 146 is made of silicon nitride, silicon oxynitride, amorphous carbon material, silicon carbide, other suitable nitrogen-containing materials, other suitable dielectric materials, or combinations thereof. In some embodiments, the hard mask layer 146 is formed by a deposition process, such as an atomic layer deposition (ALD) process, a chemical vapor deposition (CVD) process, a physical vapor deposition (PVD) process, or another applicable process. In some embodiments, a number of seams 147 are formed in the hard mask layer 146. The seams 147 are formed due to the deposition process. In some embodiments, each of the seams 147 has a first width $W_1$ in a range from about 0.1 nm to about 3 nm.

As shown in FIG. 2F, a portion of the hard mask layer 146 is removed, in accordance with some embodiments. The seams 147 are still in the hard mask layer 146. In some embodiments, the portion of the hard mask layer 146 is removed by a polishing process, such as chemical mechanical polishing (CMP) process. In some embodiments, the hard mask layer 146 has a first height $H_1$ in a range from about 5 nm to about 60 nm. There is a second height $H_2$ measured from the top surface of the hard mask layer 146 to the bottom surface of the gate structure 140. In some embodiments, a ratio ($H_1:H_2$) of the first height $H_1$ to the second height $H_2$ is in a range from about 1:2 to about 2:3.

As shown in FIG. 2G, a second ILD layer 148 is formed over the hard mask layer 146, the CESL 126, and the first ILD layer 128, in accordance with some embodiments. The material and the formation process of the second ILD layer 148 may be the same as or similar to that of the first ILD layer 128. In some embodiments, the second ILD 148 has a first thickness $T_1$, and the first thickness $T_1$ is in a range from about 50 nm to about 250 nm.

As shown in FIG. 2H, a photoresist material is formed on the second ILD layer 148 and then it is patterned to form a patterned photoresist layer 149, in accordance with some embodiments. The patterned photoresist layer 149 has an opening to expose a portion of the second ILD layer 148. In some embodiments, the opening of the patterned photoresist layer 149 has a second width $W_2$ in a range from about 300 nm to about 3000 nm. In some embodiments, the patterned photoresist layer 149 has a thickness $T_2$, and the thickness $T_2$ is in a range from about 5 nm to about 20 nm.

As shown in FIG. 2I, a portion of the second ILD layer 148 and a portion of the first ILD layer 128 are removed to expose one of the source/drain structures 124, which is disposed between the gate structures 140. Portions of the hard mask layers 146 having seams 147 are also exposed by removing the portion of the second ILD layer 148 and the portion of the first ILD layer 128, in accordance with some embodiments. As a result, a trench 151 is formed. The CESL 126 and the hard mask layers 146 are exposed by the trench 151. In some embodiments, a top surface of a source/drain region in fin structure 110 is exposed.

It should be noted that, the hard mask layers 146 have a higher etching selectivity than the first ILD layer 128 and the second ILD layer 148, and therefore the first ILD layer 128 is removed, but the hard mask layer 146 is remaining after the etching process. The hard mask layers 146 protects the underlying layers from being damaged during the formation of the trench 151.

As shown in FIG. 2J, a glue layer 152 is formed in the trench 151, in accordance with some embodiments. The glue layer 152 is conformally formed in the trench 151. In addition, the glue layer 152 is formed in and embedded in the seams 147. The glue layer 152 is used to improve the adhesion between a conductive layer 154 (formed later) and the CESL 126. It should be noted that the trench 151 is not completely filled with the glue layer 152.

In some embodiments, the glue layer 152 is made of conductive material, such as Ti, TiN, TaN, Ru, Co, W, $W(Co)_6$, or another applicable material. In some embodiments, the glue layer 152 is formed by a deposition process, such as an atomic layer deposition (ALD) process, a chemical vapor deposition (CVD) process, a physical vapor deposition (PVD) process, or another applicable process.

As shown in FIG. 2K, a conductive layer 154 is formed in the trench 151 and on the glue layer 152 and on the patterned photoresist layer 149, in accordance with some embodiments. In some embodiments, the conductive layer 154 is made of Ru, Co, W, Cu, Mo, or another applicable conducive material. In some embodiments, the conductive layer 154 is formed by a deposition process, such as an atomic layer deposition (ALD) process, a chemical vapor deposition (CVD) process, a physical vapor deposition (PVD) process, or another applicable process.

As shown in FIG. 2L, a portion of the conductive layer 154, the glue layer 152, and the patterned photoresist layer 149 are removed, in accordance with some embodiments. As a result, the top surface of the glue layer 152 is substantially coplanar with the top surface of the CESL 126 and the top surface of the conductive layer 154. In some embodiments, the portion of the conductive layer 154, the glue layer 152, and the patterned photoresist layer 149 are removed by a polishing process, such as chemical mechanical polishing (CMP) process. As a result, a S/D contact structure 156 is formed over the S/D structure 124. The S/D contact structure 156 is electrically connected to the S/D structure 124. The S/D contact structure 156 includes a U-shaped glue layer 152 and the conductive layer 154 filled in the middle portion of the U-shaped glue layer 152.

It should be noted that, a portion of the glue layer 152 is not removed and is still embedded in the hard mask layers 146. Since the glue layer 152 has a higher etching resistance than the hard mask layers 146, if the portion of the glue layer 152 is embedded in the hard mask layers 146, the hard mask layers 152 are difficult to remove by the subsequent etching process for forming a gate contact structure. Therefore, the hard mask layers 146 and the glue layers 152 are removed simultaneously in the following process and replaced by other materials to prevent the glue layers 152 over the gate structures 140 from blocking the etching process.

As shown in FIG. 2M, the hard mask layers 146 with embedded glue layers 152 are removed to expose the top surfaces of the protection layers 144, in accordance with some embodiments. As a result, trenches 157 are formed to expose the sidewalls of the CESL 126, the top surfaces of the protection layers 144, the top surfaces of the gate dielectric layers 134, and the top surfaces of the gate spacer layers 122.

As shown in FIG. 2N, a liner layer 158 is formed in the trenches 157 and on the top surfaces of the CESL 126 and on the first ILD layer 128, in accordance with some embodiments. The liner layer 158 is conformally formed in the trenches 157 and has a U-shaped structure in the trenches 157. In addition, the trenches 157 are not completely filled with the liner layer 158. The protection layers 144 are between the liner layer 158 and the gate structures 140. The outer sidewalls of the gate spacer layers 122 are aligned with the outer sidewalls of the liner layer 158.

In some embodiments, the liner layer 158 is made of silicon carbide (SiC), silicon oxycarbide (SiOC), silicon oxycarbon nitride (SiOCN), silicon nitride (SixNy), silicon carbonitride (SiCN), aluminum oxide (AlOx), hafnium oxide (HfO$_x$), zirconium oxide (ZrO$_x$), dielectric material(s) with low dielectric constant (low-k), or another applicable material. In some embodiments, the liner layer 158 is formed by performing a deposition process, such as an atomic layer deposition (ALD) process, a chemical vapor deposition (CVD) process, a physical vapor deposition (PVD) process, or another applicable process. In some embodiments, the liner layer 158 has a thickness in a range from about 1 nm to about 4 nm.

As shown in FIG. 2O, a filling layer 160 is formed over the liner layer 158, in accordance with some embodiments. The liner layer 158 is between the CESL 126 and the filling layer 160. The liner layer 158 and the filling layer 160 are made of different materials. The liner layer 158 has a U-shaped structure in the trenches 157 and the filling layer 160 fills in the middle portions of the U-shaped structures of the liner layer 158. In some embodiments, the liner layer 158 has a dielectric constant which is greater than the dielectric constant of the filling layer 160.

The material property of the filling layer 160 is different from the hard mask layer 146. It should be noted that, as mentioned before, the hard mask layer 146 has a higher etching selectivity than the first ILD layer 128 and the second ILD layer 148. The hard mask layer 146 protects the underlying layers from being damaged when the trench 151 is formed in FIG. 2I, but after the S/D contact structure 156 is formed, the hard mask layer 146 can be replaced by the liner layer 158 and the filling layer 160. The re-filled filling layer 160 and the first ILD layer 128 have substantially the same etching selectivity. In some embodiments, the filling layer 160 and the first ILD layer 128 are made of the same material, and therefore the filling layer 160 and the first ILD layer 128 have substantially the same etching selectivity. In addition, the liner layer 158 has a higher etching selectivity than the filling layer 160. Since a portion of the glue layer 152 embedded in the hard mask layer 146 is removed along with the hard mask layer 146, the issues relating to difficulty of removing the glue layer 152 during gate contact structure formation is resolved.

It should be noted that, the filling layer 160 has a dielectric constant which is smaller than the dielectric constant of the hard mask layer 146. Since the filling layer 160 has a smaller dielectric constant (k value), as mentioned before, the capacitance between the gate structure 140 and the S/D contact structure 156 is decreased.

In some embodiments, the filling layer 160 is made of silicon oxide (SiOx), silicon nitride (SixNy), silicon oxynitride (SiON), dielectric material(s) with low dielectric constant (low-k), or combinations thereof. In some embodiments, the filling layer 160 is formed by performing a deposition process, such as an atomic layer deposition (ALD) process, a chemical vapor deposition (CVD) process, a physical vapor deposition (PVD) process, or another applicable process.

As shown in FIG. 2P, a portion of the filling layer 160 is removed, in accordance with some embodiments. The liner layer 158 is not removed and is remaining on the top surface of the CESL 126, the top surface of the S/D contact structure 156, and the top surface of the first ILD layer 128. Therefore, each pair of gate spacer layers 122 extends along sidewalls of gate structures 140, the liner layer 158 extends from the sidewall of the CESL 126 along one of gate spacer layers 122 to over the top surface of the CESL 126 along an opposite one of gate spacer layers 122. A bottom surface of the liner layer 158 is lower than the top surface of the first ILD layer 128, and a bottom surface of the filling layer 160 is lower than the top surface of the first ILD layer 128.

As shown in FIG. 2Q, an etch stop layer 162 is formed on the filling layer 160, and a third ILD layer 164 is formed over the etch stop layer 162, in accordance with some embodiments. The material and the formation process of the etch stop layer 162 is the same as or similar to that of the CESL 126. The material and the formation process of the third ILD layer 164 is the same as or similar to that of the first ILD layer 128.

As shown in FIG. 2R, a via hole 165 is formed through the third ILD layer 164, the etch stop layer 162, the filling layer 160, and the liner layer 158 to expose the protection layer 144, in accordance with some embodiments. The via hole 165 has a tapered width from top to bottom. The via hole 165 is formed by performing an etching process including multiple etching processes.

As shown in FIG. 2S, a barrier layer 166 and a conductive layer 168 are formed in the via hole 165 to form a gate contact structure 170, in accordance with some embodiments. The gate contact structure 170 is formed over the protection layer 144, and the gate contact structure 170 is electrically connected to the gate structure 140 by the protection layer 144.

The liner layer 158 is between the CESL 126 and the etch stop layer 162, and the liner layer 158 is between the S/D contact structure 156 and the filling layer 160. The liner layer 158 is between the gate spacer layers 122 and the filling layer 160. The liner layer 158 is in direct contact with the protection layer 144 and the gate spacer layers 122. The liner layer 158 extends from a first portion to a second portion, the first portion is on the gate structure 140, and the second portion is on the S/D contact structure 156. The filling layer 160 is in direct contact with the CESL 126, the S/D contact structure 156 and the etch stop layer 162.

The gate contact structure 170 is through the liner layer 158 and the filling layer 160, and the gate contact structure 170 is through the interface between the liner layer 158 and the filling layer 160. The gate contact structure 170 has a tapered width from top to bottom, and the width of the protection layer 144 is greater than the width of a bottom surface of the gate contact structure 170.

It should be noted that, the gate contact structure 170 is through the filling layer 160 which is directly over the gate structure 140, and the filling layer 160 has a dielectric constant lower than the dielectric constant of the hard mask layer 146. Therefore, the capacitance between the gate structure 140 and the S/D contact structure 156 is reduced. Furthermore, since the glue layer 152 is removed along with the hard mask layer 146, there is not glue layer 152 left over the gate structure 140, and therefore the issues relating to difficulty of removing the glue layer 152 is resolved.

In some embodiments, the barrier layer 166 is made of tantalum (Ta), tantalum nitride (TaN), titanium (Ti), titanium nitride (TiN), cobalt tungsten (CoW) or another applicable material. In some embodiments, the barrier layer 166 is formed by performing a deposition process, such as an atomic layer deposition (ALD) process, a chemical vapor deposition (CVD) process, a physical vapor deposition (PVD) process, or another applicable process.

In some embodiments, the conductive layer 168 is made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another application material. In some embodiments, the conductive layer 168 is formed by a deposition process, such as a chemical vapor deposition (CVD) process, physical vapor deposition (PVD) process, atomic layer deposition (ALD) process, plating process or another application process.

Figure 3:
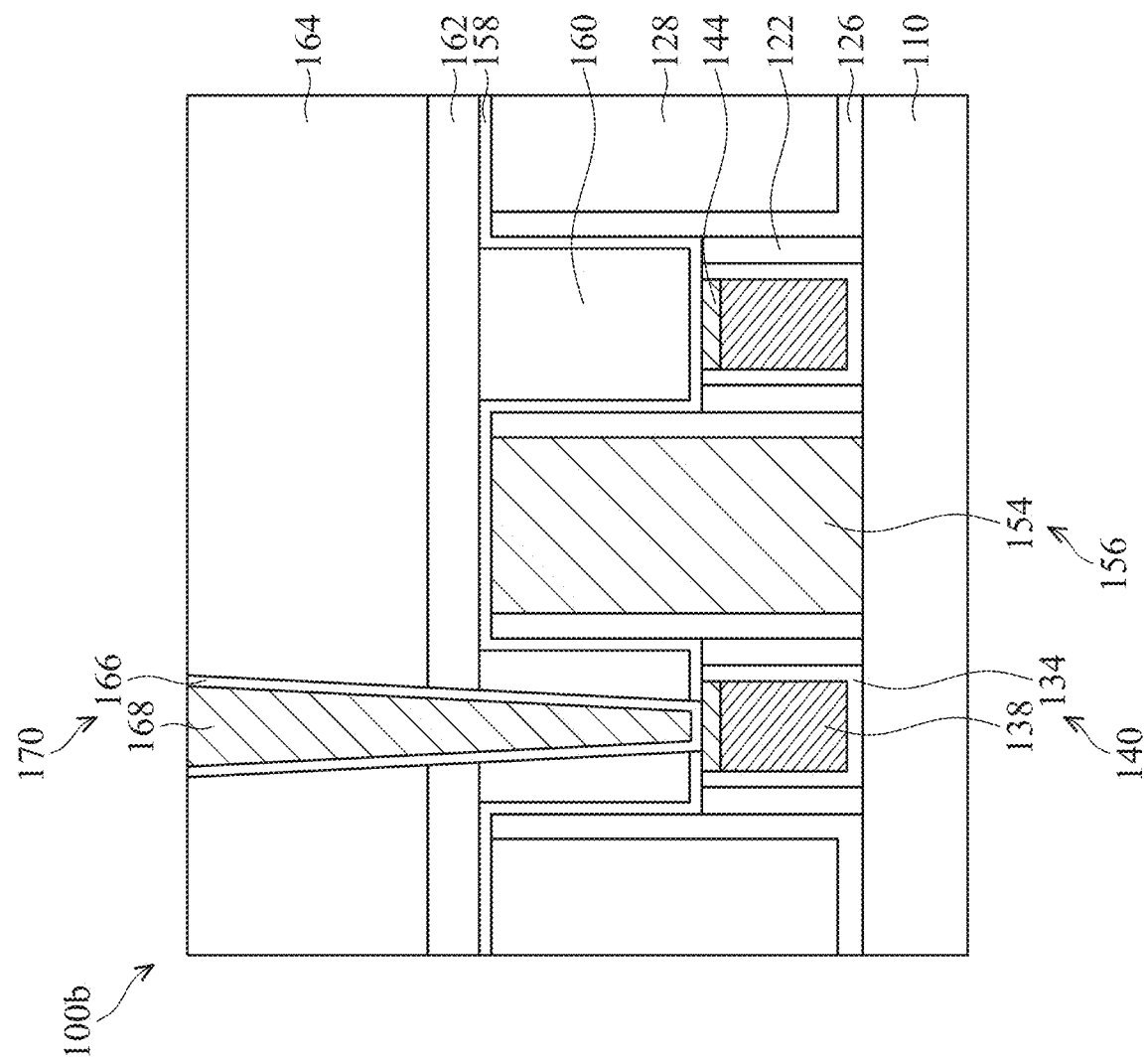
FIG. 3 shows a cross-sectional representation of a FinFET device structure in accordance with some embodiments of the disclosure.

FIG. 3 shows a cross-sectional representation of a FinFET device structure 100b, in accordance with some embodiments of the disclosure. The FinFET device structure 100b of FIG. 3 is similar to the FinFET device structure 100a of FIG. 2F, except the S/D contact structure 156 does not include glue layer 152 in FinFET device structure 100b. Materials and methods used to form the FinFET device structure 100b are similar to, or the same as, those used to form the FinFET device structure 100a and are not repeated herein. It is noted that processing associated with forming glue layer 152 may not be performed to form FinFET device structure 100b.

Figure 4A:
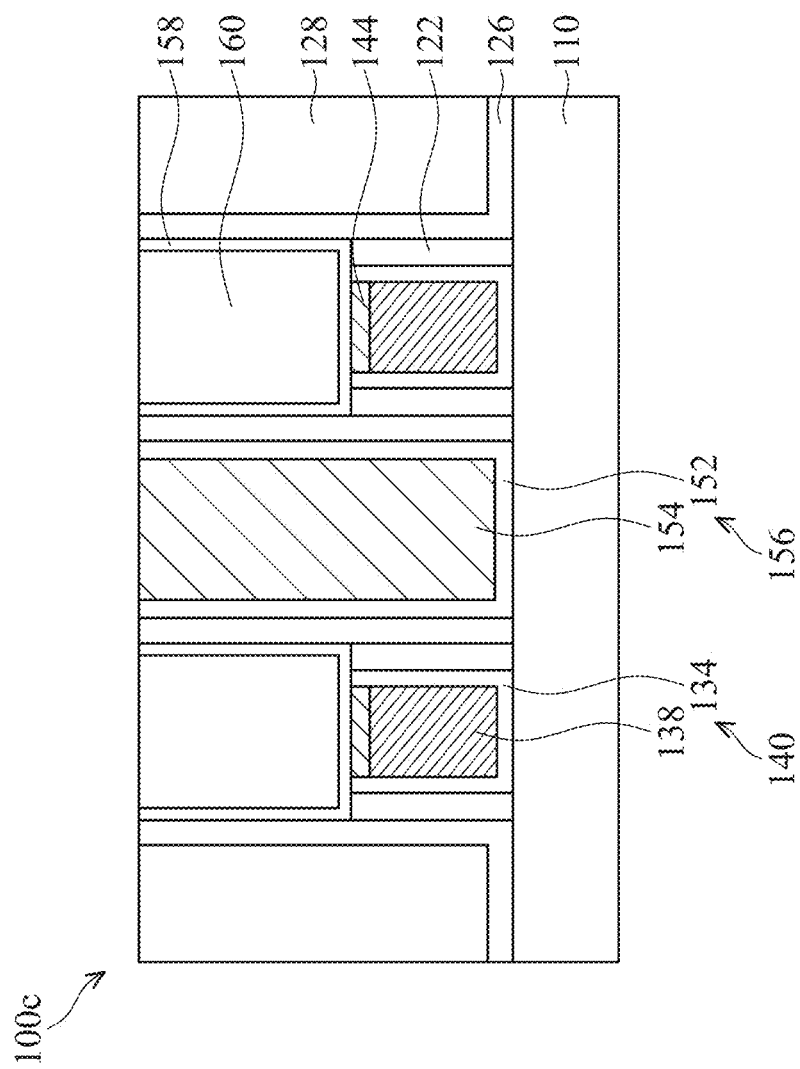
FIG. 4A and FIG. 4B show cross-sectional representations of a FinFET device structure in accordance with some embodiments of the disclosure.
Figure 4B:
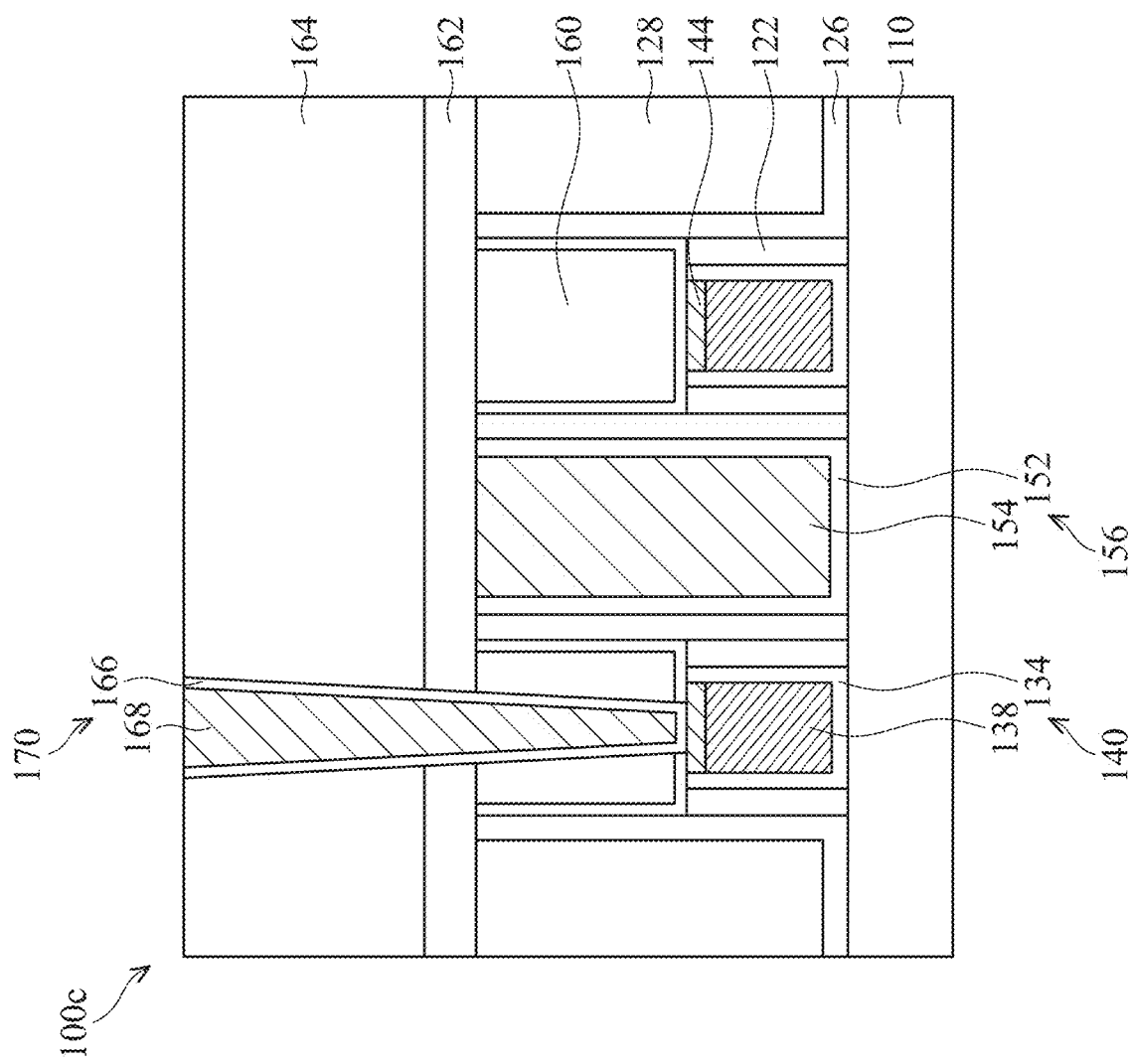

FIG. 4A and FIG. 4B show cross-sectional representations of a FinFET device structure 100c, in accordance with some embodiments of the disclosure. The FinFET device structure 100c of FIG. 4A is similar to the FinFET device structure 100a of FIG. 2P, except the liner layer 158 is removed from the top surface of the CESL 126, the top surface of the S/D contact structure 156, and the top surface of the first ILD layer 128 of FinFET device structure 100c. Therefore, the top surface of the CESL 126, the top surface of the S/D contact structure 156, and the top surface of the first ILD layer 128 are exposed after processing associated with FIG. 2P. Further, as shown in FIG. 4B, the gate contact structure 170 is formed through the third ILD layer 164, the etch stop layer 162, the filling layer 160, and the liner layer 158, in accordance with some embodiments of the disclosure. The etch stop layer 162 is in direct contact with the filling layer 160, the CESL 126, and the first ILD layer 128 of FinFET device structure 100c. Materials and methods used to form the FinFET device structure 100c are similar to, or the same as, those used to form the FinFET device structure 100a and are not repeated herein.

Figure 5:
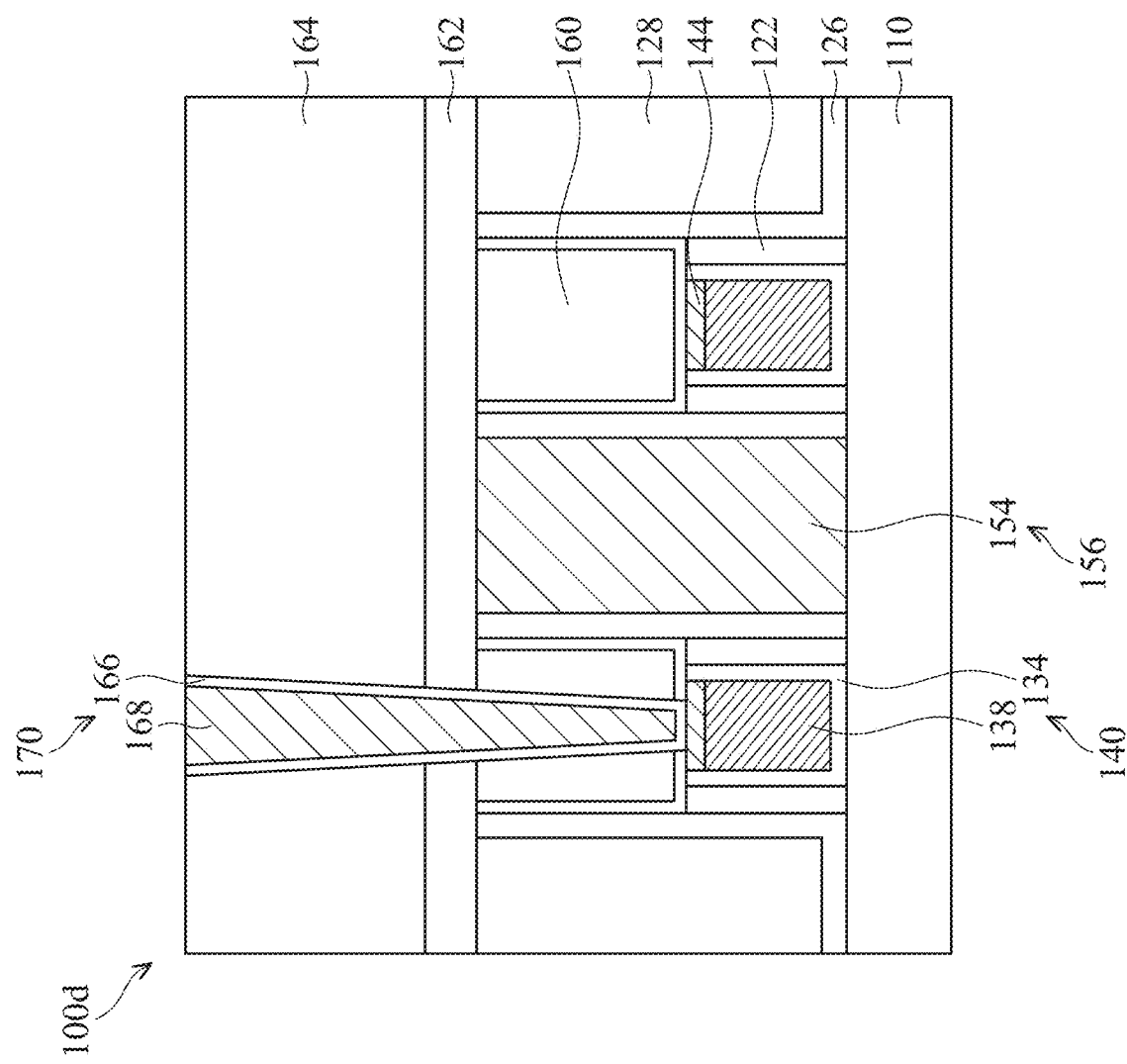
FIG. 5 shows a cross-sectional representation of a FinFET device structure in accordance with some embodiments of the disclosure.

FIG. 5 shows a cross-sectional representation of a FinFET device structure 100d, in accordance with some embodiments of the disclosure. The FinFET device structure 100d of FIG. 5 is similar to the FinFET device structure 100c of FIG. 4B, except the S/D contact structure 156 does not include glue layer 152 in FinFET device structure 100d. Materials and methods used to form the FinFET device structure 100b are similar to, or the same as, those used to form the FinFET device structure 100c and are not repeated herein. It is noted that processing associated with forming glue layer 152 may not be performed to form FinFET device structure 100d.

Figure 6:
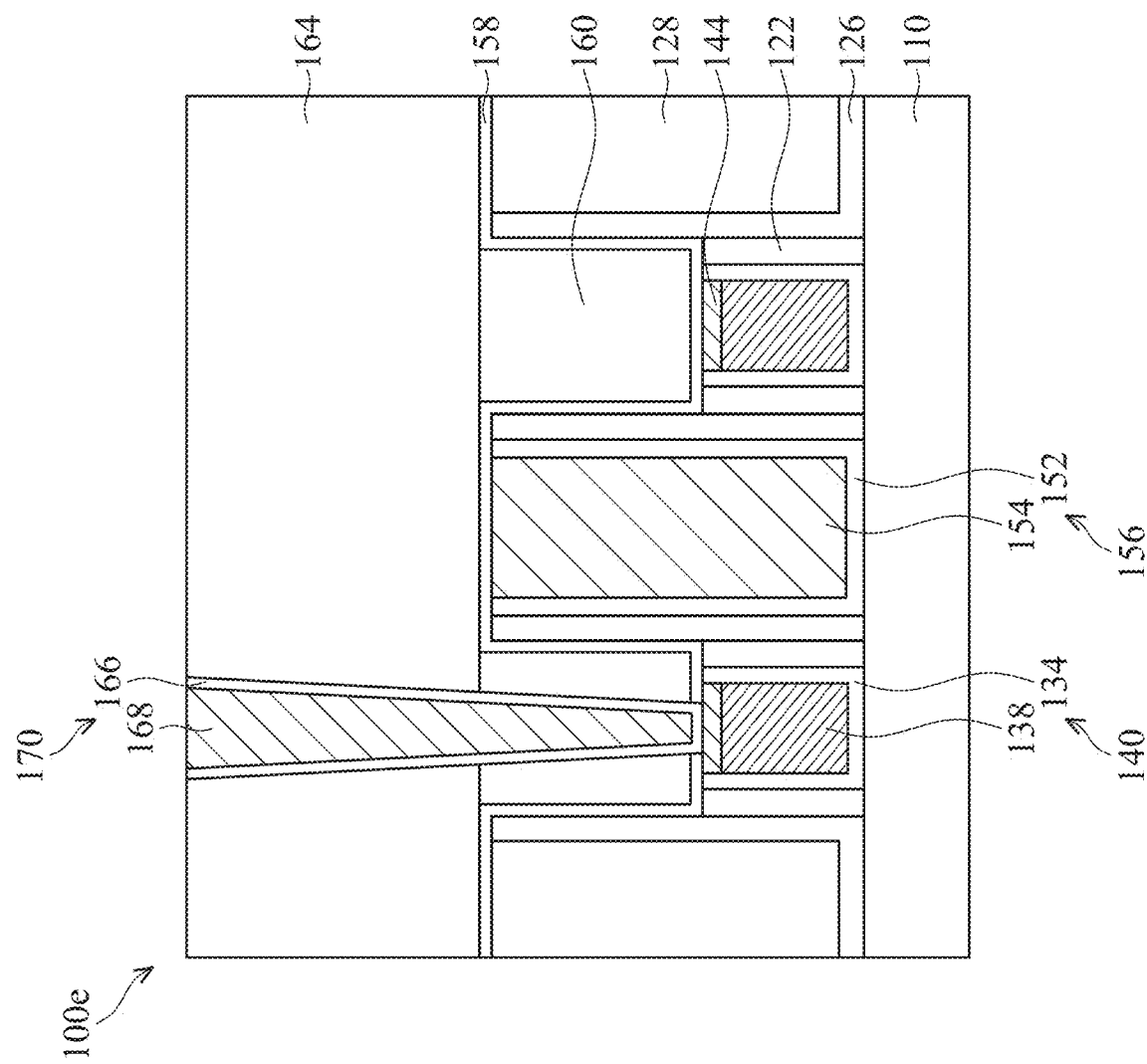
FIG. 6 shows a cross-sectional representation of a FinFET device structure in accordance with some embodiments of the disclosure.

FIG. 6 shows a cross-sectional representation of a FinFET device structure 100e, in accordance with some embodiments of the disclosure. The FinFET device structure 100e of FIG. 6 is similar to the FinFET device structure 100a of FIG. 2S, except FinFET device structure 100e does not include the etch stop layer 162. Accordingly, the filling layer 160 and the liner layer 158 are in direct contact with the third ILD layer 164. Materials and methods used to form the FinFET device structure 100e are similar to, or the same as, those used to form the FinFET device structure 100a and are not repeated herein.

Figure 7:
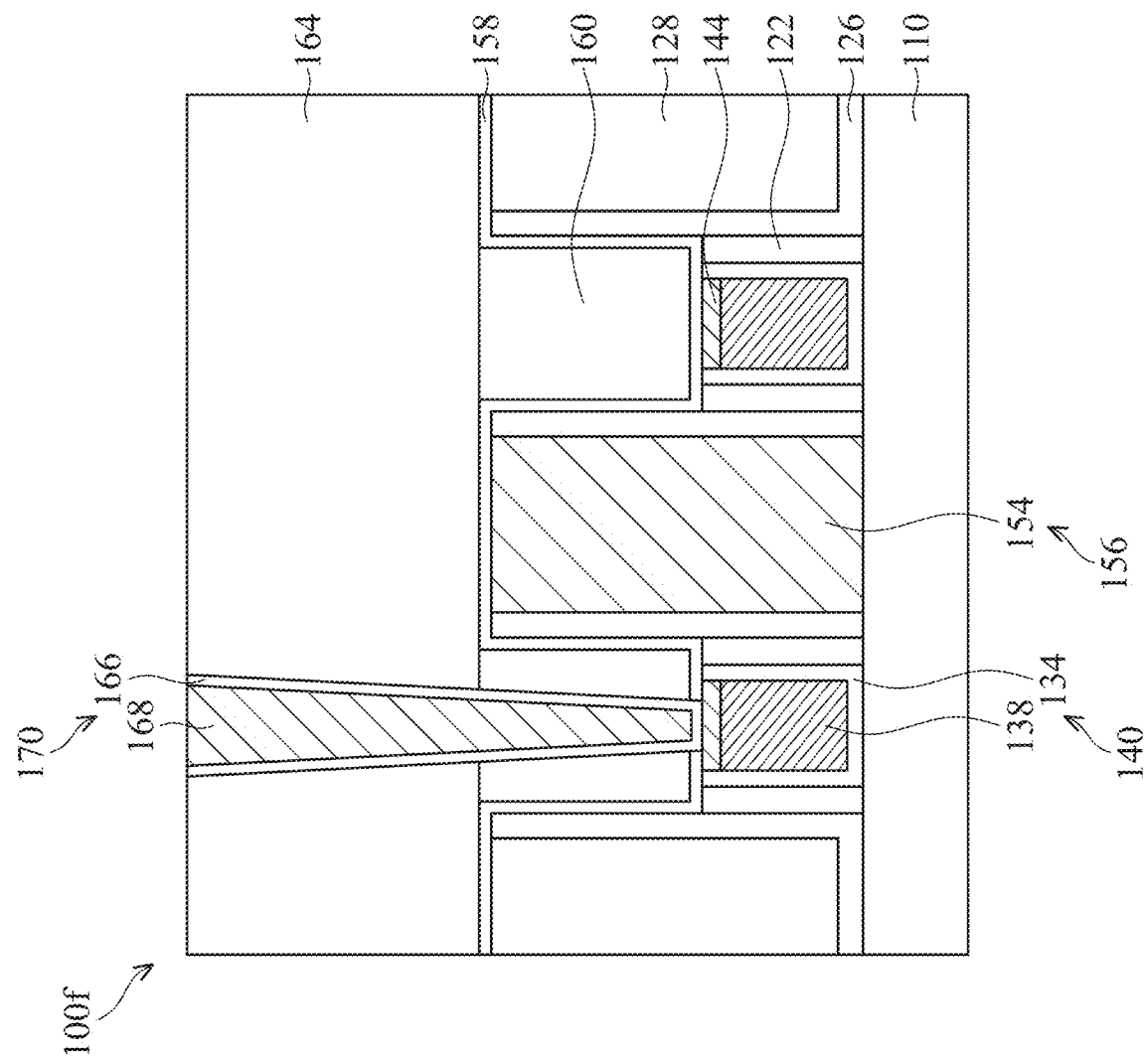
FIG. 7 shows a cross-sectional representation of a FinFET device structure in accordance with some embodiments of the disclosure.

FIG. 7 shows a cross-sectional representation of a FinFET device structure 100f, in accordance with some embodiments of the disclosure. The FinFET device structure 100f of FIG. 7 is similar to the FinFET device structure 100b of FIG. 3, except the except FinFET device structure 100f does not include the etch stop layer 162. Accordingly, the filling layer 160 and the liner layer 158 are in direct contact with the third ILD layer 164. Materials and methods used to form the FinFET device structure 100f are similar to, or the same as, those used to form the FinFET device structure 100b and are not repeated herein.

Figure 8:
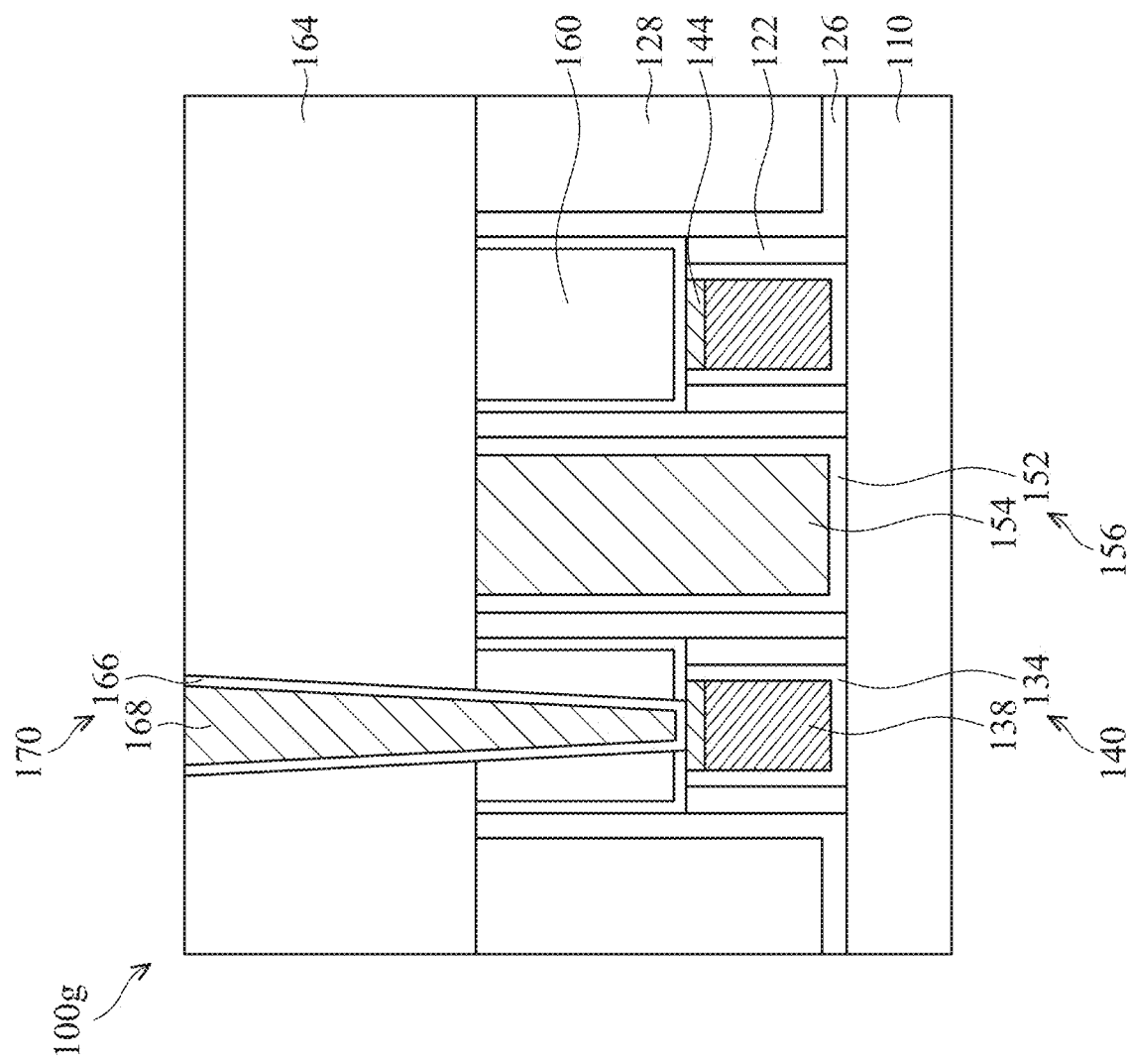
FIG. 8 shows a cross-sectional representation of a FinFET device structure in accordance with some embodiments of the disclosure.

FIG. 8 shows a cross-sectional representation of a FinFET device structure 100g, in accordance with some embodiments of the disclosure. The FinFET device structure 100g of FIG. 8 is similar to the FinFET device structure 100c of FIG. 4B, except the FinFET device structure 100g does not include the etch stop layer 162. Accordingly, the filling layer 160, the liner layer 158, the CESL 126, and the first ILD layer 128 are in direct contact with the third ILD layer 164. Materials and methods used to form the FinFET device structure 100g are similar to, or the same as, those used to form FinFET device structure 100c and are not repeated herein.

Figure 9:
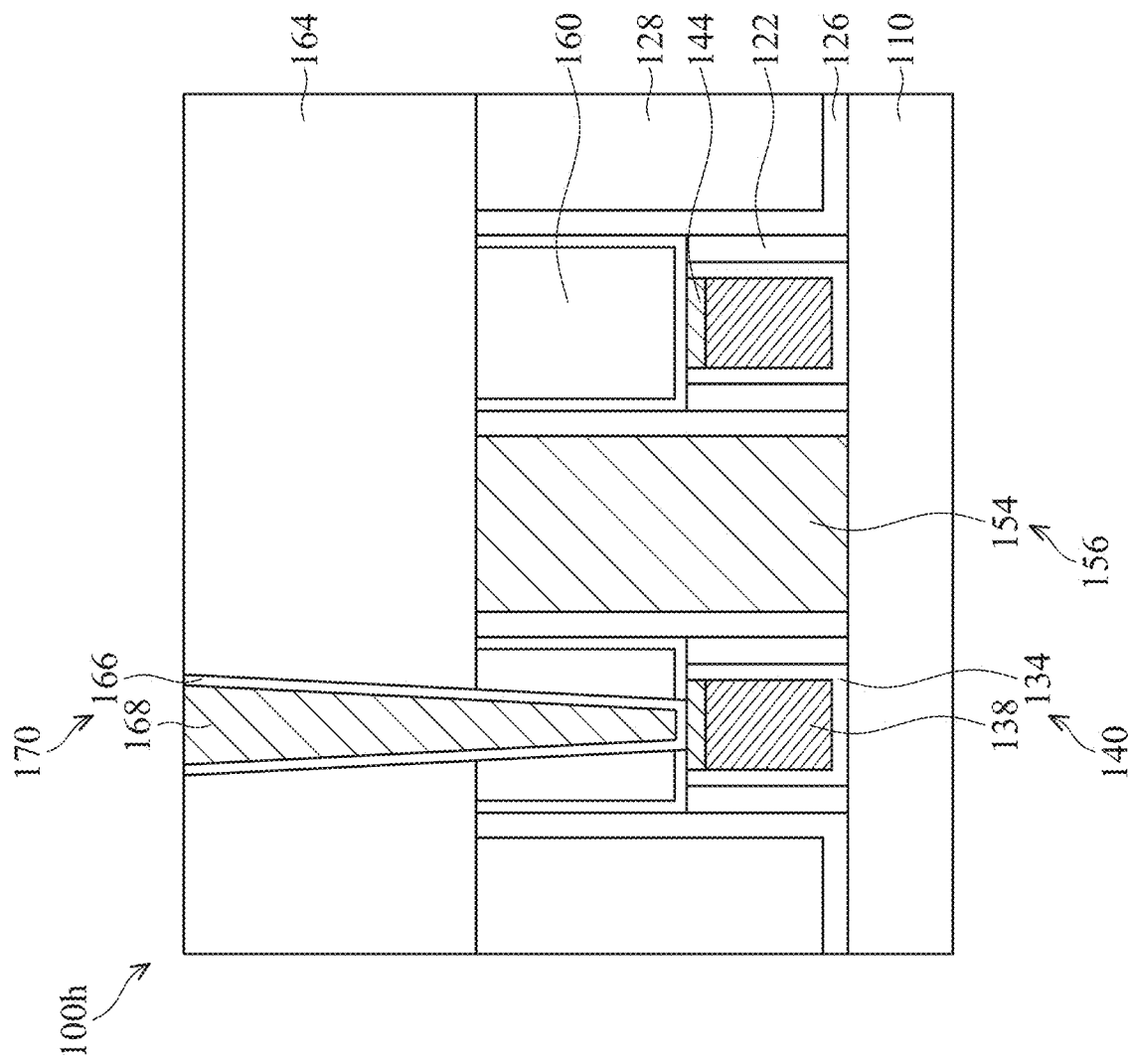
FIG. 9 shows a cross-sectional representation of a FinFET device structure in accordance with some embodiments of the disclosure.

FIG. 9 shows a cross-sectional representation of a FinFET device structure 100h, in accordance with some embodiments of the disclosure. The FinFET device structure 100h of FIG. 9 is similar to the FinFET device structure 100d of FIG. 5, except FinFET device structure 100h does not include the etch stop layer 162. Accordingly, the filling layer 160, the liner layer 158, the CESL 126, and the first ILD layer 128 are in direct contact with the third ILD layer 164. Materials and methods used to form the FinFET device structure 100h are similar to, or the same as, those used to form the FinFET device structure 100d and are not repeated herein.

Figure 10A:
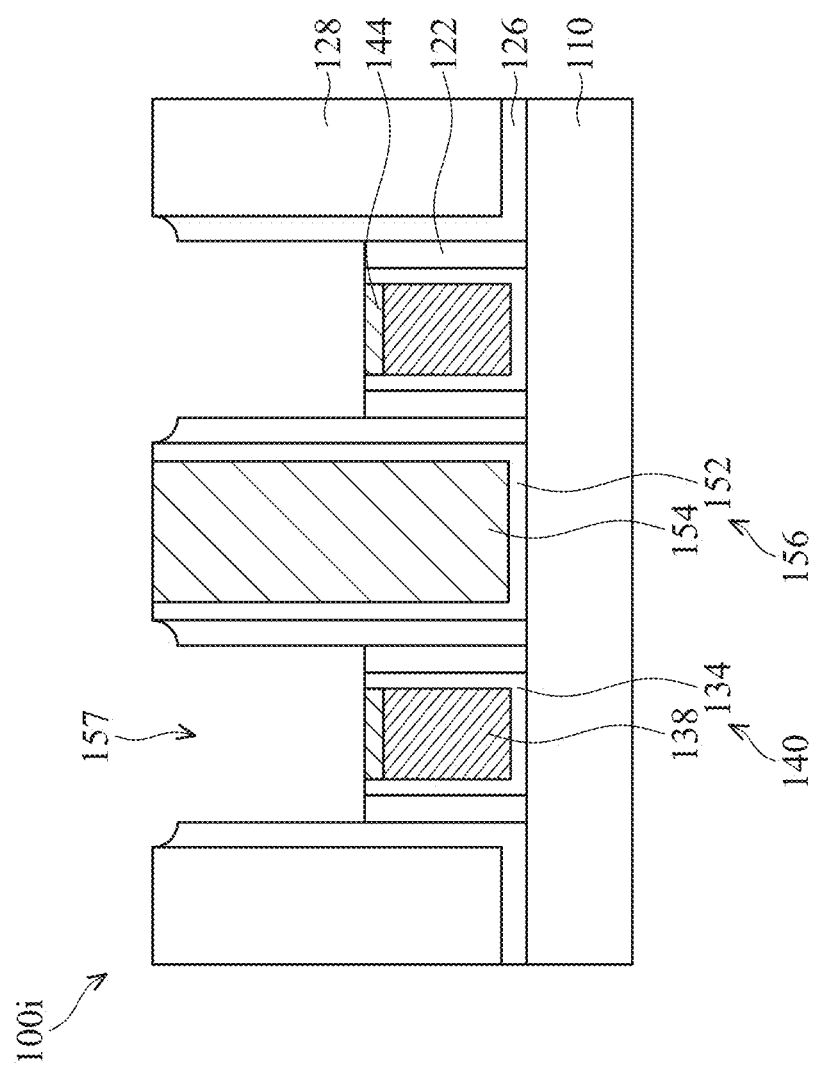
FIG. 10A-10B show cross-sectional representations of a FinFET device structure in accordance with some embodiments of the disclosure.
Figure 10B:
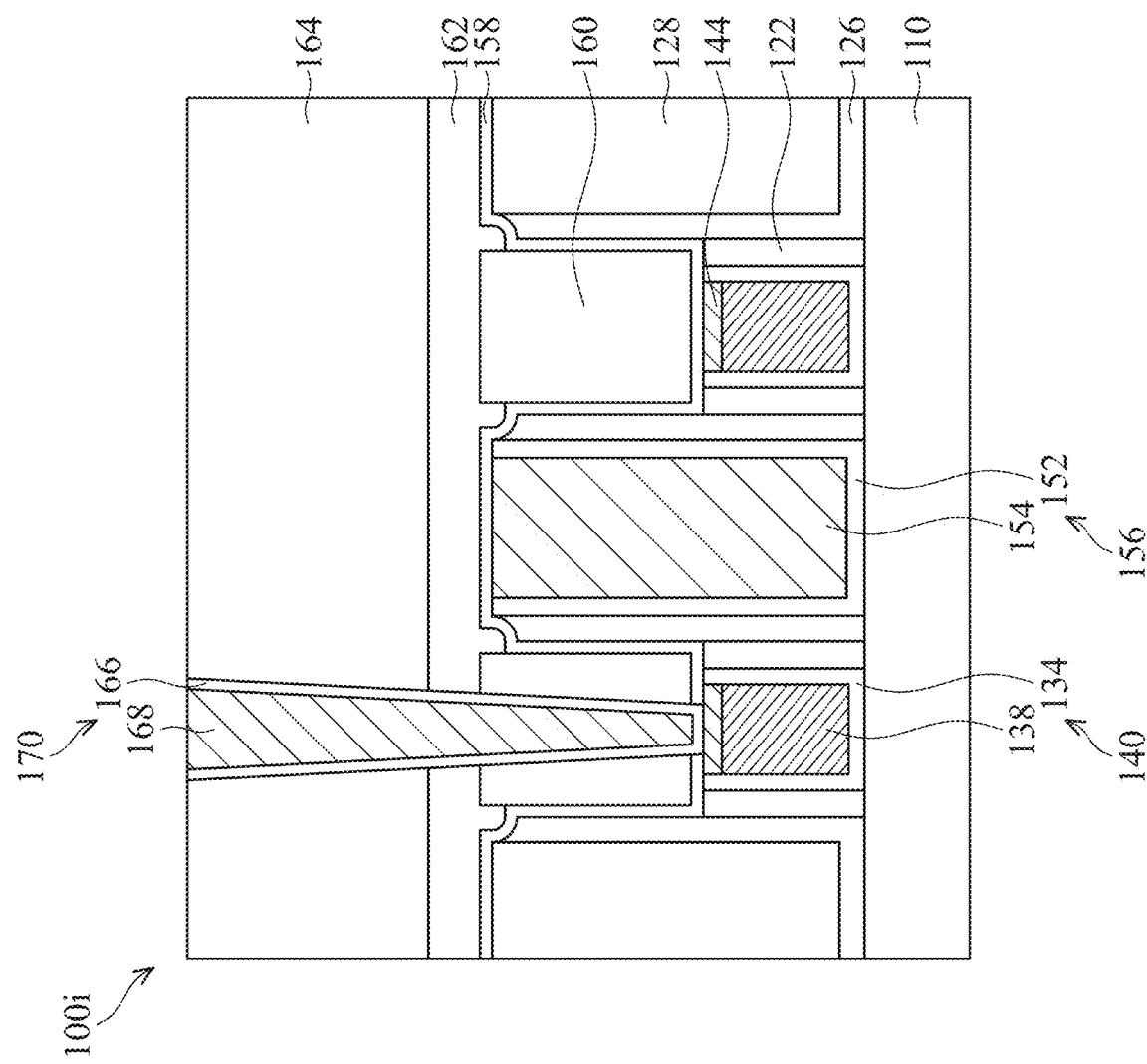

FIG. 10A and FIG. 10B show cross-sectional representations of a FinFET device structure 100i, in accordance with some embodiments of the disclosure. The FinFET device structure 100i of FIG. 10A is similar to the FinFET device structure 100a of FIG. 2M, except a portion of the CESL 126 of FinFET device structure 100i is removed when the hard mask layer 146 is removed. Therefore, the CESL 126 has recessed top surfaces. The top surfaces, or portions thereof, of the CESL 126 are thus lower than the top surface of the first ILD layer 128. In addition, the top surfaces of the CESL 126, or portions thereof, are lower than the top surface of S/D contact structure 156. Materials and methods used to form the FinFET device structure 100*i* are similar to, or the same as, those used to form the FinFET device structure 100*a* and are not repeated herein.

As shown in FIG. 10B, the gate contact structure 170 is formed through the third ILD layer 164, the etch stop layer 162, the filling layer 160, and the liner layer 158, in accordance with some embodiments of the disclosure. The liner layer 158 is formed on the recessed top surfaces of the CESL 126, and portions of etch stop layer 162 (or third ILD layer 164, where etch stop layer 162 is not formed) extend below the top surface of the first ILD layer 128 and/or the top surface of the filling layer 160.

Figure 11:
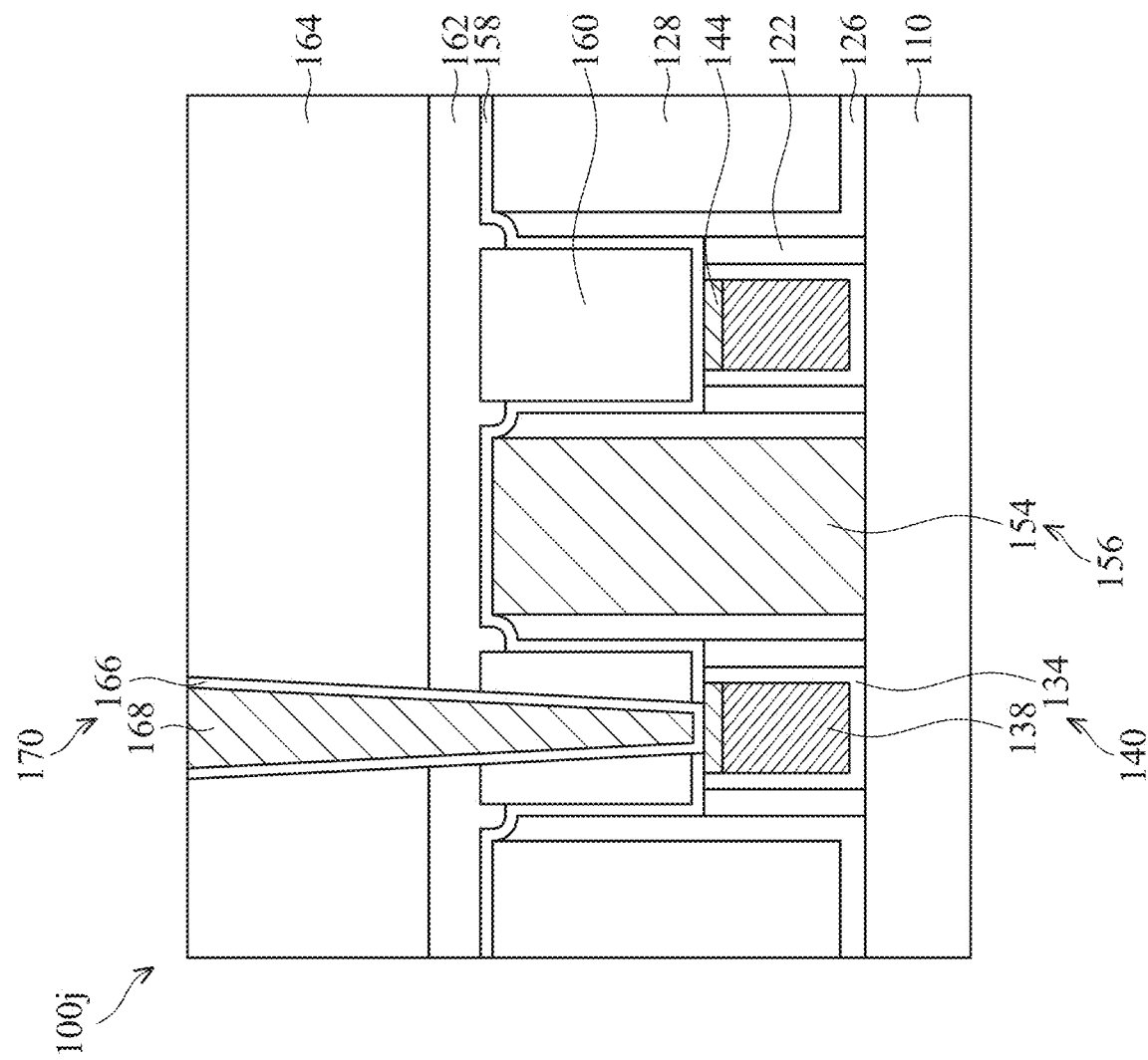
FIG. 11 shows a cross-sectional representation of a FinFET device structure in accordance with some embodiments of the disclosure.

FIG. 11 shows a cross-sectional representation of a FinFET device structure 100*j*, in accordance with some embodiments of the disclosure. The FinFET device structure 100*j* of FIG. 11 is similar to the FinFET device structure 100*i* of FIG. 10B, except the S/D contact structure 156 does not include glue layer 152 in FinFET device structure 100*j*. Materials and methods used to form the FinFET device structure 100*j* are similar to, or the same as, those used to form the FinFET device structure 100*i* and are not repeated herein.

Figure 12:
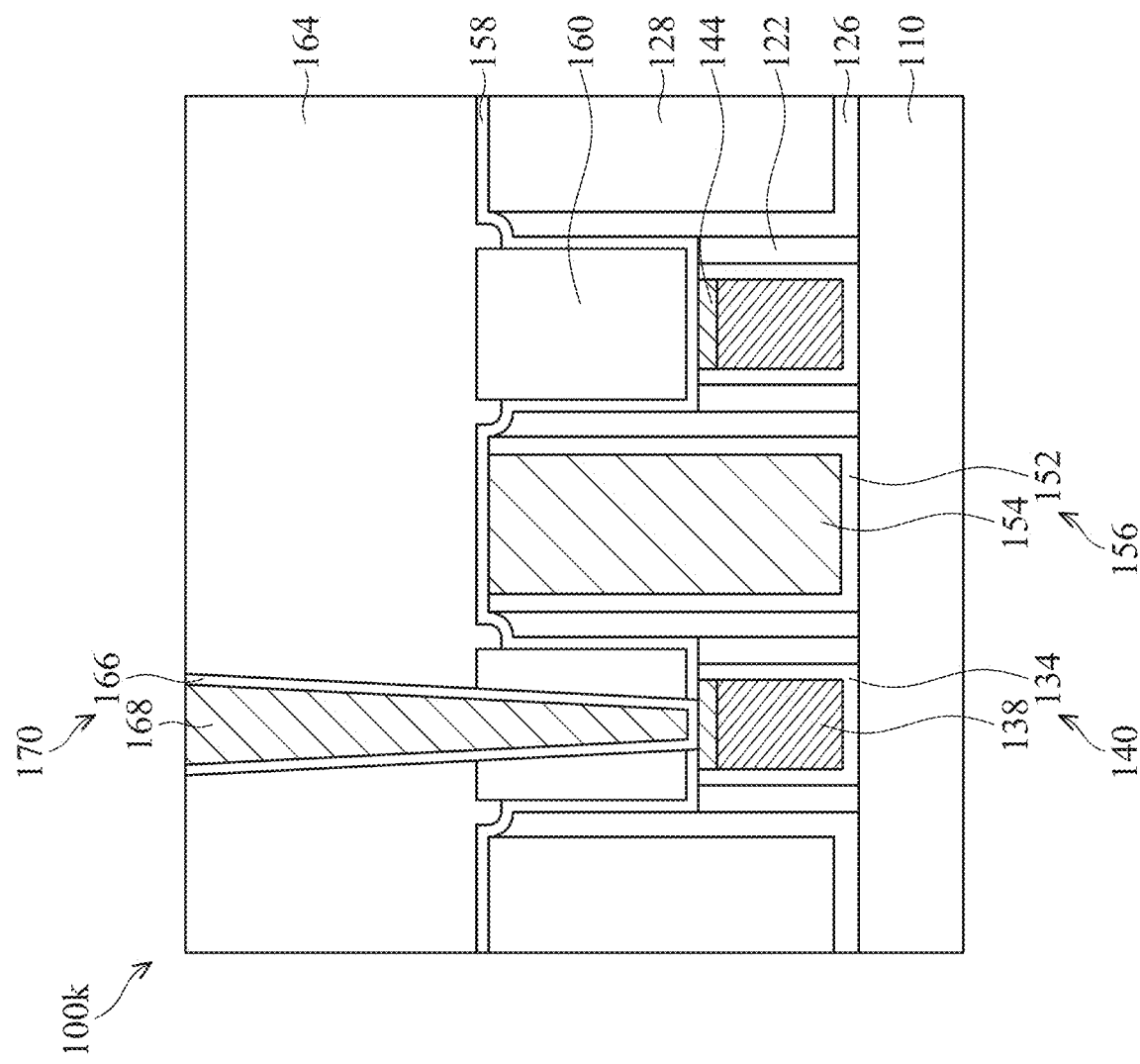
FIG. 12 shows a cross-sectional representation of a FinFET device structure in accordance with some embodiments of the disclosure.

FIG. 12 shows a cross-sectional representation of a FinFET device structure 100*k*, in accordance with some embodiments of the disclosure. The FinFET device structure 100*k* of FIG. 12 is similar to the FinFET device structure 100*i* of FIG. 10B, except FinFET device structure 100*k* does not include the etch stop layer 162. Accordingly, the filling layer 160 and the liner layer 158 are in direct contact with the third ILD layer 164. Materials and methods used to form the FinFET device structure 100*k* are similar to, or the same as, those used to form the FinFET device structure 100*i* and are not repeated herein.

Figure 13:
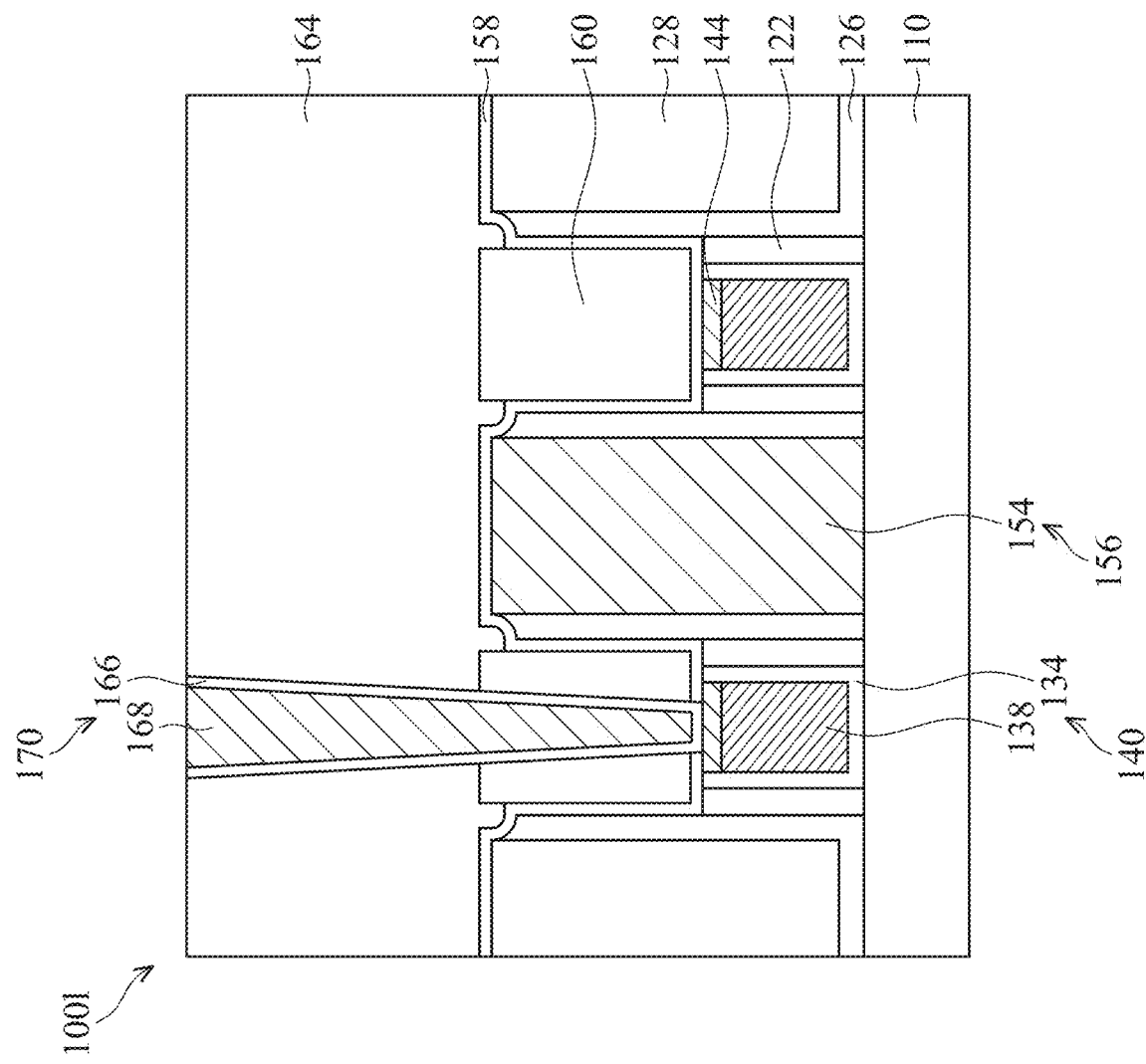
FIG. 13 shows a cross-sectional representation of a FinFET device structure in accordance with some embodiments of the disclosure.

FIG. 13 shows a cross-sectional representation of a FinFET device structure 100*l*, in accordance with some embodiments of the disclosure. The FinFET device structure 100*l* of FIG. 13 is similar to the FinFET device structure 100*j* of FIG. 11, except FinFET device structure 100*l* does not include the etch stop layer 162. Accordingly, the filling layer 160 and the liner layer 158 are in direct contact with the third ILD layer 164. Materials and methods used to form the FinFET device structure 100*l* are similar to, or the same as, those used to form the FinFET device structure 100*j* and are not repeated herein.

Figure 14A:
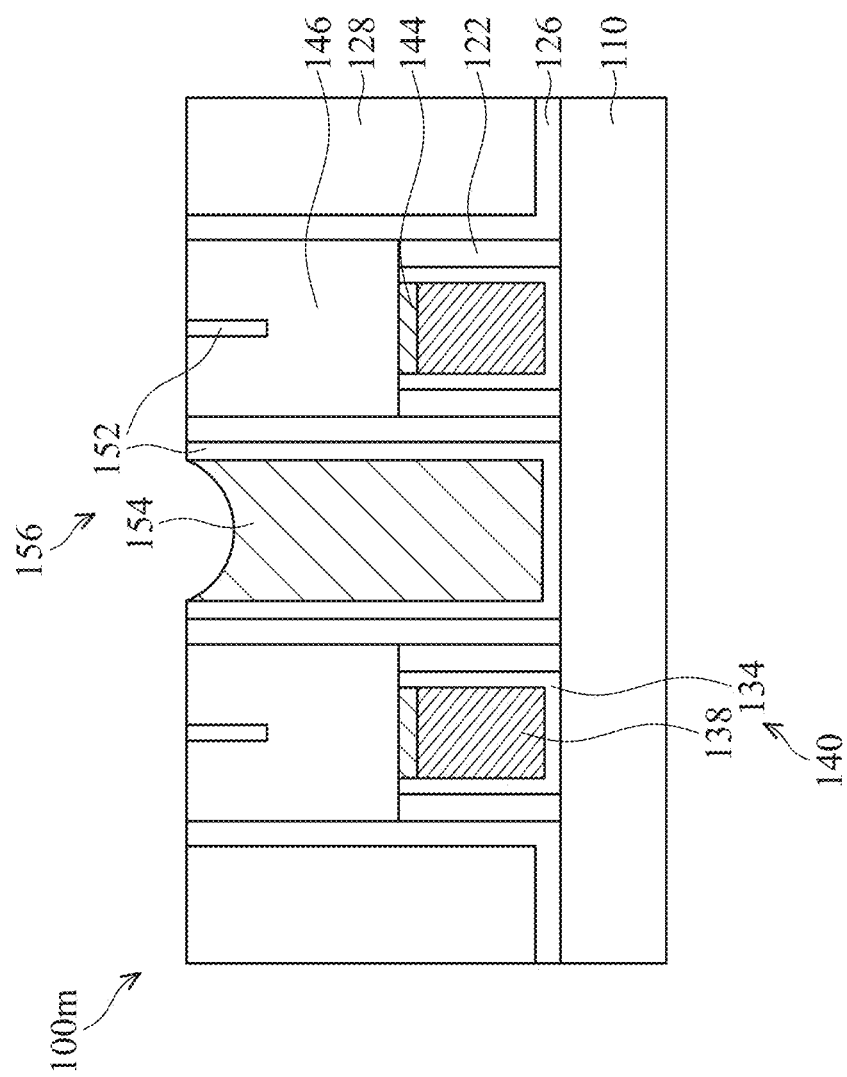
FIG. 14A-14B show cross-sectional representations of a FinFET device structure in accordance with some embodiments of the disclosure.
Figure 14B:
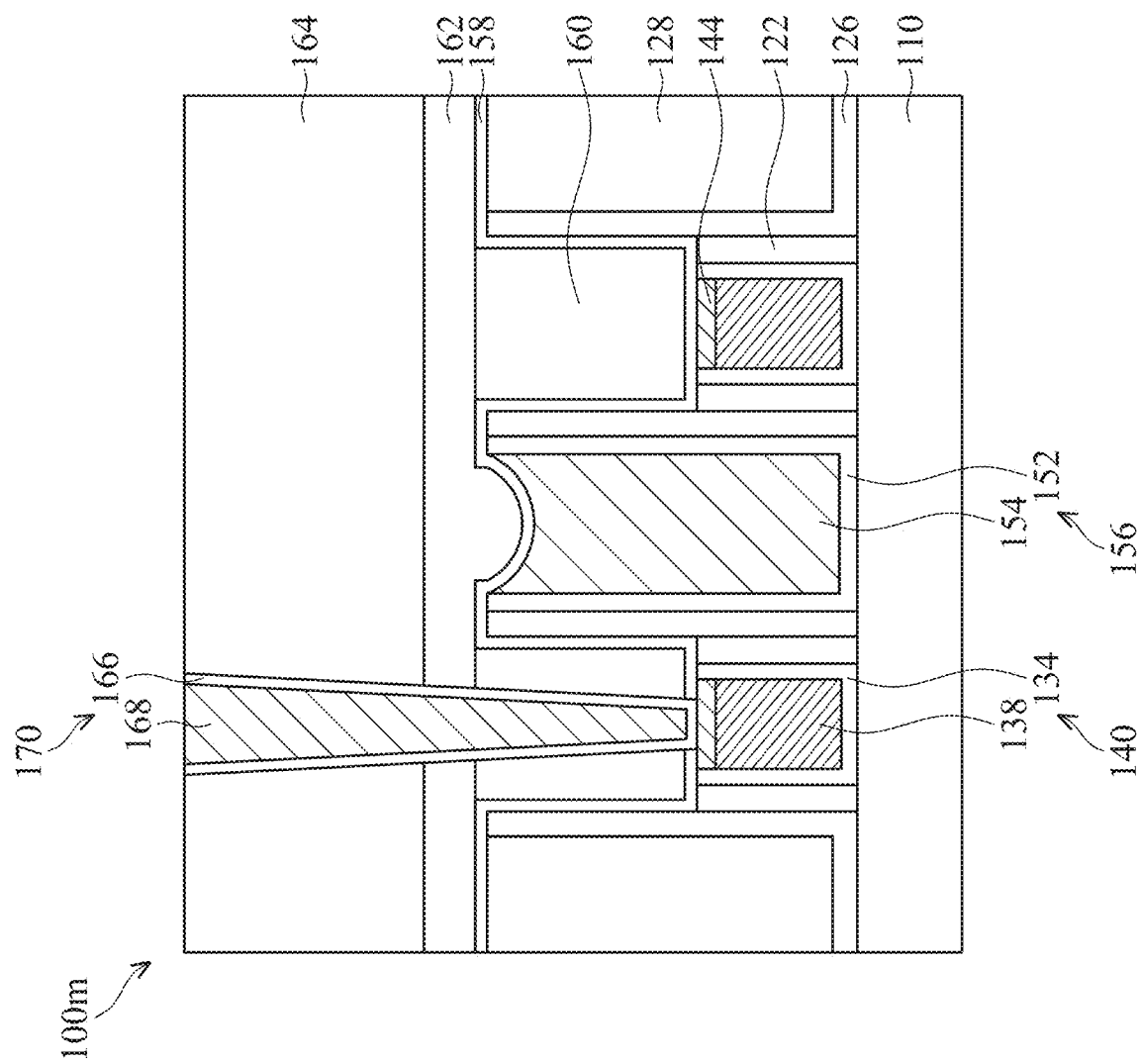

FIG. 14A and FIG. 14B show cross-sectional representations of a FinFET device structure 100*m*, in accordance with some embodiments of the disclosure. The FinFET device structure 100*m* of FIG. 14A is similar to the FinFET device structure 100*a* of FIG. 2L, except a top portion of the conductive layer 154 of the S/D contact structure 156 is removed during processing, providing a recessed top surface of the conductive layer 154 of the S/D contact structure 156. Materials and methods used to form the FinFET device structure 100*m* are similar to, or the same as, those used to form the FinFET device structure 100*a* and are not repeated herein.

As shown in FIG. 14B, the liner layer 158 is formed on the recessed top surface of the S/D contact structure 156. The gate contact structure 170 is formed through the third ILD layer 164, the etch stop layer 162, the filling layer 160, and the liner layer 158, in accordance with some embodiments of the disclosure. The top surface of the conductive layer 154 of the S/D contact structure 156 is lower than the top surface of the first ILD layer 128 and the top surface of the CESL 126. The liner layer 158 is formed on the recessed top surface of the conductive layer 154 of the S/D contact structure 156.

Figure 15:
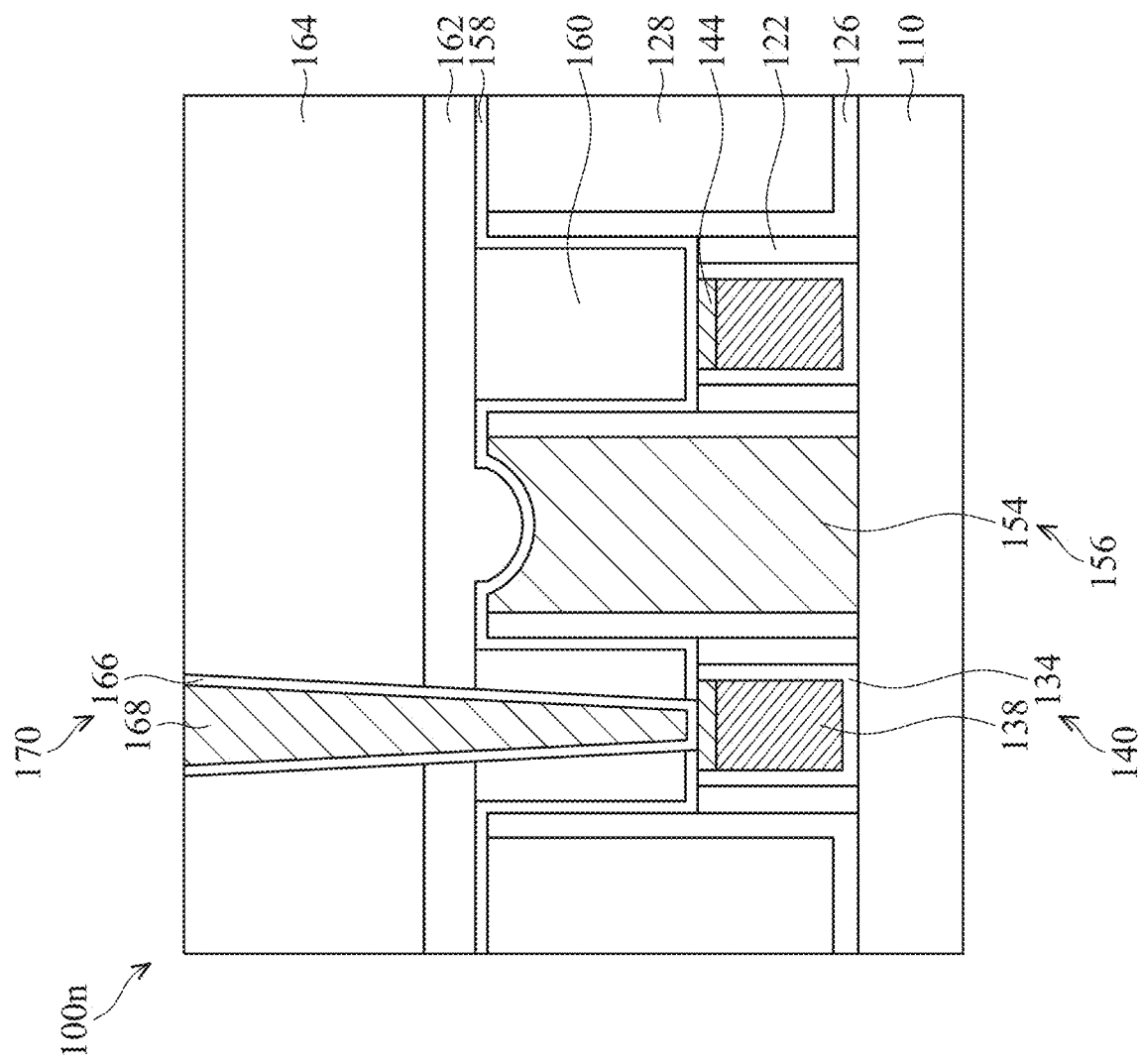
FIG. 15 shows a cross-sectional representation of a FinFET device structure in accordance with some embodiments of the disclosure.

FIG. 15 shows a cross-sectional representation of a FinFET device structure 100*n*, in accordance with some embodiments of the disclosure. The FinFET device structure 100*n* of FIG. 15 is similar to the FinFET device structure 100*m* of FIG. 14B, except the S/D contact structure 156 does not include glue layer 152 in FinFET device structure 100*n*. Materials and methods used to form the FinFET device structure 100*n* is similar to, or the same as, those used to form the FinFET device structure 100*m* and are not repeated herein.

Figure 16:
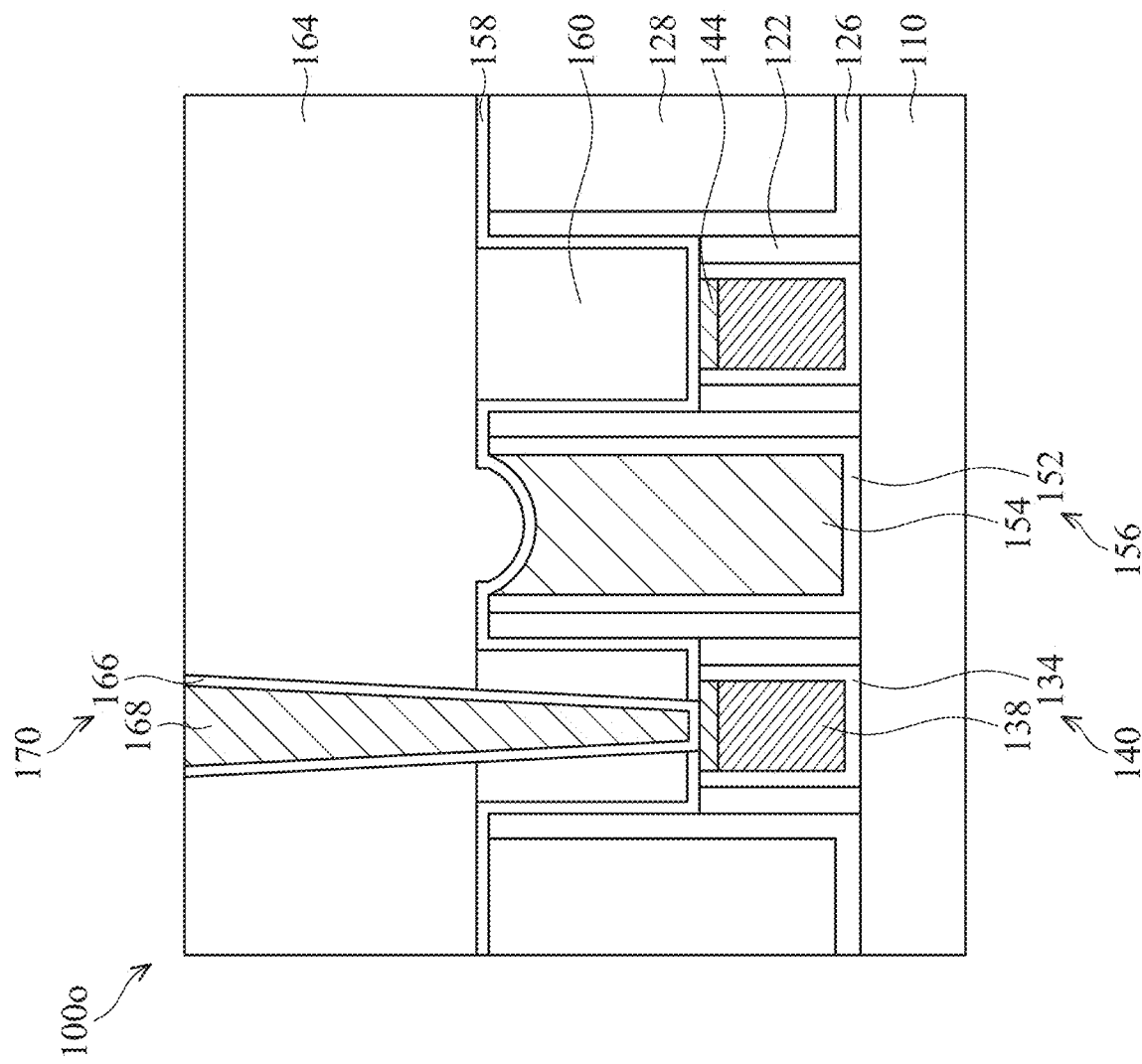
FIG. 16 shows a cross-sectional representation of a FinFET device structure in accordance with some embodiments of the disclosure.

FIG. 16 shows a cross-sectional representation of a FinFET device structure 100*o*, in accordance with some embodiments of the disclosure. The FinFET device structure 100*o* of FIG. 16 is similar to the FinFET device structure 100*m* of FIG. 14B, except FinFET device structure 100*o* does not include the etch stop layer 162. Accordingly, the filling layer 160 and the liner layer 158 are in direct contact with the third ILD layer 164. Materials and methods used to form the FinFET device structure 100*o* is similar to, or the same as, those used to form the FinFET device structure 100*m* and are not repeated herein.

Figure 17:
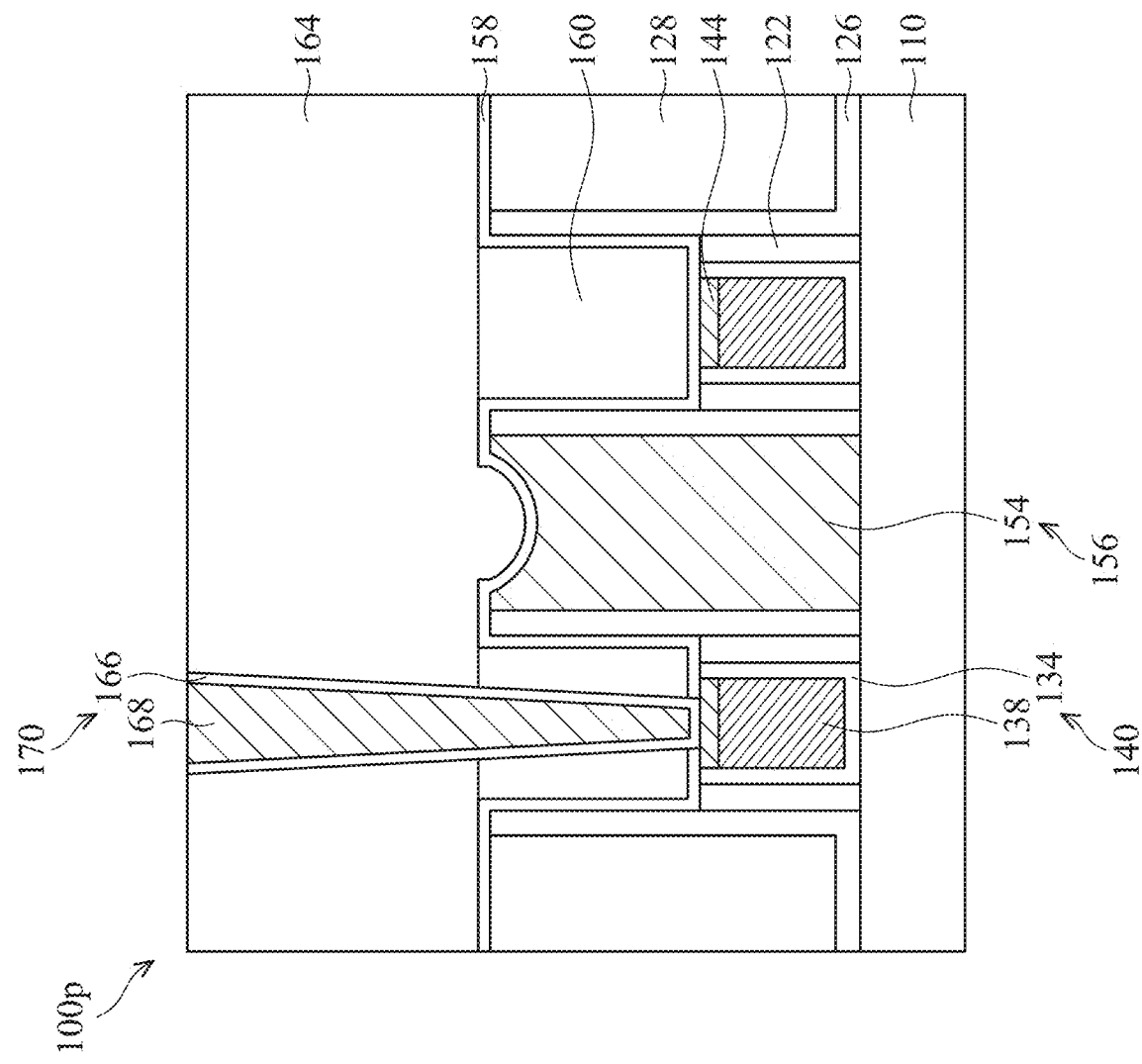
FIG. 17 shows a cross-sectional representation of a FinFET device structure in accordance with some embodiments of the disclosure.

FIG. 17 shows a cross-sectional representation of a FinFET device structure 100*p*, in accordance with some embodiments of the disclosure. The FinFET device structure 100*p* of FIG. 17 is similar to the FinFET device structure 100*n* of FIG. 15, except FinFET device structure 100*p* does not include the etch stop layer 162. Accordingly, the filling layer 160 and the liner layer 158 are in direct contact with the third ILD layer 164. Materials and methods used to form the FinFET device structure 100*p* is similar to, or the same as, those used to form the FinFET device structure 100*n* and are not repeated herein.

Figure 18A:
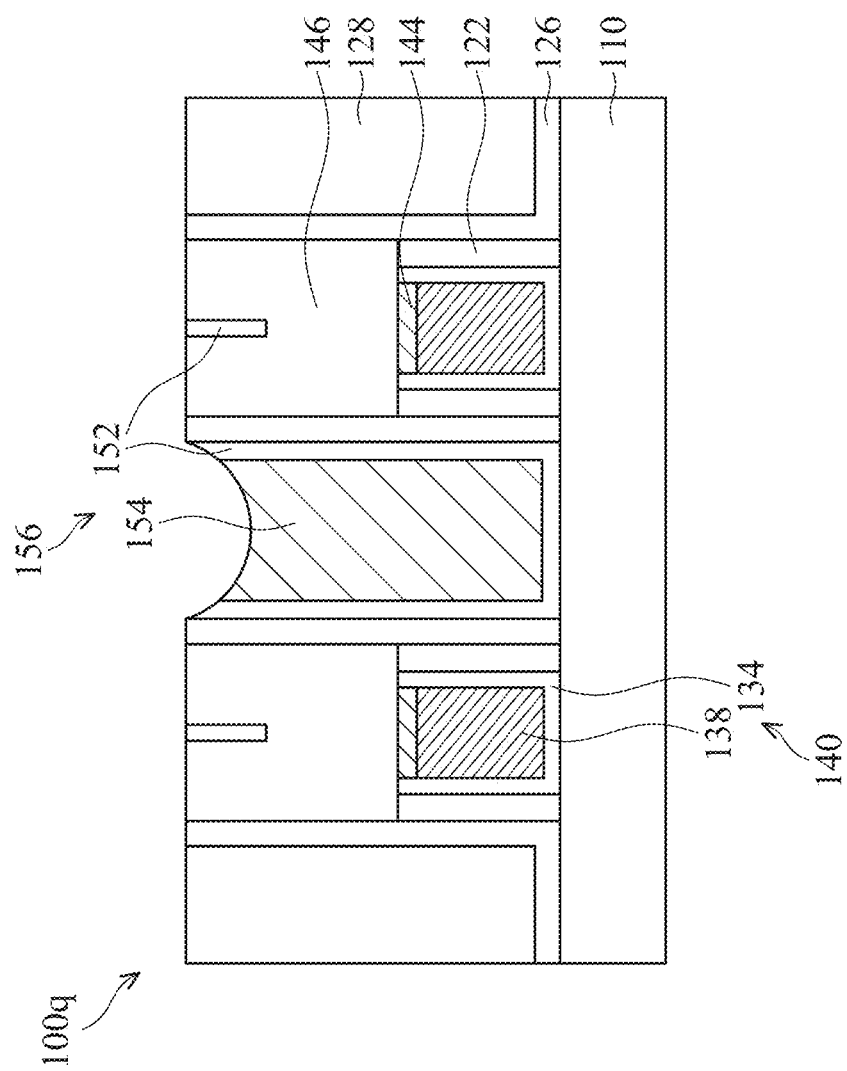
FIG. 18A-18B show cross-sectional representations of a FinFET device structure in accordance with some embodiments of the disclosure.
Figure 18B:
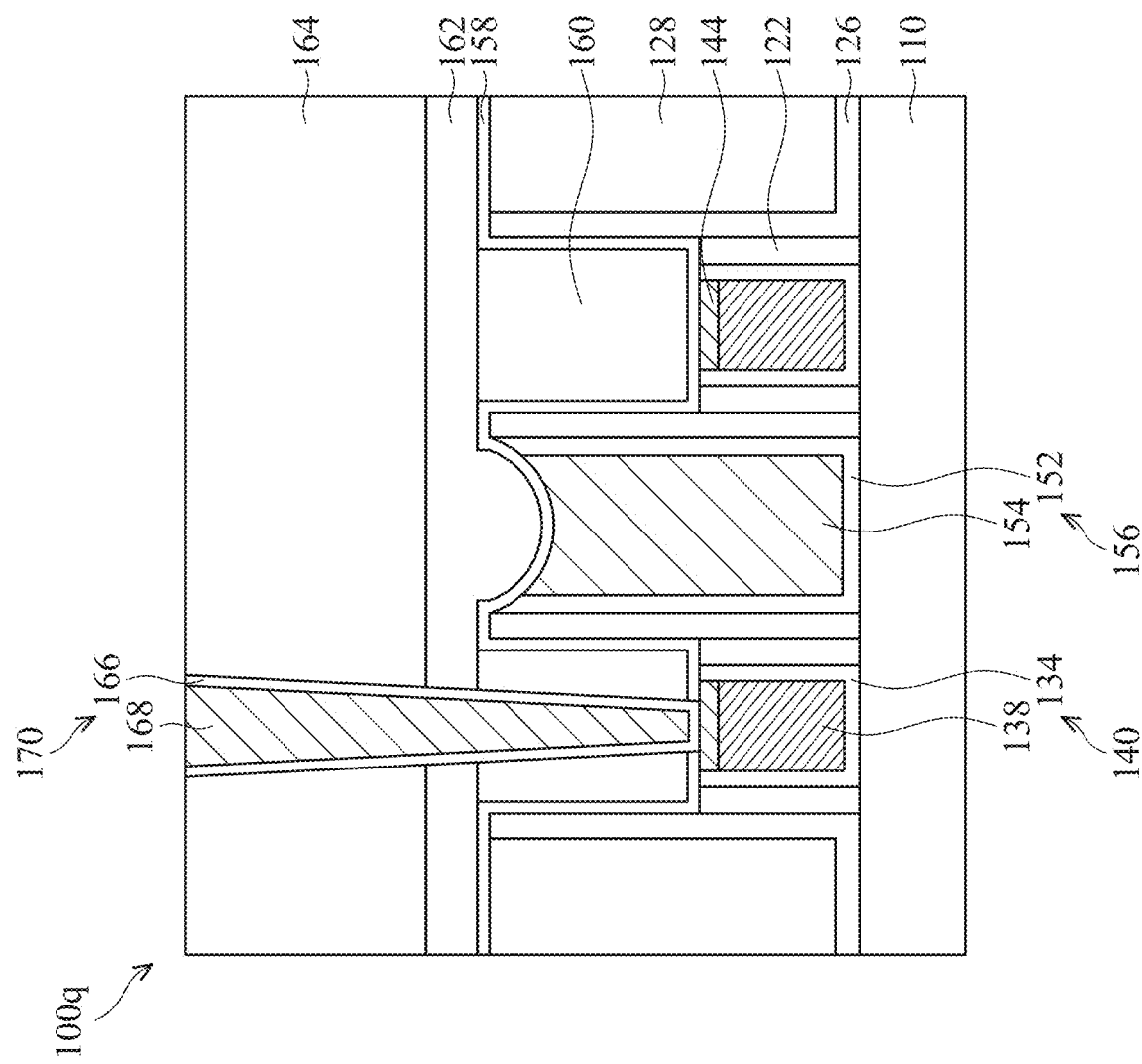

FIG. 18A and FIG. 18B show cross-sectional representations of a FinFET device structure 100*q*, in accordance with some embodiments of the disclosure. The FinFET device structure 100*q* of FIG. 18A is similar to the FinFET device structure 100*a* of FIG. 2L, except the top portion of the conductive layer 154 and the top portion of the glue layer 152 of the S/D contact structure 156 are removed, thereby providing the conductive layer 154 and the glue layer 152 with recessed top surfaces, in accordance with some embodiments of the disclosure. Materials and methods used to form the FinFET device structure 100*q* are similar to, or the same as, those used to form the FinFET device structure 100*a* and are not repeated herein.

As shown in FIG. 18B, the liner layer 158 is formed on the recessed top surface of the S/D contact structure 156. The gate contact structure 170 is formed through the third ILD layer 164, the etch stop layer 162, the filling layer 160, and the liner layer 158, in accordance with some embodiments of the disclosure. The top surface of the S/D contact structure 156 is lower than the top surface of the first ILD layer 128. More specifically, the top surface of the glue layer 152 and the top surface of the conductive layer 154 are lower than the top surface of the first ILD layer 128 and the top surface of the CESL 126. The liner layer 158 is formed on and conforms to the recessed top surface of the S/D contact structure 156.

Figure 19:
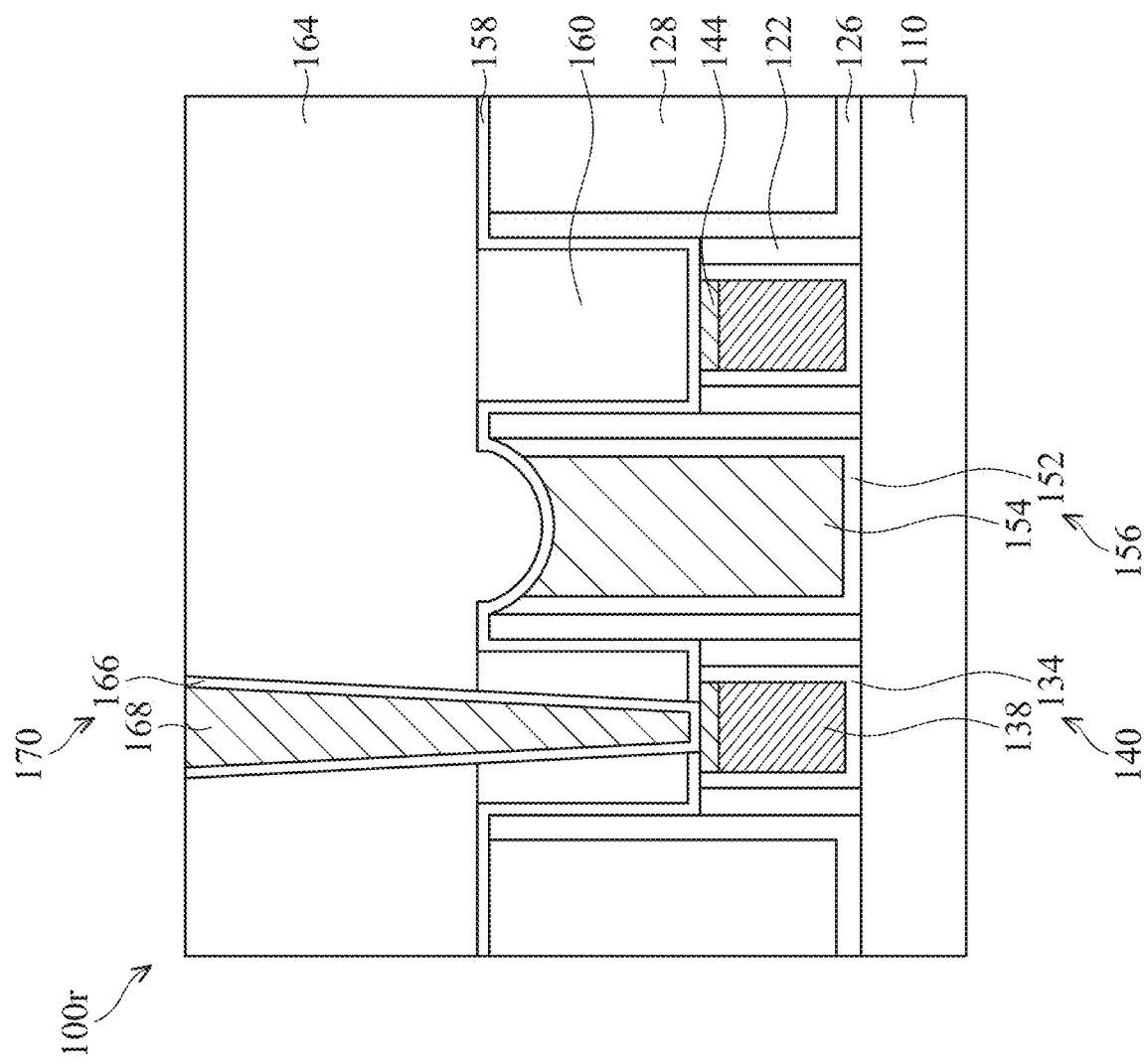
FIG. 19 shows a cross-sectional representation of a FinFET device structure in accordance with some embodiments of the disclosure.

FIG. 19 shows a cross-sectional representation of a FinFET device structure 100*r*, in accordance with some embodiments of the disclosure. The FinFET device structure 100*r* of FIG. 19 is similar to the FinFET device structure 100*q* of FIG. 18B, except FinFET device structure 100*r* does not include the etch stop layer 162. Accordingly, the filling layer 160 and the liner layer 158 are in direct contact with the third ILD layer 164. Materials and methods used to form the FinFET device structure 100*r* are similar to, or the same as, those used to form the FinFET device structure 100*q* and are not repeated herein.

FIGS. 2A-2S show the FinFET device structure 100*a*, and FIGS. 3, 4A, 4B, 5, 6, 7, 8, 9, 10A, 10B, 11, 12, 13, 14A, 14B, 15, 16, 17, 18A, 18B, and 19 show various FinFET device structures 100*b*, 100*c*, 100*d*, 100*e*, 100*f*, 100*g*, 100*h*, 100*i*, 100*j*, 100*k*, 100*l*, 100*m*, 100*n*, 100*o*, 100*p*, 100*q*, and 100*r*. The FinFET device structure of this disclosure provides a liner layer 158 and a filling layer 160 over the gate structure, and the material of the filling layer 160 is different from the hard mask layer 146. The hard mask layer 146 is firstly formed over the gate structure 140, and the hard mask layer 146 protects the gate structure 140 during the formation of the S/D structure 156. During the formation of the S/D contact structure 156, the glue layer 152 may be formed in the hard mask layer 146. Since the hard mask layer 146 and the embedded glue layer 152 are simultaneously removed, no glue layer is left over the gate structure 140. Therefore, the issue relating to difficulty of removing the glue layer 152 is resolved. In addition, the hard mask layer 146 is removed and replaced by the liner layer 158 and the filling layer 160 made of low-k materials. Therefore, the capacitance between the gate structure and the S/D contact structure is decreased.

Embodiments for forming a FinFET device structure and method for formation the same are provided. Embodiments herein can also be implemented for forming a gate-all-around (GAA) device structure. In such embodiments, fin structure 110 may include a stack of semiconductor layers having first semiconductor layers and second semiconductor layers stacked in an alternating fashion. In such embodiments, in FIG. 1H and/or FIG. 1I, before forming gate structures 140, a channel release process may be performed that selectively removes the first semiconductor layers or the second semiconductor layers, thereby forming suspended semiconductor layers over substrate 102. For example, where the first semiconductor layers are silicon germanium and the second semiconductor layers are silicon, the channel release process may selectively remove the silicon germanium layers, thereby leaving silicon layers suspended over substrate 102. In some embodiments, the suspended semiconductor layers provide channels of a GAA device structure, where the channels extend between source/drains (e.g., S/D structures 124). In such embodiments the suspended semiconductor layers can be referred to as channel layers and/or channel structures. In some embodiments, the suspended semiconductor layers are nanostructures, such as nanowires, nanosheets, nanobars, or other suitable nanostructure. In some embodiments, gate structures 140 wrap and/or surround the suspended semiconductor layers, such that the GAA device structure has a gate that can control one or more channels from more than one side.

To facilitate operation of a transistor, source/drain contacts are formed to source/drains and a gate contact is formed to a gate electrode of a gate structure disposed between the source/drains. An etch stop hard mask may be formed over the gate structure to protect the gate structure while forming the source/drain contacts. The gate structure can include gate spacers disposed along sidewalls of a gate stack, where the gate stack has a gate dielectric and a gate electrode disposed over the gate dielectric. Sometimes, metal material used to form the source/drain contacts undesirably fills one or more seams in the etch stop hard mask, which can lead to under etch issues while forming the gate contact (i.e., during via-to-metal gate (MG) etch). For example, the metal material may prevent adequate etching of the etch stop hard mask thereunder or the etch stop hard mask between the metal material and a dielectric layer. Further, sometimes, to provide adequate etch selectivity, the etch stop hard mask includes a high capacitance material, such as a high-k dielectric material, which can increase capacitive coupling (and thus capacitance) between the source/drain contact and the gate structure and/or the gate contact.

The present disclosure provides a source/drain contact formation method and/or a gate contact formation method for overcoming such challenges by utilizing a disposable etch stop hard mask during source/drain contact formation and replacing the disposable etch stop hard mask with low capacitance materials after source/drain contact formation but before gate contact formation. In some embodiments, fabrication can begin with receiving a device precursor having a substrate, a gate structure disposed between source/drains (all of which are disposed over the substrate and where the gate structure has gate spacers disposed along sidewalls of a gate stack, which includes a hard mask disposed over a metal gate stack (MG) (i.e., a gate dielectric and a gate electrode)), an etch stop hard mask disposed over the gate structure, and a first dielectric layer disposed over the source/drains. The etch stop hard mask includes a bulk dielectric, and the first dielectric layer can include an interlayer dielectric layer (ILD) and a contact etch stop layer (CESL). The etch stop hard mask includes a dielectric material that can provide adequate etching selectivity during subsequent etching processes, such as a high-k dielectric material, which may exhibit high capacitance. A seam may form in the etch stop hard mask. The first dielectric layer extends along sidewalls of the gate structure and sidewalls of the etch stop hard mask. In some embodiments, a thickness of the first dielectric layer is about the same as a sum of a height of the gate structure and a height of the etch stop hard mask. Fabrication can proceed with depositing a second dielectric layer over the etch stop hard mask and performing a patterning process to form a source/drain contact opening that extends through the second dielectric layer and the first dielectric layer to expose at least one of the source/drains. The source/drain contact opening further exposes, entirely or partially, the etch stop hard mask. Fabrication can proceed with forming a source/drain contact to the at least one of the source/drains, which can include depositing a contact liner that partially fills the source/drain contact opening, depositing a bulk contact layer over the contact liner that fills a remainder of the source/drain contact opening, and performing a planarization process that removes excess contact liner, excess bulk contact layer, and the second dielectric layer, thereby exposing the etch stop hard mask and the first dielectric layer. The contact liner may fill the seam in the etch stop hard mask and remain therein after the planarization process.

Fabrication can proceed with removing the etch stop hard mask (including any contact liner remnant disposed therein), thereby forming an opening that exposes the gate structure. A hard mask is then formed in the opening, for example, by depositing a dielectric liner over the first dielectric layer, the source/drain contact, and the gate structure, where the dielectric liner partially fills the opening, depositing a bulk dielectric layer over the dielectric liner that fills a remainder of the opening, and performing a planarization process that removes excess bulk dielectric layer, thereby exposing the dielectric liner. In some embodiments, the planarization process removes excess dielectric liner over the first dielectric layer and the source/drain contact. In some embodiments, the dielectric liner acts as a planarization stop layer, such that the dielectric liner remains over the first dielectric layer and the source/drain contact. The dielectric liner and/or the bulk dielectric layer include a dielectric material having a capacitance that is lower than a capacitance of the dielectric material of the etch stop hard mask. In some embodiments, the bulk dielectric layer includes a same material as the first dielectric layer, such as a same material as the ILD layer. Fabrication can proceed with forming a third dielectric layer over the hard mask, the first dielectric layer, and the source/drain contact, and performing a patterning process to form a gate contact opening that extends through the third dielectric layer and the hard mask to expose the gate structure, such as a gate electrode of the gate structure. In some embodiments, the gate contact opening extends through and/or to a hard mask (e.g., a gate protection layer) of the gate structure. In some embodiments, the gate protection layer is a metal layer, such as a tungsten layer. The third dielectric layer can include an interlayer dielectric layer and a CESL. A gate contact is formed to the gate structure, which can include depositing a contact liner that partially fills the gate opening, depositing a bulk contact layer over the contact liner that fills a remainder of the gate contact opening, and performing a planarization process that removes excess contact liner and excess bulk contact layer, thereby exposing the third dielectric layer.

In some embodiments, the dielectric liner is not removed by the planarization process when replacing the etch stop hard mask with the hard mask (i.e., dielectric liner plus dielectric bulk) and the dielectric liner remains between the first dielectric layer and the third dielectric layer and between the source/drain contact and the first dielectric layer. In some embodiments, the dielectric liner extends continuously from one hard mask over a first gate structure to a second hard mask over a second gate structure. In some embodiments, the source/drain contact is formed without the contact liner and thus may be referred to as a barrier-less source/drain contact. In some embodiments, the dielectric liner is removed by the planarization process when replacing the etch stop hard mask with the hard mask. In some embodiments, the source/drain contact is formed without the contact liner. In some embodiments, the third dielectric layer does not include a CESL. In some embodiments, the first dielectric layer is partially removed during removal of the etch stop hard mask. For example, top portions of a CESL and/or source/drain contact spacer (which can include a dielectric material) are slightly etched, such that the CESL and/or the source/drain contact spacer have curved top surfaces. In some embodiments, the slight etching exposes a top corner of the source/drain contact. In some embodiments, the source/drain contact does not include a contact liner, the third dielectric layer does not include a CESL, the source/drain contact does not include a contact liner, and/or the third dielectric layer does not include a CESL. In some embodiments, the contact bulk is recessed during fabrication, for example, by the planarization process. In some embodiments, the source/drain contact does not include a contact liner, the third dielectric layer does not include a CESL, the source/drain contact does not include a contact liner, and/or the third dielectric layer does not include a CESL. In some embodiments, the contact bulk and the contact liner are recessed during fabrication, for example, by the planarization process. In such embodiments, the third dielectric layer may not include a CESL. From such embodiments, it is evident that a CESL may be eliminated from a gate contact-to-gate (also referred to as a via-to-MG) process.

In some embodiments, a FinFET device structure includes a fin structure formed over a substrate, and a dummy gate structure formed over the fin structure. A dielectric layer formed over the dummy gate structure, and the dummy gate structure is replaced by the gate structure. Afterwards, a portion of the gate structure is removed to form a trench over the gate structure, and a hard mask layer is formed in the trench. A S/D contact structure is formed over a S/D structure. The gate structure is protected by the hard mask layer during formation of the S/D contact structure. The hard mask layer is then removed and then is replaced by a liner layer and a filling layer. Since the filling layer has a dielectric constant smaller than the dielectric constant of the hard mask layer, the capacitance between the gate structure and the S/D contact structure is decreased. Therefore, the performance of the FinFET device structure is improved.

In some embodiments, a FinFET device structure is provided. The FinFET device structure includes a fin structure formed over a substrate and a gate structure formed over the fin structure. The FinFET device structure further includes an inter-layer dielectric (ILD) layer formed adjacent to the gate structure and a liner layer formed over the gate structure. The bottom surface of the liner layer is lower than the top surface of the ILD layer. The FinFET device structure includes a filling layer formed over the gate structure and the liner layer. The bottom surface of the filling layer is lower than the top surface of the ILD layer, and the liner layer and the filling layer are made of different materials.

In some embodiments, a FinFET device structure is provided. The FinFET device structure includes a fin structure formed over a substrate, and a gate structure formed over the fin structure. The FinFET device structure includes a gate spacer layer formed adjacent to the gate structure, and an etch stop layer formed adjacent to the gate spacer layer. The FinFET device structure includes a liner layer formed over the gate structure, and a filling layer formed over the liner layer. The liner layer is between the gate spacer layer and the filling layer, and the bottom surface of the filling layer is lower than the top surface of the etch stop layer.

In some embodiments, a method for forming a FinFET device structure is provided. The method includes forming a gate structure over a fin structure and forming a source/drain (S/D) structure adjacent to the gate structure. The method includes forming a hard mask layer over the gate structure and removing the hard mask layer to form a trench. The method also includes forming a liner layer over the gate structure and in the trench and forming a filling layer over the liner layer and in the trench. The filling layer and the hard mask layer are made of different material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a contact etch stop layer (CESL) having a first sidewall CESL portion and a second sidewall CESL portion separated by a spacing;
a gate stack and gate spacers disposed along sidewalls of the gate stack, wherein the gate stack and the gate spacers fill the spacing between a lower portion of the first sidewall CESL portion and a lower portion of the second sidewall CESL portion; and
a dielectric feature disposed over the gate stack and the gate spacers, wherein the dielectric feature fills the spacing between an upper portion of the first sidewall CESL portion and an upper portion of the second sidewall CESL portion, the dielectric feature includes a dielectric layer disposed over a dielectric liner, and the dielectric liner is between the dielectric layer and the gate spacers, between the dielectric layer and the gate stack, and between the dielectric layer and the CESL, and further wherein the dielectric liner extends over a top surface of the first sidewall CESL portion and a top surface of the second sidewall CESL portion.

2. The semiconductor device structure of claim 1, wherein the top surface of the first sidewall CESL portion and the top surface of the second sidewall CESL portion are recessed top surfaces.

3. The semiconductor device structure of claim 1, further comprising a gate contact structure that extends through the dielectric layer and the dielectric liner, wherein the gate contact structure is electrically connected to the gate stack.

4. The semiconductor device structure of claim 3, further comprising a metal protection layer between the gate contact structure and the gate stack, wherein the dielectric liner is between the dielectric layer and the metal protection layer.

5. The semiconductor device structure of claim 1, wherein the dielectric layer is a first dielectric layer, the semiconductor device structure further comprising:
a second dielectric layer, wherein the CESL is between the dielectric liner of the dielectric feature and the second dielectric layer and the CESL is between the second dielectric layer and at least one of the gate spacers.

6. The semiconductor device structure of claim 5, wherein the first dielectric layer and the second dielectric layer include a same material.

7. The semiconductor device structure of claim 5, wherein the dielectric liner extends over a top surface of the second dielectric layer.

8. The semiconductor device structure of claim 1, further comprising a source/drain (S/D) contact structure electrically connected to a S/D structure, wherein the CESL is between the S/D structure and the dielectric feature and between the S/D structure and at least one of the gate spacers.

9. The semiconductor device structure of claim 8, wherein the dielectric liner extends over a top surface of the S/D contact structure.

10. A semiconductor device structure, comprising:
a gate structure over a semiconductor layer, wherein the gate structure is between a first source/drain and a second source/drain in the semiconductor layer and the gate structure includes a gate stack and gate spacers disposed along sidewalls of the gate stack;
a dielectric feature over a top surface of the gate structure, wherein a width of the dielectric feature is the same as a width of the gate structure and the dielectric feature includes a filling layer over a liner layer, wherein the liner layer wraps the filling layer and the liner layer is between the gate structure and the filling layer; and
an inter-layer dielectric (ILD) layer over the semiconductor layer, wherein the liner layer is between the filling layer and the ILD layer and a material of the ILD layer is the same as a material of the filling layer.

11. The semiconductor device structure of claim 10, wherein a dielectric constant of the liner layer is greater than a dielectric constant of the filling layer.

12. The semiconductor device structure of claim 10, wherein:
the gate stack includes a gate electrode over a gate dielectric, the gate spacers are along sidewall portions of the gate dielectric, and the gate structure includes a metal protection layer over the gate electrode and between the sidewall portions of the gate dielectric; and
the liner layer is between the filling layer and the gate dielectric, the gate spacers, and the metal protection layer.

13. The semiconductor device structure of claim 10, further comprising an etch stop layer between the ILD layer and the dielectric feature and between the ILD layer and the gate structure, and further wherein the liner layer is between the filling layer and the ILD layer.

14. The semiconductor device structure of claim 13, wherein the etch stop layer has a top surface that is lower than a top surface of the ILD layer and the liner layer is formed on the top surface of the etch stop layer.

15. The semiconductor device structure of claim 10, further comprising a source/drain contact structure to the second source/drain, wherein the liner layer extends over a top surface of the source/drain contact structure.

16. The semiconductor device structure of claim 10, further comprising a gate contact structure to the gate structure, wherein the gate contact structure extends through the filling layer and the liner layer.

17. A semiconductor device structure comprising:
a gate contact disposed on a gate structure, wherein the gate contact extends through a first dielectric layer and a second dielectric layer to the gate structure, wherein the second dielectric layer is disposed between the first dielectric layer and the gate structure;
a third dielectric layer disposed between the gate structure and a fourth dielectric layer, wherein the second dielectric layer is disposed between the third dielectric layer and the first dielectric layer and the third dielectric layer is disposed between the second dielectric layer and the fourth dielectric layer; and
wherein the first dielectric layer is formed of a first dielectric material, the second dielectric layer is formed of a second dielectric material that is different than the first dielectric material, the third dielectric layer is formed of a third dielectric material that is different than the second dielectric material, and the fourth dielectric layer is formed of a fourth dielectric material that is different than the third dielectric material.

18. The semiconductor device structure of claim 17, wherein the gate contact is disposed on a gate stack of the gate structure and the second dielectric layer is disposed on the gate stack and gate spacers of the gate structure.

19. The semiconductor device structure of claim 17, wherein the third dielectric layer has first L-shaped portions and the second dielectric layer has second L-shaped portions.

20. The semiconductor device structure of claim 17, wherein:

the first dielectric layer has a first thickness along a gate height direction, the fourth dielectric layer has a second thickness along the gate height direction, and the second thickness is greater than the first thickness; and
the third dielectric layer has a first length along the gate height direction, the second dielectric layer has a second length along the gate height direction, and the second length is less than the first length.

\* \* \* \* \*